United States Patent
Okazaki et al.

(10) Patent No.: US 12,477,918 B2
(45) Date of Patent: Nov. 18, 2025

(54) DISPLAY APPARATUS, DISPLAY MODULE, ELECTRONIC DEVICE, AND METHOD FOR MANUFACTURING DISPLAY APPARATUS

(71) Applicant: SEMICONDUCTOR ENERGY LABORATORY CO., LTD., Atsugi (JP)

(72) Inventors: Kenichi Okazaki, Tochigi (JP); Daiki Nakamura, Kanagawa (JP); Rai Sato, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 559 days.

(21) Appl. No.: 17/685,821

(22) Filed: Mar. 3, 2022

(65) Prior Publication Data

US 2022/0320184 A1    Oct. 6, 2022

(30) Foreign Application Priority Data

Mar. 31, 2021    (JP) .................................. 2021-059371

(51) Int. Cl.
*H10K 59/38*     (2023.01)
*H10K 59/12*     (2023.01)
*H10K 59/124*    (2023.01)

(52) U.S. Cl.
CPC .......... *H10K 59/38* (2023.02); *H10K 59/124* (2023.02); *H10K 59/1201* (2023.02)

(58) Field of Classification Search
CPC .. H10K 59/38; H10K 59/124; H10K 59/1201; H10K 2102/331
See application file for complete search history.

(56) References Cited

U.S. PATENT DOCUMENTS

| | | |
|---|---|---|
| 5,953,985 A | 9/1999 | Kobayashi |
| 6,120,338 A | 9/2000 | Hirano et al. |
| (Continued) | | |

FOREIGN PATENT DOCUMENTS

| | | |
|---|---|---|
| JP | 2000-036385 A | 2/2000 |
| JP | 2002-324673 A | 11/2002 |
| (Continued) | | |

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

(Continued)

*Primary Examiner* — Caleb E Henry
(74) *Attorney, Agent, or Firm* — NIXON PEABODY LLP; Jeffrey L. Costellia

(57) ABSTRACT

A high-definition or high-resolution display apparatus is provided. In the display apparatus, a first light-emitting device includes a first pixel electrode, a first light-emitting layer, and a common electrode. A second light-emitting device includes a second pixel electrode, a second light-emitting layer, and the common electrode. End portions of the first and second pixel electrodes are covered with a first insulating layer. A second insulating layer covers side surfaces of the first and second light-emitting layers. A first color conversion layer overlaps the first light-emitting device. A second color conversion layer overlaps the second light-emitting device. The first and second light-emitting devices each have a function of emitting blue light. The first and second color conversion layers each have a function of converting light.

12 Claims, 31 Drawing Sheets

(56) References Cited

U.S. PATENT DOCUMENTS

| | | | |
|---|---|---|---|
| 7,399,991 | B2 | 7/2008 | Seo et al. |
| 8,269,227 | B2 | 9/2012 | Yamazaki et al. |
| 8,461,605 | B2 | 6/2013 | Yamazaki et al. |
| 8,884,509 | B2 | 11/2014 | Matsukura |
| 9,997,716 | B2* | 6/2018 | Zeng ............ C09K 11/06 |
| 10,790,462 | B2 | 9/2020 | Seo et al. |
| 11,659,758 | B2 | 5/2023 | Kamada et al. |
| 2002/0072139 | A1 | 6/2002 | Kashiwabara |
| 2006/0038953 | A1 | 2/2006 | Moriya |
| 2011/0148290 | A1 | 6/2011 | Oota |
| 2012/0256204 | A1 | 10/2012 | Yoshizumi et al. |
| 2012/0273804 | A1 | 11/2012 | Hatano |
| 2012/0276484 | A1 | 11/2012 | Izumi et al. |
| 2013/0084531 | A1 | 4/2013 | Hamaguchi et al. |
| 2013/0084664 | A1 | 4/2013 | Yoshitoku et al. |
| 2013/0084666 | A1 | 4/2013 | Oshige |
| 2013/0280839 | A1 | 10/2013 | Sonoda et al. |
| 2013/0295705 | A1 | 11/2013 | Sonoda et al. |
| 2014/0004640 | A1 | 1/2014 | Hamaguchi et al. |
| 2014/0004642 | A1 | 1/2014 | Otsuka et al. |
| 2014/0312339 | A1 | 10/2014 | Fujita |
| 2015/0060826 | A1 | 3/2015 | Matsumoto et al. |
| 2015/0069360 | A1 | 3/2015 | Sato |
| 2015/0076476 | A1 | 3/2015 | Odaka et al. |
| 2016/0172595 | A1 | 6/2016 | Malinowski et al. |
| 2016/0315133 | A1 | 10/2016 | Sato |
| 2017/0141167 | A1 | 5/2017 | Naganuma |
| 2017/0186971 | A1* | 6/2017 | Kanamoto ............ H10K 77/00 |
| 2017/0256754 | A1 | 9/2017 | Defranco et al. |
| 2017/0324054 | A1* | 11/2017 | Ishisone ............ H10K 59/1213 |
| 2018/0180951 | A1* | 6/2018 | Toyotaka ............ H10K 59/122 |
| 2018/0190908 | A1 | 7/2018 | Ke et al. |
| 2020/0168663 | A1* | 5/2020 | Choi ............ H10H 20/833 |
| 2020/0203662 | A1 | 6/2020 | Mollard et al. |
| 2020/0388790 | A1 | 12/2020 | Yamazaki et al. |
| 2021/0091152 | A1 | 3/2021 | Yang et al. |
| 2021/0143352 | A1 | 5/2021 | Yamazaki et al. |
| 2021/0159435 | A1 | 5/2021 | Yamazaki et al. |
| 2021/0225942 | A1 | 7/2021 | Suzuki et al. |
| 2021/0234112 | A1 | 7/2021 | Seo et al. |
| 2021/0296543 | A1 | 9/2021 | Aoyama et al. |
| 2024/0164168 | A1 | 5/2024 | Okazaki et al. |
| 2024/0164169 | A1 | 5/2024 | Okazaki et al. |
| 2024/0172516 | A1 | 5/2024 | Okazaki et al. |

FOREIGN PATENT DOCUMENTS

| | | |
|---|---|---|
| JP | 2003-059663 A | 2/2003 |
| JP | 2008-098106 A | 4/2008 |
| JP | 2008-147072 A | 6/2008 |
| JP | 2008-251270 A | 10/2008 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2016-197494 A | 11/2016 |
| JP | 2019-179696 A | 10/2019 |
| JP | 2020-160305 A | 10/2020 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

* cited by examiner

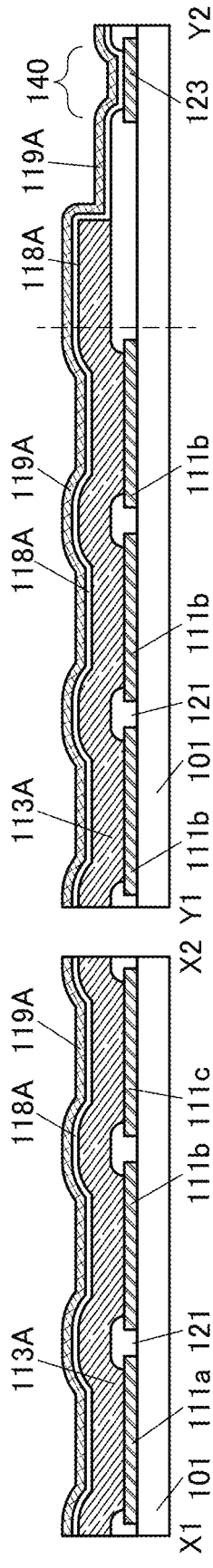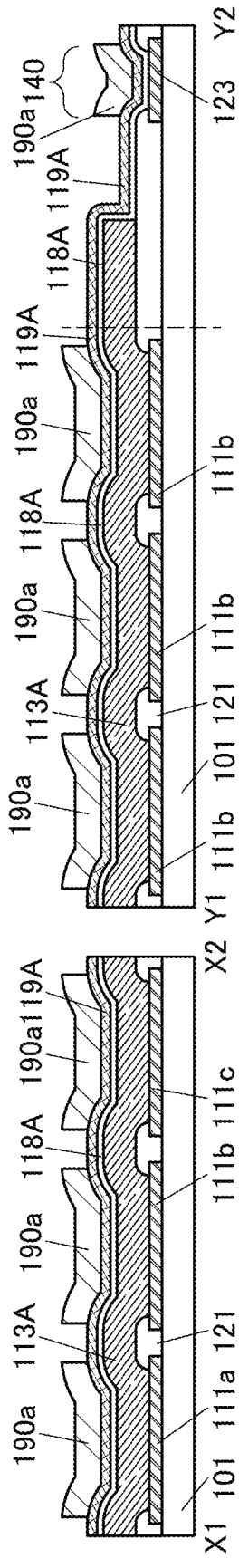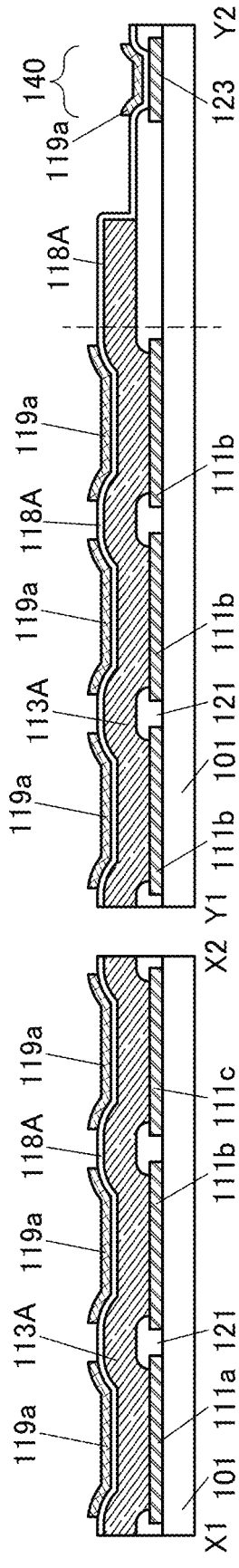

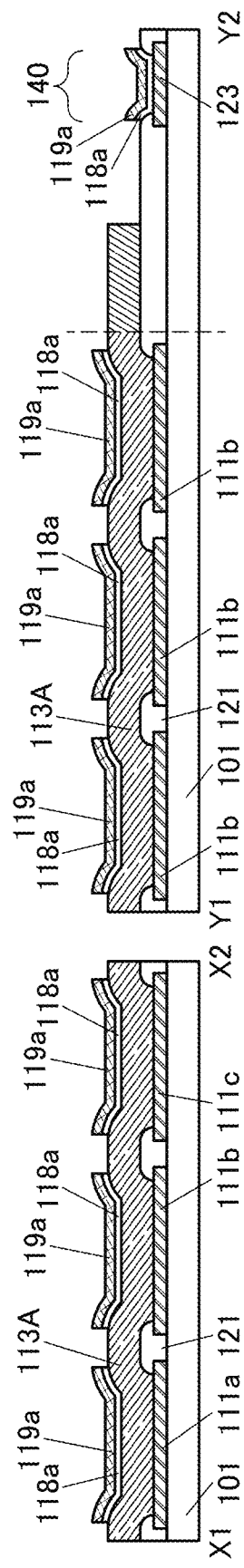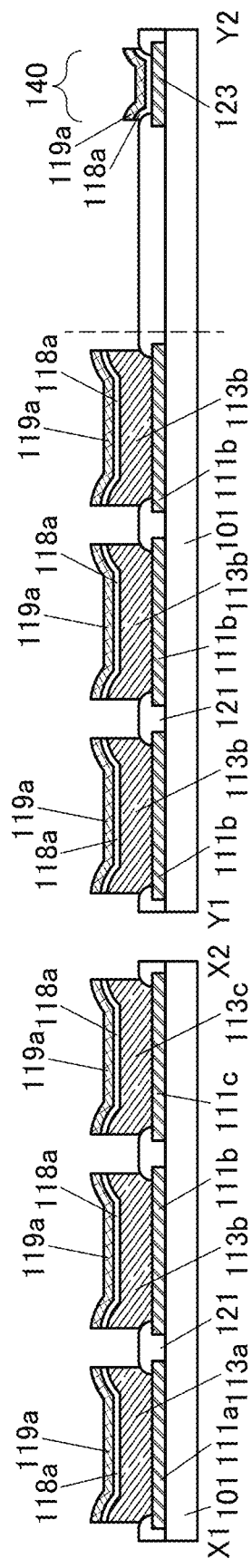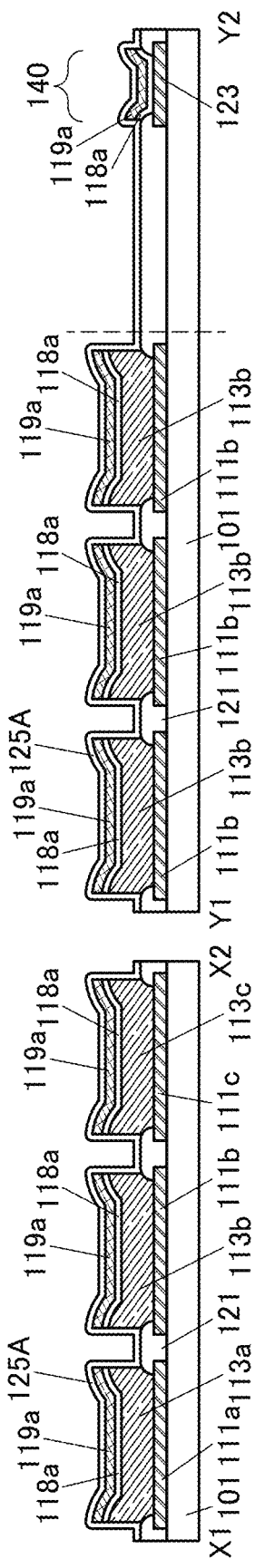

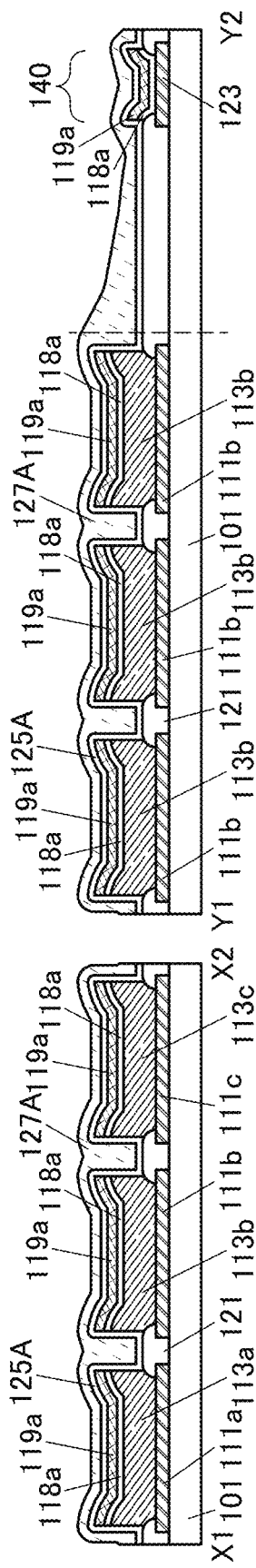
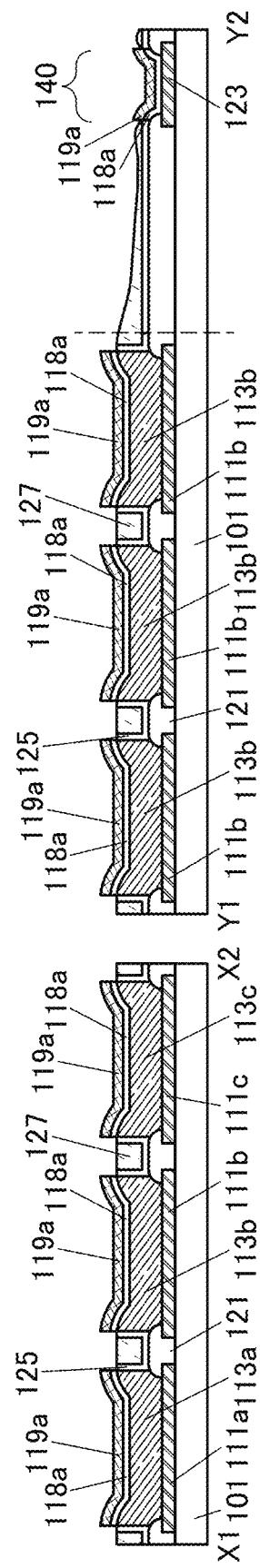
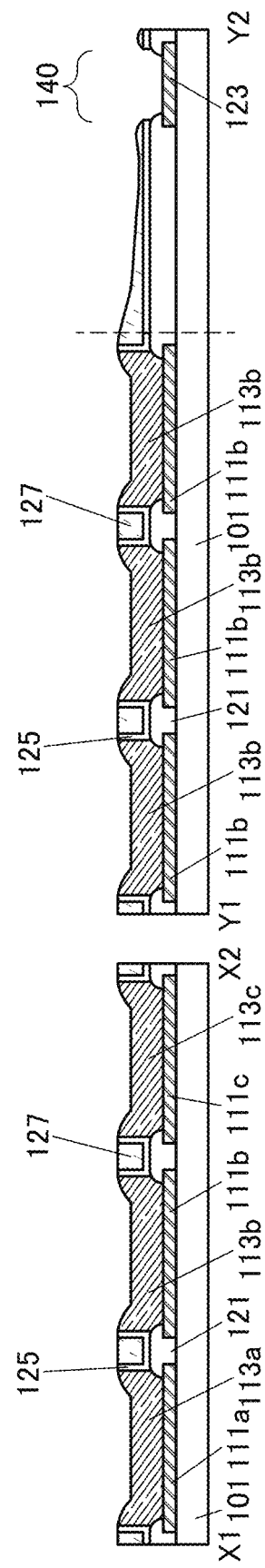
FIG. 10A
FIG. 10B
FIG. 10C

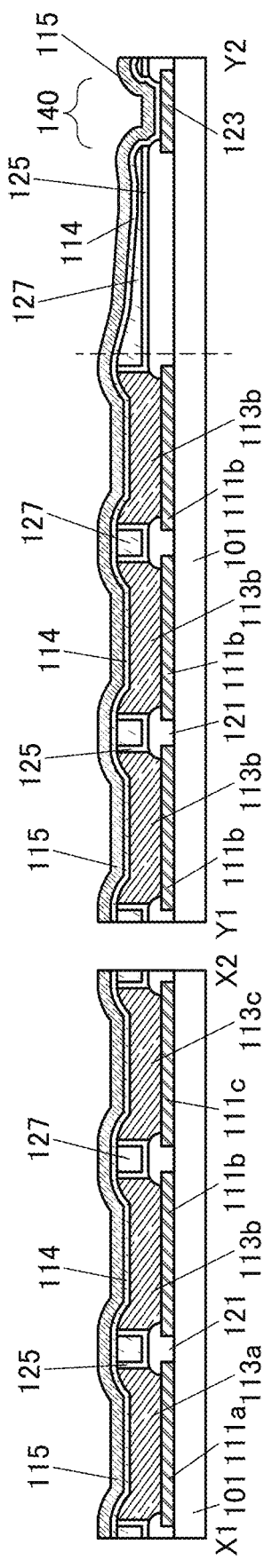
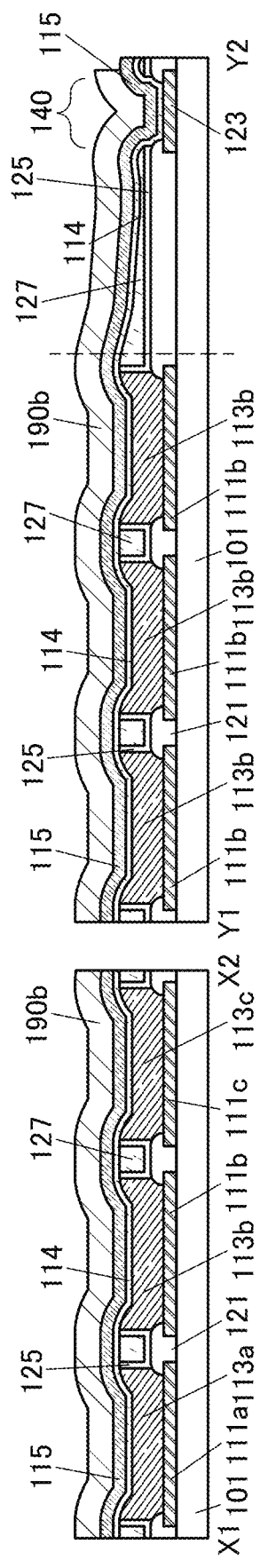
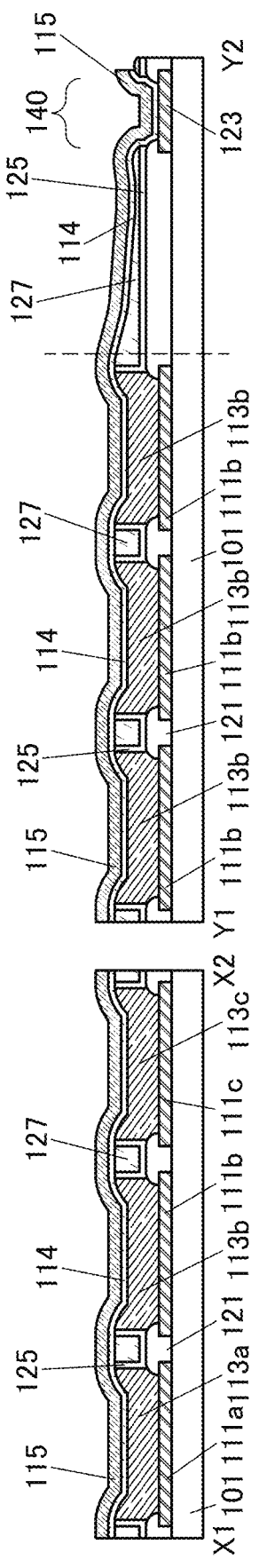
FIG. 11A
FIG. 11B
FIG. 11C

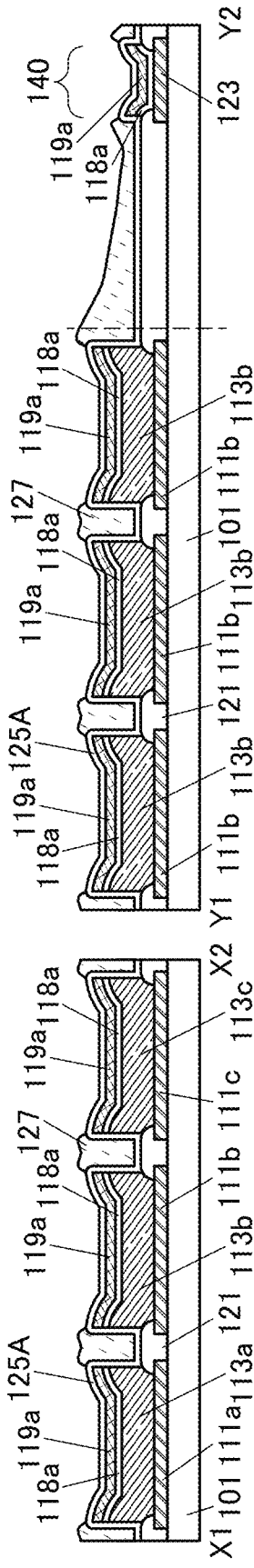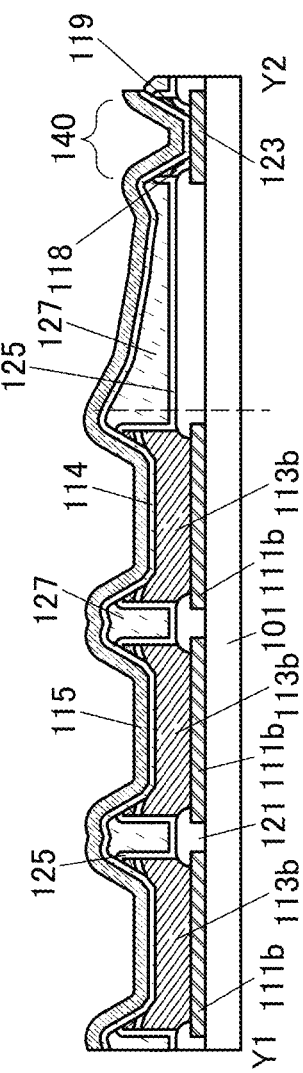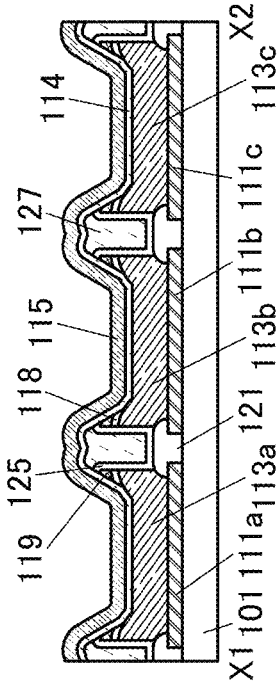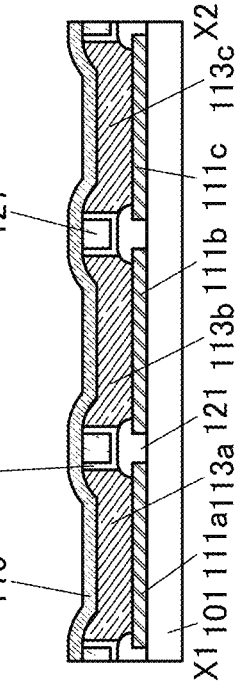

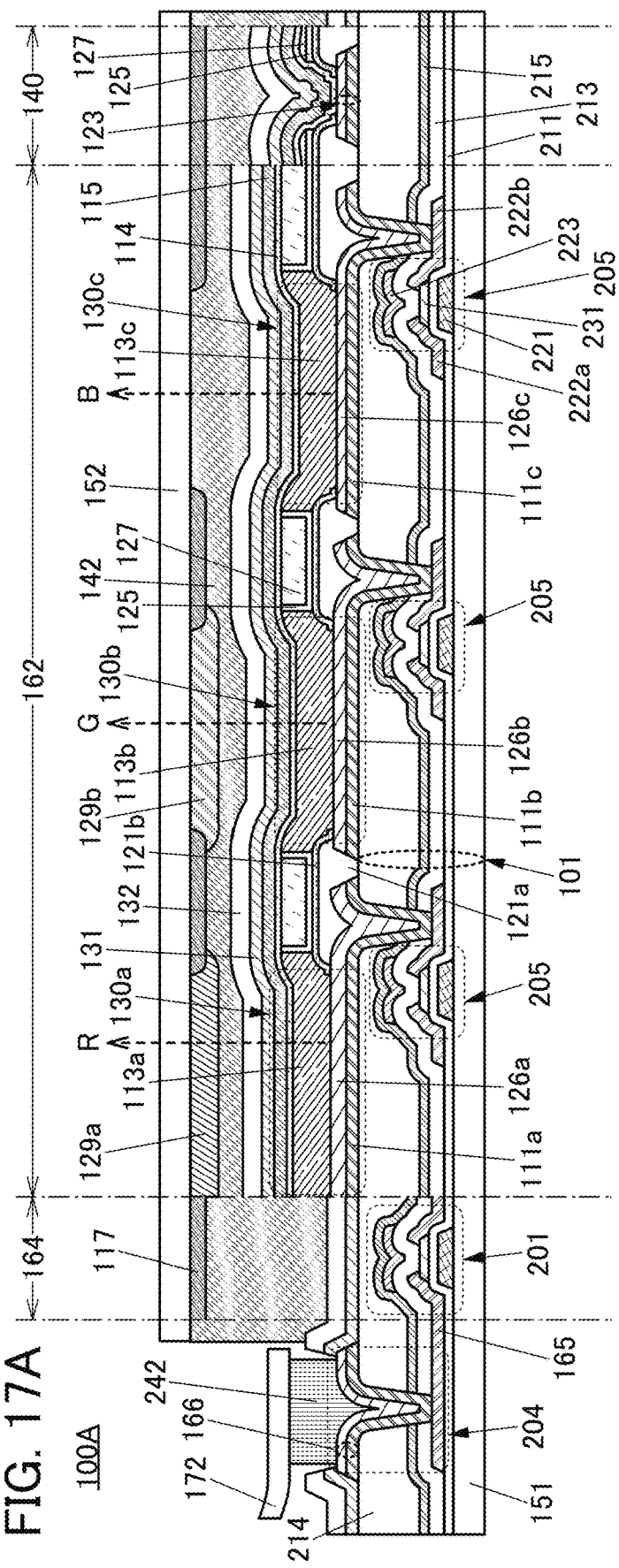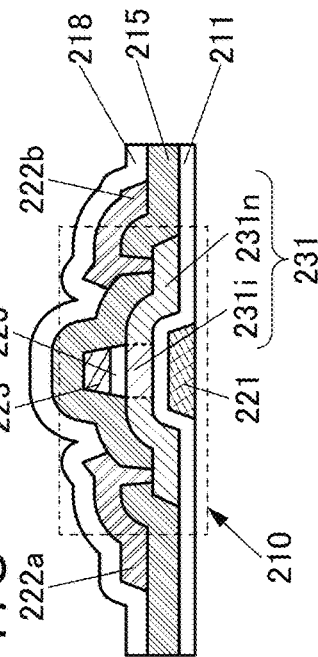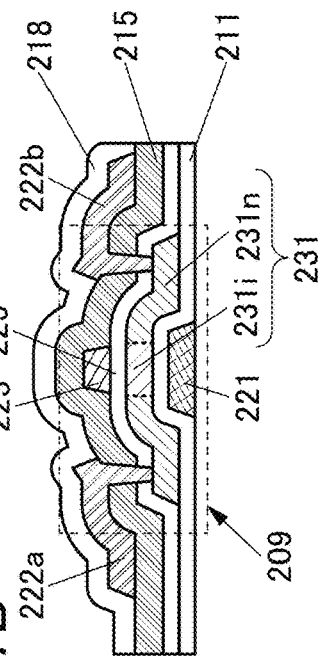

DISPLAY APPARATUS, DISPLAY MODULE, ELECTRONIC DEVICE, AND METHOD FOR MANUFACTURING DISPLAY APPARATUS

BACKGROUND OF THE INVENTION

1. Field of the Invention

One embodiment of the present invention relates to a display apparatus, a display module, and an electronic device. One embodiment of the present invention relates to a method for manufacturing a display apparatus.

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a method for driving any of them, and a method for manufacturing any of them.

2. Description of the Related Art

In recent years, information terminal devices, for example, mobile phones such as smartphones, tablet information terminals, and notebook personal computers (PC) have been widely used. As display panels provided in such devices, high-definition display panels are required.

Typical examples of display apparatuses that can be used in display panels include a liquid crystal display apparatus, a light-emitting apparatus including a light-emitting element (also referred to as a light-emitting device) such as an organic electroluminescent (EL) element or a light-emitting diode (LED), and electronic paper performing display by an electrophoretic method or the like.

For example, an organic EL element (also referred to as an organic EL device) basically has such a structure that a layer containing a light-emitting organic compound is provided between a pair of electrodes. By voltage application to this element, the light-emitting organic compound can emit light. A display apparatus including such an organic EL element does not need a backlight that is necessary for a liquid crystal display apparatus and the like, and thus can have advantages such as thinness, lightweight, high contrast, and low power consumption. Patent Document 1, for example, discloses an example of a display apparatus using an organic EL element.

The use of quantum dots as a color conversion (wavelength conversion) material of an organic EL element is being considered. A quantum dot is a semiconductor nanocrystal with a diameter of several nanometers and contains approximately $1 \times 10^3$ to $1 \times 10^6$ atoms. Quantum dots confine electrons, holes, or excitons, which results in their discrete energy states and an energy shift depending on the size of quantum dots. This means that quantum dots made of the same substance emit light with different wavelengths depending on their size; thus, emission wavelengths can be easily adjusted by changing the size of quantum dots.

REFERENCE

[Patent Document 1] Japanese Published Patent Application No. 2002-324673

SUMMARY OF THE INVENTION

An object of one embodiment of the present invention is to provide a high-definition display apparatus. An object of one embodiment of the present invention is to provide a high-resolution display apparatus. An object of one embodiment of the present invention is to provide a display apparatus having a high aperture ratio. An object of one embodiment of the present invention is to provide a large display apparatus. An object of one embodiment of the present invention is to provide a small display apparatus. An object of one embodiment of the present invention is to provide a highly reliable display apparatus.

An object of one embodiment of the present invention is to provide a method for manufacturing a high-definition display apparatus. An object of one embodiment of the present invention is to provide a method of manufacturing a high-resolution display apparatus. An object of one embodiment of the present invention is to provide a method for manufacturing a display apparatus having a high aperture ratio. An object of one embodiment of the present invention is to provide a method for manufacturing a large display apparatus. An object of one embodiment of the present invention is to provide a method for manufacturing a small display apparatus. An object of one embodiment of the present invention is to provide a method for manufacturing a highly reliable display apparatus. An object of one embodiment of the present invention is to provide a method for manufacturing a display apparatus with a high yield.

Note that the description of these objects does not preclude the existence of other objects. One embodiment of the present invention does not need to achieve all of these objects. Other objects can be derived from the description of the specification, the drawings, and the claims.

One embodiment of the present invention is a display apparatus including a first light-emitting device, a second light-emitting device, a first insulating layer, a second insulating layer, a first color conversion layer, and a second color conversion layer. The first light-emitting device includes a first pixel electrode, a first light-emitting layer over the first pixel electrode, and a common electrode over the first light-emitting layer. The second light-emitting device includes a second pixel electrode, a second light-emitting layer over the second pixel electrode, and the common electrode over the second light-emitting layer. An end portion of the first pixel electrode and an end portion of the second pixel electrode are covered with the first insulating layer. The second insulating layer is positioned over the first insulating layer. The second insulating layer covers side surfaces of the first light-emitting layer and the second light-emitting layer. The first color conversion layer is positioned to overlap the first light-emitting device. The second color conversion layer is positioned to overlap the second light-emitting device. The first light-emitting device and the second light-emitting device each have a function of emitting blue light. The first color conversion layer has a function of converting light emitted from the first light-emitting device into light having a different wavelength. The second color conversion layer has a function of converting light emitted from the second light-emitting device into light having a different wavelength.

Preferably, the display apparatus further includes a third insulating layer, the second insulating layer includes an inorganic material, and the third insulating layer includes an organic material and overlaps the side surfaces of the first light-emitting layer and the second light-emitting layer and the first insulating layer with the second insulating layer therebetween.

It is preferred that in the display apparatus, the first light-emitting device include a common layer between the first light-emitting layer and the common electrode; the second light-emitting device include the common layer between the second light-emitting layer and the common electrode; and the common layer include at least one of a hole-injection layer, a hole-blocking layer, a hole-transport layer, an electron-transport layer, an electron-blocking layer, and an electron-injection layer.

In the display apparatus, the first light-emitting layer and the second light-emitting layer preferably include the same material.

Another embodiment of the present invention is a display apparatus including a first light-emitting device, a second light-emitting device, a first insulating layer, a second insulating layer, a first color conversion layer, and a second color conversion layer. The first light-emitting device includes a first pixel electrode, a first light-emitting unit over the first pixel electrode, a first charge-generation layer over the first light-emitting unit, a second light-emitting unit over the first charge-generation layer, and a common electrode over the second light-emitting unit. The second light-emitting device includes a second pixel electrode, a third light-emitting unit over the second pixel electrode, a second charge-generation layer over the third light-emitting unit, a fourth light-emitting unit over the second charge-generation layer, and the common electrode over the fourth light-emitting unit. An end portion of the first pixel electrode and an end portion of the second pixel electrode are covered with the first insulating layer. The second insulating layer is positioned over the first insulating layer. The second insulating layer covers side surfaces of the first pixel electrode, the second pixel electrode, the first charge-generation layer, and the second charge-generation layer. The first color conversion layer is positioned to overlap the first light-emitting device. The second color conversion layer is positioned to overlap the second light-emitting device. The first-emitting unit, the second light-emitting unit, the third light-emitting unit, and the fourth light-emitting unit each have a function of emitting blue light. The first color conversion layer has a function of converting light emitted from the first light-emitting device into light having a different wavelength. The second color conversion layer has a function of converting light emitted from the second light-emitting device into light having a different wavelength.

Preferably, the display apparatus further includes a third insulating layer, the second insulating layer includes an inorganic material, and the third insulating layer includes an organic material and overlaps the side surfaces of the first charge-generation layer and the second charge-generation layer and the first insulating layer with the second insulating layer therebetween.

It is preferred that in the display apparatus, the first light-emitting device include a common layer between the second light-emitting unit and the common electrode; the second light-emitting device include the common layer between the fourth light-emitting unit and the common electrode; and the common layer include at least one of a hole-injection layer, a hole-blocking layer, a hole-transport layer, an electron-transport layer, an electron-blocking layer, and an electron-injection layer.

It is preferred that in the display apparatus, the first light-emitting unit and the third light-emitting unit include the same material; the first charge-generation layer and the second charge-generation layer include the same material; and the second light-emitting unit and the fourth light-emitting unit include the same material.

In the display apparatus, the first color conversion layer and the second color conversion layer preferably include a fluorescent material or quantum dots.

Preferably, the display apparatus includes a third light-emitting device that emits blue light, and has a function of extracting light emitted from the third light-emitting device. In this case, the display apparatus has a function of extracting blue light from the third light-emitting device without passing the light through a color conversion layer.

One embodiment of the present invention is a display module including the display apparatus having any of the above structures. For example, the display module is provided with a connector such as a flexible printed circuit (FPC) or a tape carrier package (TCP), or an integrated circuit (IC) is mounted on the display module by a chip on glass (COG) method, a chip on film (COF) method, or the like.

One embodiment of the present invention is an electronic device that includes the display module and at least one of a housing, a battery, a camera, a speaker, and a microphone.

Another embodiment of the present invention is a method for manufacturing a display apparatus, including the following steps: forming a first pixel electrode and a second pixel electrode over an insulating surface; forming a first insulating layer covering an end portion of the first pixel electrode and an end portion of the second pixel electrode; forming a first layer over the first pixel electrode and the second pixel electrode; forming a first sacrificial layer over the first layer; processing the first layer and the first sacrificial layer, thereby forming a second layer over the first pixel electrode, a second sacrificial layer over the second layer, a third layer over the second pixel electrode, and a third sacrificial layer over the third layer; forming a first insulating film covering at least a top surface of the first insulating layer, a side surface of the second layer, a side surface of the third layer, a side surface and a top surface of the second sacrificial layer, and a side surface and a top surface of the third sacrificial layer; processing the first insulating film, thereby forming a second insulating layer covering at least the top surface of the first insulating layer, the side surface of the second layer, and the side surface of the third layer; removing the second sacrificial layer and the third sacrificial layer; forming a common electrode over the second layer and the third layer; and forming, over the common electrode, a first color conversion layer overlapping the second layer and a second color conversion layer overlapping the third layer.

Another embodiment of the present invention is a method for manufacturing a display apparatus, including the following steps: forming a first pixel electrode and a second pixel electrode over an insulating surface; forming a first insulating layer covering an end portion of the first pixel electrode and an end portion of the second pixel electrode; forming a first layer over the first pixel electrode and the second pixel electrode; forming a first sacrificial layer over the first layer; processing the first layer and the first sacrificial layer, thereby forming a second layer over the first pixel electrode, a second sacrificial layer over the second layer, a third layer over the second pixel electrode, and a third sacrificial layer over the third layer; forming a first insulating film using an inorganic material and covering at least a top surface of the first insulating layer, a side surface of the second layer, a side surface of the third layer, a side surface and a top surface of the second sacrificial layer, and a side surface and a top surface of the third sacrificial layer; forming, over the first insulating film, a second insulating film using an organic material; processing the first insulating film and the second insulating film, thereby forming a second insulating layer covering at least the top surface of the first insulating layer, the side surface of the second layer, and the side surface of the third layer and a third insulating layer over the second insulating layer; removing the second sacrificial layer and the third sacrificial layer; forming a common electrode over the second layer and the third layer; and forming, over the common electrode, a first color conversion layer overlapping the second layer and a second color conversion layer overlapping the third layer.

In the method for manufacturing a display apparatus, the second insulating film is preferably formed using a photosensitive resin as the organic material.

It is preferred that in the method for manufacturing a display apparatus, a first sacrificial film and a second sacrificial film over the first sacrificial film be formed as the first sacrificial layer; a first resist mask be formed over the second sacrificial film, and then the second sacrificial film be processed by using the first resist mask; the first resist mask be removed; the first sacrificial film be processed by using the processed second sacrificial film as a mask; and the first layer be processed by using the processed first sacrificial film as a mask.

It is preferred that in the method for manufacturing a display apparatus, the second sacrificial layer and the third sacrificial layer be removed, and then a fourth layer be formed over the second layer and the third layer; and the common electrode be formed over the fourth layer.

One embodiment of the present invention can provide a high-definition display apparatus. One embodiment of the present invention can provide a high-resolution display apparatus. One embodiment of the present invention can provide a display apparatus having a high aperture ratio. One embodiment of the present invention can provide a large display apparatus. One embodiment of the present invention can provide a small display apparatus. One embodiment of the present invention can provide a highly reliable display apparatus.

One embodiment of the present invention can provide a method for manufacturing a high-definition display apparatus. One embodiment of the present invention can provide a method for manufacturing a high-resolution display apparatus. One embodiment of the present invention can provide a method for manufacturing a display apparatus having a high aperture ratio. One embodiment of the present invention can provide a method for manufacturing a large display apparatus. One embodiment of the present invention can provide a method for manufacturing a small display apparatus. One embodiment of the present invention can provide a method for manufacturing a highly reliable display apparatus. One embodiment of the present invention can provide a method for manufacturing a display apparatus with a high yield.

Note that the description of these effects does not preclude the existence of other effects. One embodiment of the present invention does not necessarily have all of these effects. Other effects can be derived from the description of the specification, the drawings, and the claims.

BRIEF DESCRIPTION OF THE DRAWINGS

In the accompanying drawings:

FIGS. 8A to 8C are cross-sectional views illustrating an example of a method for manufacturing a display apparatus;

FIGS. 9A to 9C are cross-sectional views illustrating an example of a method for manufacturing a display apparatus;

FIGS. 10A to 10C are cross-sectional views illustrating an example of a method for manufacturing a display apparatus;

FIGS. 11A to 11C are cross-sectional views illustrating an example of a method for manufacturing a display apparatus;

FIGS. 12A to 12D are cross-sectional views illustrating an example of a method for manufacturing a display apparatus;

FIG. 17A is a cross-sectional view illustrating an example of a display apparatus, and FIGS. 17B and 17C are cross-sectional views each illustrating an example of a transistor;

DETAILED DESCRIPTION OF THE INVENTION

Figure 1A:
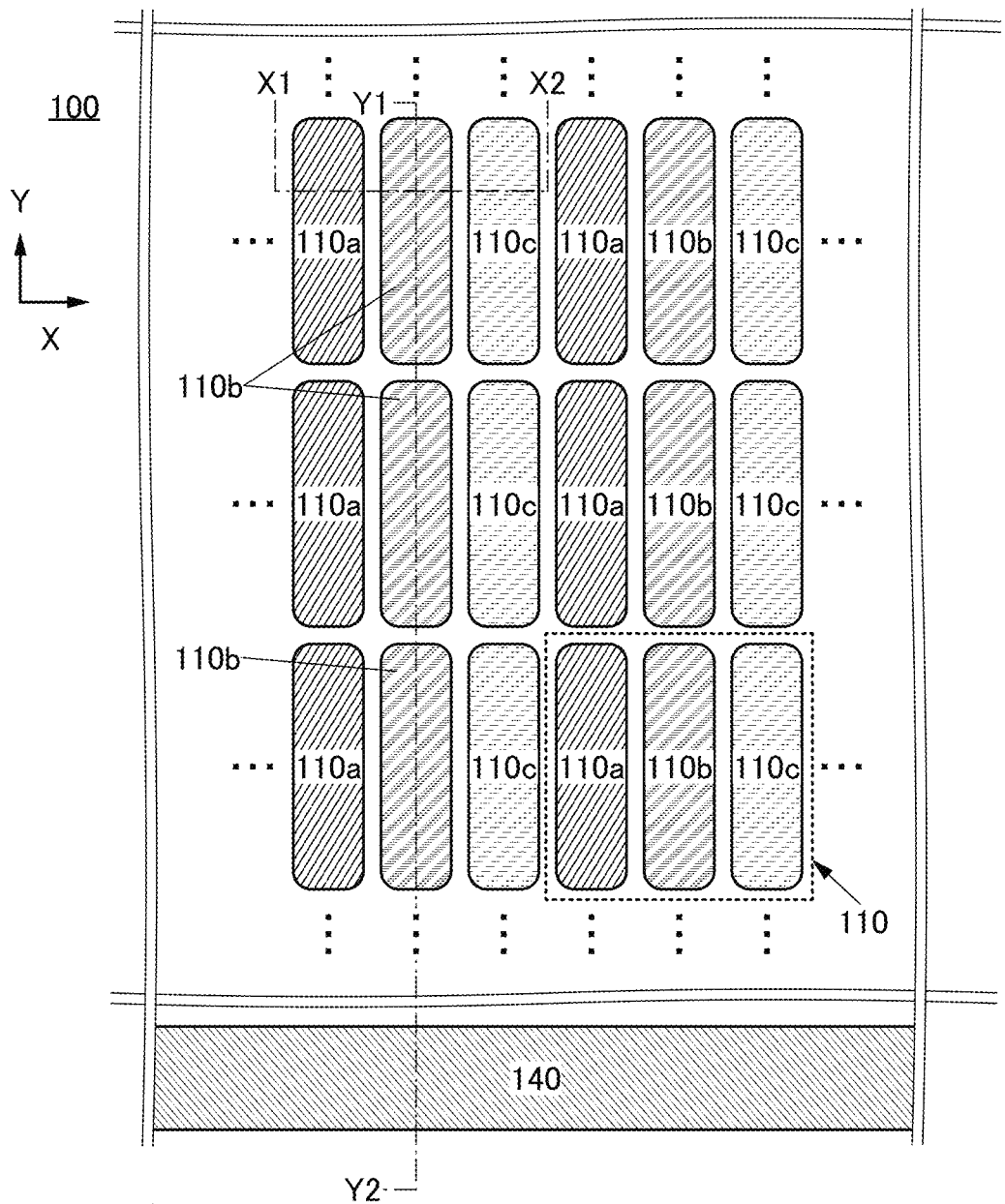
FIG. 1A is a top view illustrating an example of a display apparatus.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments.

Note that in structures of the invention described below, the same portions or portions having similar functions are denoted by the same reference numerals in different drawings, and the description thereof is not repeated. The same hatching pattern is used for portions having similar functions, and the portions are not especially denoted by reference numerals in some cases.

The position, size, range, or the like of each component illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer" can be replaced with the term "conductive film". As another example, the term "insulating film" can be replaced with the term "insulating layer".

Embodiment 1

In this embodiment, a display apparatus of one embodiment of the present invention and a manufacturing method thereof will be described with reference to FIGS. 1A and 1B to FIGS. 13A to 13F.

In the display apparatus of one embodiment of the present invention, pixels are arranged in a matrix in a display portion, and an image can be displayed on the display portion. Each of the pixels includes a light-emitting device (also referred to as a light-emitting element) that emits blue light, and a color conversion layer that overlaps the light-emitting device.

Note that in this specification and the like, a pixel refers to, for example, one element whose brightness can be controlled. For example, one pixel refers to one color element by which brightness is expressed. In a color display apparatus having color elements of red (R), green (G), and blue (B), the minimum unit of an image is composed of three pixels of an R pixel, a G pixel, and a B pixel. In this case, the pixel of each of RGB can also be referred to as a subpixel, and the three subpixels of RGB can be collectively referred to as a pixel. When color conversion layers having a function of converting light into light with different wavelengths are used in the subpixels of each pixel, full-color display can be performed. Furthermore, light-emitting devices used in each pixel can be formed using the same materials; thus, the manufacturing process can be simplified and the manufacturing cost can be reduced.

As the light-emitting device, an EL device (also referred to as an EL element) such as an organic LED (OLED) or a quantum-dot LED (QLED) is preferably used. Examples of a light-emitting substance included in the EL device include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material). An LED such as a micro LED can also be used as the light-emitting device.

When the light-emitting device of each pixel is formed using an organic EL device that emits blue light, separate (side-by-side) formation of light-emitting layers in the pixels is not necessary. Thus, a layer other than a pixel electrode included in the light-emitting device (e.g., a light-emitting layer) can be shared by pixels. However, some layers included in the light-emitting device have relatively high conductivity; when a layer having high conductivity is shared by pixels, leakage current might be generated between the pixels. Particularly when the increase in definition or aperture ratio of a display apparatus reduces the distance between pixels, the leakage current might become too large to ignore and cause a decrease in display quality of the display apparatus or the like. In view of the above, in the display apparatus according to one embodiment of the present invention, at least part of the light-emitting device in each pixel is formed in an island shape to achieve higher definition and higher reliability of the display apparatus. Here, the island-shaped part of the light-emitting device includes a light-emitting layer.

Note that in this specification and the like, the term "island shape" refers to a state where two or more layers formed using the same material in the same step are physically separated from each other. For example, "island-shaped light-emitting layer" means a state where the light-emitting layer and its adjacent light-emitting layer are physically separated from each other.

For example, an island-shaped light-emitting layer can be deposited by a vacuum evaporation method using a metal mask (also referred to as a shadow mask). However, this method causes a deviation from the designed shape and position of an island-shaped light-emitting layer due to various influences such as low dimensional accuracy of the metal mask, a misalignment between the metal mask and a substrate, a warp of the metal mask, and the vapor-scattering-induced expansion of an outline of the deposited film; accordingly, it is difficult to achieve high definition and a high aperture ratio of the display apparatus. In addition, the outline of the layer may blur during vapor deposition, whereby the thickness of an end portion may be small. That is, the thickness of the island-shaped light-emitting layer may vary from area to area. In the case of manufacturing a display apparatus with a large size, high resolution, or high definition, the manufacturing yield might be reduced because of low dimensional accuracy of the metal mask and deformation due to heat or the like.

In a method for manufacturing a display apparatus of one embodiment of the present invention, an island-shaped pixel electrode (also referred to as lower electrode) is formed, and an insulating layer that covers an end portion of the pixel electrode is formed; then, a layer including a light-emitting layer (which can be referred to as an EL layer or part of the EL layer) is formed on the entire surface; and a sacrificial layer (also referred to as a mask layer) is formed over the EL layer. Then, a resist mask is formed over the sacrificial layer, and the EL layer and the sacrificial layer are processed using the resist mask, whereby an island-shaped EL layer is formed over the island-shaped pixel electrode. Here, the EL layer includes at least the light-emitting layer and can be referred to as a light-emitting unit.

As described above, in the method for manufacturing the display apparatus of one embodiment of the present invention, the island-shaped EL layer is formed not by patterning with a metal mask but by processing an EL layer formed on the entire surface. Accordingly, a high-definition display apparatus or a display apparatus with a high aperture ratio, each of which has been difficult to achieve, can be obtained.

Moreover, providing the sacrificial layer over the EL layer can reduce damage to the EL layer in the manufacturing process of the display apparatus, resulting in an increase in reliability of the light-emitting device.

The interval between adjacent light-emitting devices can be reduced to 8 μm or less, 6 μm or less, 4 μm or less, 3 μm or less, 2 μm or less, or 1 μm or less by the above-described method, whereas it is difficult for a formation method using a metal mask, for example, to reduce the interval to less than 10 μm. Furthermore, for example, with the use of a light exposure tool for LSI, the interval can be reduced to be 500 nm or less, 200 nm or less, 100 nm or less, or even 50 nm or less. Accordingly, the area of a non-light-emitting region that could exist between two light-emitting devices can be significantly reduced, and the aperture ratio can be close to 100%. For example, the aperture ratio is higher than or equal to 50%, higher than or equal to 60%, higher than or equal to 70%, higher than or equal to 80%, or higher than or equal to 90%; that is, an aperture ratio lower than 100% can be achieved.

In addition, a pattern of the EL layer itself can be made much smaller than that in the case of using a metal mask. For example, in the case of using a metal mask for forming EL layers separately, a variation in the thickness of the pattern occurs between the center and the edge of the pattern. This causes a reduction in an effective area that can be used as a light-emitting region with respect to the entire pattern area. In contrast, in the manufacturing method of one embodiment of the present invention, a pattern is formed by processing a film deposited to have a uniform thickness, which enables a uniform thickness in the pattern. Thus, even with a fine pattern, almost the entire area can be used as a light-emitting region. Consequently, a display apparatus having both high definition and a high aperture ratio can be manufactured.

Note that in light-emitting devices that emit blue light, it is not necessary to form all layers included in the EL layer to have an island shape, and some of the layers can be formed in the same step. In the method for manufacturing the display apparatus of one embodiment of the present invention, some of the layers included in the EL layer are formed to have an island shape in each pixel, and then, the sacrificial layer is removed and the other layer(s) included in the EL layer (e.g., a carrier-injection layer) and a common electrode (also referred to as an upper electrode) can be formed as shared layers.

The carrier-injection layer is often a layer having relatively high conductivity in the light-emitting device. Therefore, when the carrier-injection layer is in contact with a side surface of the island-shaped EL layer, the light-emitting device might be short-circuited. Note that also in the case where the carrier-injection layer is formed in an island shape and only the common electrode is formed to be shared by light-emitting devices, the light-emitting device might be short-circuited when the common electrode is in contact with a side surface of the island-shaped EL layer or a side surface of the pixel electrode.

In view of the above, the display apparatus of one embodiment of the present invention includes an insulating layer that covers a side surface of the island-shaped EL layer (e.g., light-emitting layer) and an insulating layer that covers an end portion of the pixel electrode. Thus, at least some layer in the island-shaped EL layer and the pixel electrode can be prevented from being in contact with the carrier-injection layer or the common electrode. Hence, a short circuit of the light-emitting device is suppressed, and the reliability of the light-emitting device can be increased.

The display apparatus of one embodiment of the present invention includes a pixel electrode functioning as an anode; an island-shaped hole-injection layer, an island-shaped hole-transport layer, an island-shaped light-emitting layer, and an island-shaped electron-transport layer that are provided in this order over the pixel electrode; an insulating layer that covers an end portion of the pixel electrode; an insulating layer provided to cover side surfaces of the hole-injection layer, the hole-transport layer, the light-emitting layer, and the electron-transport layer; an electron-injection layer provided over the electron-transport layer; and a common electrode that is provided over the electron-injection layer and functions as a cathode.

Alternatively, the display apparatus of one embodiment of the present invention includes a pixel electrode functioning as a cathode; an island-shaped electron-injection layer, an island-shaped electron-transport layer, an island-shaped light-emitting layer, and an island-shaped hole-transport layer that are provided in this order over the pixel electrode; an insulating layer that covers an end portion of the pixel electrode; an insulating layer provided to cover side surfaces of the electron-injection layer, the electron-transport layer, the light-emitting layer, and the hole-transport layer; a hole-injection layer provided over the hole-transport layer; and a common electrode that is provided over the hole-injection layer and functions as an anode.

Alternatively, the display apparatus of one embodiment of the present invention includes a pixel electrode, a first light-emitting unit over the pixel electrode, an intermediate layer (also referred to as a charge-generation layer) over the first light-emitting unit, a second light-emitting unit over the intermediate layer, an insulating layer that covers an end portion of the pixel electrode, an insulating layer provided to cover side surfaces of the first light-emitting unit, the intermediate layer, and the second light-emitting unit, and a common electrode provided over the second light-emitting unit. Note that a layer common to light-emitting devices of different colors may be provided between the second light-emitting unit and the common electrode.

The hole-injection layer, the electron-injection layer, and the charge-generation layer, for example, often have relatively high conductivity in the EL layer. Since the side surfaces of these layers are covered with the insulating layer in the display apparatus of one embodiment of the present invention, these layers can be prevented from being in contact with the common electrode or the like. Consequently, a short circuit of the light-emitting device can be suppressed, and the reliability of the light-emitting device can be increased.

In the display apparatus of one embodiment of the present invention, all light-emitting devices included in the pixels emit blue light, and blue light is converted into light with different wavelengths by color conversion layers to achieve full-color display. Thus, as compared to the case of manufacturing light-emitting devices that emit white light, the number of EL layers to be formed and kinds of materials can be reduced, whereby a manufacturing apparatus and the process can be simplified to improve the yield.

With such a structure, a highly reliable display apparatus with high definition or high resolution can be manufactured. It is not necessary to increase the definition in a pseudo manner by using a special pixel arrangement method such as a pentile method, for example; even an arrangement method where one pixel consists of three or more subpixels enables a display apparatus with ultra-high definition. For example, it is possible to achieve a display apparatus that employs what is called a stripe arrangement in which R, G, and B pixels are arranged in one direction and has definition higher than or equal to 500 ppi, higher than or equal to 1000 ppi, higher than or equal to 2000 ppi, higher than or equal to 3000 ppi, or higher than or equal to 5000 ppi.

For the color conversion layer, a fluorescent material or a quantum dot (QD) is preferably used. A quantum dot has an emission spectrum with a narrow peak, so that emission with high color purity can be obtained. Thus, the display quality of the display apparatus can be improved.

The insulating layer that covers the side surface of the EL layer and the like may have a single-layer structure or a stacked-layer structure. An insulating layer having a two-layer structure is particularly preferably used. For example, the first layer of the insulating layer is preferably formed using an inorganic insulating material because it is formed in contact with the EL layer. In particular, the first layer is preferably formed by an atomic layer deposition (ALD) method, by which damage due to deposition is small. Alternatively, an inorganic insulating layer is preferably formed by a sputtering method, a chemical vapor deposition (CVD) method, or a plasma-enhanced chemical vapor deposition (PECVD) method, which have higher deposition speed than an ALD method. In that case, a highly reliable display apparatus can be manufactured with high productivity. The second layer of the insulating layer is preferably formed using an organic material to fill a recess portion formed by the first layer of the insulating layer.

For example, an aluminum oxide film formed by an ALD method can be used as the first layer of the insulating layer, and a photosensitive organic resin film can be used as the second layer of the insulating layer.

Alternatively, an insulating layer having a single-layer structure may be formed. For example, an insulating layer having a single-layer structure using an inorganic material can be used as a protective insulating layer for the EL layer. This increases the reliability of the display apparatus. As another example, an insulating layer having a single-layer structure using an organic material can fill a space between adjacent EL layers so that higher planarity is achieved. This increases the coverage of the EL layer and the insulating layer with the common electrode (upper electrode) formed thereover.

[Structure Example 1 of Display Device]

Figure 1B:
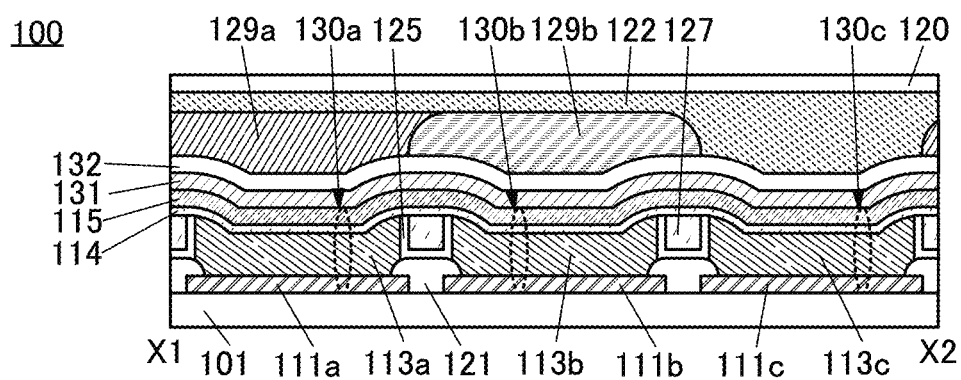
FIG. 1B is a cross-sectional view illustrating an example of the display apparatus.

FIGS. 1A and 1B illustrate a display apparatus of one embodiment of the present invention.

FIG. 1A is a top view of a display apparatus 100. The display apparatus 100 includes a display portion in which a plurality of pixels 110 are arranged in a matrix, and a connection portion 140 placed outside the display portion.

In FIGS. 1A and 1B, a subpixel 110a and a subpixel 110b respectively include color conversion layers 129a and 129b (which may be hereinafter collectively referred to as a color conversion layer 129) overlapping light-emitting devices 130a and 130b, and a subpixel 110c does not include a color conversion layer. For example, the color conversion layer 129a can convert blue light into red light, and the color conversion layer 129b can convert blue light into green light. Thus, red light is extracted to the outside from the subpixel 110a, and green light is extracted to the outside from the subpixel 110b. From the subpixel 110c that does not include a color conversion layer, blue light emitted from a light-emitting device 130c is extracted. Note that the subpixels 110a, 110b, and 110c are not limited to exhibiting three colors of red (R), green (G), and blue (B); for example, a color conversion layer may be provided in the subpixel 110c, and the subpixels may exhibit three colors of yellow (Y), cyan (C), and magenta (M).

FIG. 1A illustrates an example where subpixels of different colors are arranged in the X direction and subpixels of the same color are arranged in the Y direction. Note that subpixels of different colors may be arranged in the Y direction, and subpixels of the same color may be arranged in the X direction.

Although FIG. 1A illustrates an example where the connection portion 140 is positioned on the bottom side of the display portion in the top view, one embodiment of the present invention is not particular limited. The connection portion 140 only needs to be provided on at least one of the top, right, left, and bottom sides of the display portion in the top view, and may be provided to surround the four sides of the display portion. Moreover, one connection portion 140 or a plurality of connection portions 140 can be provided.

FIG. 1B is a cross-sectional view along the dashed-dotted line X1-X2 in FIG. 1A.

As illustrated in FIG. 1B, the display apparatus 100 includes the light-emitting devices 130a, 130b, and 130c over a layer 101 including transistors (not illustrated), and protective layers 131 and 132 provided to cover these light-emitting devices. The color conversion layers 129a and 129b are provided over the protective layer 132. A substrate 120 is attached above the color conversion layers 129a and 129b with a resin layer 122. In a region between the adjacent light-emitting devices, an insulating layer 125 and an insulating layer 127 on the insulating layer 125 are provided.

The display apparatus of one embodiment of the present invention can have any of the following structures: a top-emission structure in which light is emitted in a direction opposite to the substrate where the light-emitting devices are formed, a bottom-emission structure in which light is emitted toward the substrate where the light-emitting devices are formed, and a dual-emission structure in which light is emitted toward both surfaces.

The layer 101 can have a stacked-layer structure in which a plurality of transistors (not illustrated) are provided over a substrate and an insulating layer is provided to cover these transistors, for example. The layer 101 may have a recess portion between adjacent light-emitting devices. For example, an insulating layer positioned on the outermost surface of the layer 101 may have a recess portion. Structure examples of the layer 101 will be described later in Embodiments 3 and 4.

The light-emitting devices 130a, 130b, and 130c preferably emit blue (B) light. The color conversion layers 129a and 129b having a function of converting light into light of different colors are provided over the light-emitting devices 130a and 130b, and a color conversion layer is not provided over the light-emitting device 130c; hence, the subpixels 110a, 110b, and 110c that emit light of different colors can be formed.

Note that the light-emitting devices 130a, 130b, and 130c, which can be used in the display apparatus of one embodiment of the present invention, are not limited to light-emitting devices that emit blue light and can alternatively be light-emitting devices that emit ultraviolet light, for example. When light-emitting devices that emit ultraviolet light are used as the light-emitting devices 130a, 130b, and 130c, color conversion layers 129 having a function of converting ultraviolet light into light of different colors are provided to overlap the light-emitting devices 130a, 130b, and 130c. For example, a color conversion layer that converts ultraviolet light into light with a red wavelength can be provided as the color conversion layer 129a, a color conversion layer that converts ultraviolet light into light with a green wavelength can be provided as the color conversion layer 129b, and a color conversion layer that converts ultraviolet light into light with a blue wavelength can be provided over the light-emitting device 130c. Thus, red light is extracted to the outside from the subpixel 110a, green light is extracted to the outside from the subpixel 110b, and blue light is extracted to the outside from the subpixel 110c; hence, the display apparatus can perform full-color display.

As the light-emitting devices 130a, 130b, and 130c, EL devices such as OLEDs or QLEDs are preferably used. Examples of light-emitting substances included in EL devices include a substance exhibiting fluorescence (a fluorescent material), a substance exhibiting phosphorescence (a phosphorescent material), an inorganic compound (e.g., a quantum dot material), and a substance exhibiting thermally activated delayed fluorescence (a thermally activated delayed fluorescent (TADF) material). As a TADF material, a material that is in thermal equilibrium between a singlet excited state and a triplet excited state may be used. Such a TADF material has a shorter light emission lifetime (excitation lifetime) and thus can inhibit a reduction in efficiency of the light-emitting device in a high-luminance region.

The light-emitting device includes an EL layer between a pair of electrodes. In this specification and the like, one of the pair of electrodes may be referred to as a pixel electrode and the other may be referred to as a common electrode.

One of the pair of electrodes of the light-emitting device functions as an anode, and the other electrode functions as a cathode. The case where the pixel electrode functions as an anode and the common electrode functions as a cathode will be described below as an example.

The light-emitting device 130a includes a pixel electrode 111a over the layer 101, an island-shaped first layer 113a over the pixel electrode 111a, a fifth layer 114 over the island-shaped first layer 113a, and a common electrode 115 over the fifth layer 114. In the light-emitting device 130a, the first layer 113a and the fifth layer 114 can be collectively referred to as an EL layer.

There is no particular limitation on the structure of the light-emitting device in this embodiment, and the light-emitting device can have a single structure or a tandem structure. Note that structure examples of the light-emitting device will be described later in Embodiment 2.

The light-emitting device 130b includes a pixel electrode 111b over the layer 101, an island-shaped second layer 113b over the pixel electrode 111b, the fifth layer 114 over the island-shaped second layer 113b, and the common electrode 115 over the fifth layer 114. In the light-emitting device 130b, the second layer 113b and the fifth layer 114 can be collectively referred to as an EL layer.

The light-emitting device 130c includes a pixel electrode 111c over the layer 101, an island-shaped third layer 113c over the pixel electrode 111c, the fifth layer 114 over the island-shaped third layer 113c, and the common electrode 115 over the fifth layer 114. In the light-emitting device 130c, the third layer 113c and the fifth layer 114 can be collectively referred to as an EL layer.

The light-emitting devices of different colors share one film serving as the common electrode. The common electrode shared by the light-emitting devices is electrically connected to a conductive layer provided in the connection portion 140. Thus, the same potential is supplied to the common electrode included in the light-emitting devices.

A conductive film that transmits visible light is used as the electrode through which light is extracted, which is either the pixel electrode or the common electrode. A conductive film that reflects visible light is preferably used as the electrode through which light is not extracted.

For the pair of electrodes (the pixel electrode and the common electrode) of the light-emitting device, a metal, an alloy, an electrically conductive compound, a mixture thereof, and the like can be used as appropriate. Specific examples include indium tin oxide (In—Sn oxide, also referred to as ITO), In—Si—Sn oxide (also referred to as ITSO), indium zinc oxide (In—Zn oxide), In—W—Zn oxide, an alloy containing aluminum (an aluminum alloy) such as an alloy of aluminum, nickel, and lanthanum (Al—Ni—La), and an alloy of silver, palladium, and copper (Ag—Pd—Cu, also referred to as APC). In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use a Group 1 element or a Group 2 element in the periodic table, which is not described above (e.g., lithium (Li), cesium (Cs), calcium (Ca), or strontium (Sr)), a rare earth metal such as europium (Eu) or ytterbium (Yb), an alloy containing an appropriate combination of any of these elements, graphene, or the like.

The light-emitting device preferably employs a microcavity structure. Therefore, one of the pair of electrodes of the light-emitting device is preferably an electrode having properties of transmitting and reflecting visible light (a transflective electrode), and the other is preferably an electrode having a property of reflecting visible light (a reflective electrode). When the light-emitting device has a microcavity structure, light obtained from the light-emitting layer can be resonated between the electrodes, whereby light emitted from the light-emitting device can be intensified.

The transflective electrode can have a stacked-layer structure of a reflective electrode and an electrode having a property of transmitting visible light (also referred to as a transparent electrode).

The transparent electrode has a light transmittance higher than or equal to 40%. For example, an electrode having a visible light (light at wavelengths greater than or equal to 400 nm and less than 750 nm) transmittance higher than or equal to 40% is preferably used in the light-emitting device. The visible light reflectivity of the transflective electrode is higher than or equal to 10% and less than or equal to 95%, preferably higher than or equal to 30% and lower than or equal to 80%. The visible light reflectivity of the reflective electrode is higher than or equal to 40% and lower than or equal to 100%, preferably higher than or equal to 70% and lower than or equal to 100%. These electrodes preferably have a resistivity of $1\times10^{-2}$ Ωcm or lower.

The first layer 113a, the second layer 113b, and the third layer 113c are each provided in an island shape. The first layer 113a, the second layer 113b, and the third layer 113c each include a light-emitting layer. The first layer 113a, the second layer 113b, and the third layer 113c each preferably include a light-emitting layer that emits blue light. Here, the island-shaped first layer 113a, the island-shaped second layer 113b, and the island-shaped third layer 113c preferably contain the same material. That is, the island-shaped first layer 113a, the island-shaped second layer 113b, and the island-shaped third layer 113c are preferably formed by patterning of a film deposited in the same step.

The light-emitting layer contains a light-emitting substance. The light-emitting layer can contain one or more kinds of light-emitting substances. As the light-emitting substance, a substance whose emission color is blue, violet, bluish violet, green, yellowish green, yellow, orange, red, or the like is appropriately used. Alternatively, as the light-emitting substance, a substance that emits near-infrared light can be used.

Examples of the light-emitting substance include a fluorescent material, a phosphorescent material, a TADF material, and a quantum dot material.

Examples of a fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of a phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer may contain one or more kinds of organic compounds (e.g., a host material or an assist material) in addition to the light-emitting substance (guest material). As one or more kinds of organic compounds, one or both of a hole-transport material and an electron-transport material can be used. Alternatively, as one or more kinds of organic compounds, a bipolar material or a TADF material may be used.

The light-emitting layer preferably includes a phosphorescent material and a combination of a hole-transport material and an electron-transport material that easily forms an exciplex, for example. With such a structure, light emission can be efficiently obtained by exciplex-triplet energy transfer (ExTET), which is energy transfer from the exciplex to the light-emitting substance (phosphorescent material). When a combination of materials is selected so as to form an exciplex that emits light whose wavelength overlaps the wavelength of a lowest-energy-side absorption band of the light-emitting substance, energy can be transferred smoothly and light emission can be obtained efficiently. With the above structure, high efficiency, low-voltage driving, and a long lifetime of a light-emitting device can be achieved at the same time.

In addition to the light-emitting layer, the first layer 113a, the second layer 113b, and the third layer 113c may also include a layer containing any of a substance with a high hole-injection property, a substance with a high hole-transport property, a hole-blocking material, a substance with a high electron-transport property, a substance with a high electron-injection property, an electron-blocking material, a substance with a bipolar property (a substance with a high electron- and hole-transport property), and the like.

Either a low molecular compound or a high molecular compound can be used in the light-emitting device, and an inorganic compound may also be included. Each layer included in the light-emitting device can be formed by any of the following methods: an evaporation method (including a vacuum evaporation method), a transfer method, a printing method, an inkjet method, a coating method, and the like.

For example, the first layer 113a, the second layer 113b, and the third layer 113c may each include one or more of a hole-injection layer, a hole-transport layer, a hole-blocking layer, an electron-blocking layer, an electron-transport layer, and an electron-injection layer.

In the EL layer, one or more of a hole-injection layer, a hole-transport layer, a hole-blocking layer (sometimes referred to as a hole-inhibition layer), an electron-blocking layer (sometimes referred to as an electron-inhibition layer), an electron-transport layer, and an electron-injection layer can be formed as a layer common to the light-emitting devices. For example, a carrier-injection layer (a hole-injection layer or an electron-injection layer) may be formed as the fifth layer 114. Note that all the layers in the EL layer may be separately formed from those in light-emitting devices of different colors. That is, the EL layer does not necessarily include a layer common to light-emitting devices of different colors.

The first layer 113a, the second layer 113b, and the third layer 113c each preferably include a light-emitting layer and a carrier-transport layer over the light-emitting layer. Accordingly, the light-emitting layer is prevented from being exposed on the outermost surface in the process of manufacturing the display apparatus 100, so that damage to the light-emitting layer can be reduced. Thus, the reliability of the light-emitting device can be increased.

The hole-injection layer injects holes from the anode to the hole-transport layer and contains a material with a high hole-injection property. Examples of a material with a high hole-injection property include an aromatic amine compound and a composite material containing a hole-transport material and an acceptor material (electron-accepting material).

The hole-transport layer transports holes injected from the anode by the hole-injection layer, to the light-emitting layer. The hole-transport layer contains a hole-transport material. The hole-transport material preferably has a hole mobility of $1\times10^{-6}$ cm$^2$/Vs or higher. Note that other substances can also be used as long as the substances have a hole-transport property higher than an electron-transport property. As the hole-transport material, materials having a high hole-transport property, such as a π-electron rich heteroaromatic compound (e.g., a carbazole derivative, a thiophene derivative, and a furan derivative) and an aromatic amine (a compound having an aromatic amine skeleton), are preferred.

The electron-transport layer transports electrons injected from the cathode by the electron-injection layer, to the light-emitting layer. The electron-transport layer contains an electron-transport material. The electron-transport material preferably has an electron mobility of $1\times10^{-6}$ cm$^2$/Vs or higher. Note that other substances can also be used as long as the substances have an electron-transport property higher than a hole-transport property. As the electron-transport material, any of the following materials having a high electron-transport property can be used, for example: a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, and a π-electron deficient heteroaromatic compound such as a nitrogen-containing heteroaromatic compound.

The electron-transport layer may have a stacked-layer structure, and may include a hole-blocking layer, in contact with the light-emitting layer, which blocks holes moving from the anode side to the cathode side through the light-emitting layer.

The electron-injection layer injects electrons from the cathode to the electron-transport layer and contains a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The electron-injection layer can be formed using an alkali metal, an alkaline earth metal, or a compound thereof, such as lithium, cesium, ytterbium, lithium fluoride (LiF), cesium fluoride (CsF), calcium fluoride ($CaF_x$, where x is a given number), 8-(quinolinolato)lithium (abbreviation: Liq), 2-(2-pyridyl)phenolatolithium (abbreviation: LiPP), 2-(2-pyridyl)-3-pyridinolato lithium (abbreviation: LiPPy), 4-phenyl-2-(2-pyridyl)phenolatolithium (abbreviation: LiPPP), lithium oxide ($LiO_x$), or cesium carbonate, for example. The electron-injection layer may have a stacked-layer structure of two or more layers. In the stacked-layer structure, for example, lithium fluoride can be used for the first layer and ytterbium can be used for the second layer.

Alternatively, the electron-injection layer may be formed using an electron-transport material. For example, a compound having an unshared electron pair and an electron deficient heteroaromatic ring can be used as the electron-transport material. Specifically, it is possible to use a compound having at least one of a pyridine ring, a diazine ring (a pyrimidine ring, a pyrazine ring, and a pyridazine ring), and a triazine ring.

Note that the lowest unoccupied molecular orbital (LUMO) of the organic compound having an unshared electron pair is preferably greater than or equal to −3.6 eV and less than or equal to −2.3 eV. In general, the highest occupied molecular orbital (HOMO) level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-bis(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), or the like can be used as the organic compound having an unshared electron pair. Note that NBPhen has a higher glass transition temperature (Tg) than BPhen and thus has high heat resistance.

In the case of manufacturing a tandem light-emitting device, an intermediate layer is provided between two light-emitting units. The intermediate layer has a function of injecting electrons into one of the two light-emitting units and injecting holes to the other when voltage is applied between the pair of electrodes.

For example, the intermediate layer can be favorably formed using a material that can be used for the electron-injection layer, such as lithium. As another example, the intermediate layer can be favorably formed using a material that can be used for the hole-injection layer. Moreover, the intermediate layer can be a layer containing a hole-transport material and an acceptor material (electron-accepting material). The intermediate layer can be a layer containing an electron-transport material and a donor material. Forming the intermediate layer including such a layer can suppress an increase in the driving voltage that would be caused when the light-emitting units are stacked.

End portions of the pixel electrodes 111a, 111b, and 111c are covered with an insulating layer 121.

The insulating layer 121 can have a single-layer structure or a stacked-layer structure including one or both of an inorganic insulating film and an organic insulating film.

When an inorganic insulating film is used as the insulating layer 121 covering the end portion of the pixel electrode, the effect of preventing entry of impurities from the outside into the light-emitting device can be enhanced, as compared to the case of using an organic insulating film. Thus, the reliability of the light-emitting device can be increased. In contrast, when an organic insulating film is used as the insulating layer 121 covering the end portion of the pixel electrode, the insulating layer 121 can favorably cover the end portion of the pixel electrode, as compared to the case of using an inorganic insulating film. Thus, a short circuit of the light-emitting device can be prevented. Specifically, when an organic insulating film is used as the insulating layer 121, the insulating layer 121 can be processed into a tapered shape or the like. Note that in this specification and the like, a tapered shape refers to a shape such that at least part of a side surface of a component is inclined with respect to the substrate surface or the surface where the component is formed. For example, a tapered shape preferably includes a region where the angle between the inclined side surface and the substrate surface or the surface where a component is formed (such an angle is also referred to as a taper angle) is less than 90°.

Side surfaces of the first layer 113a, the second layer 113b, and the third layer 113c are covered with the insulating layer 125 and the insulating layer 127 that are provided over the insulating layer 121. Thus, the fifth layer 114 (or the common electrode 115) can be prevented from being in contact with the side surface of the first layer 113a, the second layer 113b, or the third layer 113c, whereby a short circuit of the light-emitting device can be prevented.

In the case where the first layer 113a, the second layer 113b, and the third layer 113c have a tandem structure, side surfaces of a plurality of light-emitting units and intermediate layers included in these layers are also covered with the insulating layer 125 and the insulating layer 127. Hence, the fifth layer 114 (or the common electrode 115) can be prevented from being in contact with the side surface of any of the plurality of light-emitting units or the intermediate layers, whereby a short circuit of the light-emitting device can be prevented.

The insulating layer 125 preferably covers the side surfaces of the first layer 113a, the second layer 113b, and the third layer 113c. The insulating layer 125 can be in contact with the side surfaces of the first layer 113a, the second layer 113b, and the third layer 113c. The bottom surface of the insulating layer 125 can be in contact with the top surface of the insulating layer 121. The insulating layer 125 is preferably an insulating layer containing an inorganic material.

The insulating layer 127 is provided over the insulating layer 125 to fill a recess portion formed by the insulating layer 125. The insulating layer 127 can overlap the side surfaces of the first layer 113a, the second layer 113b, and the third layer 113c and the top surface of the insulating layer 121, with the insulating layer 125 therebetween. The insulating layer 127 is preferably an insulating layer containing an organic material.

Note that one of the insulating layer 125 and the insulating layer 127 is not necessarily provided. For example, in the case where the insulating layer 125 is not provided, the insulating layer 127 can be in contact with the side surfaces of the first layer 113a, the second layer 113b, and the third layer 113c. The structure in which the insulating layer 125 or the insulating layer 127 is not provided can reduce the number of steps for manufacturing the display apparatus. Meanwhile, in the case where the insulating layer 125 containing an inorganic material is provided in contact with the side surfaces of the first layer 113a, the second layer 113b, and the third layer 113c, the effect of preventing entry of impurities into these layers can be enhanced. Furthermore, providing the insulating layer 127 can improve the planarity of the formation surfaces of the fifth layer 114 and the common electrode 115. Note that a structure in which both the insulating layer 125 and the insulating layer 127 are not provided can alternatively be employed.

The fifth layer 114 and the common electrode 115 are provided over the first layer 113a, the second layer 113b, the third layer 113c, the insulating layer 125, and the insulating layer 127. At the stage before the insulating layer 125 and the insulating layer 127 are provided, a level difference due to a region where the EL layer is provided and a region where the EL layer is not provided (a region between the light-emitting devices) is caused. The display apparatus of one embodiment of the present invention can eliminate the level difference by including the insulating layers 125 and 127, whereby the fifth layer 114 and the common electrode 115 can more favorably cover their formation surfaces. Consequently, it is possible to inhibit a connection defect due to disconnection of the fifth layer 114 and the common electrode 115. Alternatively, it is possible to inhibit an increase in electric resistance due to local thinning of the common electrode 115 by the level difference.

Note that in this specification and the like, disconnection refers to a phenomenon in which a layer, a film, or an electrode is split because of the shape of the formation surface (e.g., a level difference).

In order to improve the planarity of the formation surfaces of the fifth layer 114 and the common electrode 115, the height of the top surface of the insulating layer 125 and the height of the top surface of the insulating layer 127 are each preferably equal to or substantially equal to the height of the top surface of at least one of the first layer 113a, the second layer 113b, and the third layer 113c. The top surface of the insulating layer 127 is preferably flat and may have a projection, a convex curve, a concave curve, or a projection.

The insulating layer 125 includes regions in contact with the side surfaces of the first layer 113a, the second layer 113b, and the third layer 113c and functions as a protective insulating layer for the first layer 113a, the second layer 113b, and the third layer 113c. Providing the insulating layer 125 can prevent impurities (e.g., oxygen and moisture) from entering the first layer 113a, the second layer 113b, and the third layer 113c through their side surfaces, resulting in a highly reliable display apparatus.

When the width (thickness) of the insulating layer 125 in the regions in contact with the side surfaces of the first layer 113a, the second layer 113b, and the third layer 113c is large in the cross-sectional view, the intervals between the adjacent first to third layers 113a to 113c increase, so that the aperture ratio may be reduced. Meanwhile, when the width (thickness) of the insulating layer 125 is small, the effect of preventing impurities from entering the first layer 113a, the second layer 113b, and the third layer 113c through their side surfaces may be weakened. The width (thickness) of the insulating layer 125 in the regions in contact with the side surfaces of the first layer 113a, the second layer 113b, and the third layer 113c is preferably greater than or equal to 3 nm and less than or equal to 200 nm, further preferably greater than or equal to 3 nm and less than or equal to 150 nm, further preferably greater than or equal to 5 nm and less than or equal to 150 nm, still further preferably greater than or equal to 5 nm and less than or equal to 100 nm, still further preferably greater than or equal to 10 nm and less than or equal to 100 nm, yet further preferably greater than or equal to 10 nm and less than or equal to 50 nm. When the width (thickness) of the insulating layer 125 is within the above range, the display apparatus can have both a high aperture ratio and high reliability.

The insulating layer 125 can be an insulating layer containing an inorganic material. As the insulating layer 125, an inorganic insulating film such as an oxide insulating film, a nitride insulating film, an oxynitride insulating film, or a nitride oxide insulating film can be used, for example. The insulating layer 125 may have a single-layer structure or a stacked-layer structure. Examples of the oxide insulating film include a silicon oxide film, an aluminum oxide film, a magnesium oxide film, an indium gallium zinc oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. Aluminum oxide is particularly preferable because it has high etching selectivity with the EL layer and has a function of protecting the EL layer during formation of the insulating layer 127 described later. In particular, when an inorganic insulating film such as an aluminum oxide film, a hafnium oxide film, a silicon oxide film, or a silicon nitride film formed by an ALD method is used as the insulating layer 125, the insulating layer 125 has a small number of pin holes and excels in a function of protecting the EL layer. In the case where the insulating layer 125 has a stacked-layer structure using an inorganic material, the insulating layer 125 preferably employs a stacked-layer structure of an aluminum oxide film and a silicon nitride film, for example.

Note that in this specification and the like, oxynitride refers to a material that contains more oxygen than nitrogen, and nitride oxide refers to a material that contains more nitrogen than oxygen. For example, a silicon oxynitride refers to a material that contains oxygen at a higher proportion than nitrogen, and a silicon nitride oxide refers to a material that contains nitrogen at a higher proportion than oxygen.

The insulating layer 125 can be formed by a sputtering method, a CVD method, a pulsed laser deposition (PLD) method, an ALD method, or the like. The insulating layer 125 is preferably formed by an ALD method achieving good coverage.

The insulating layer 127 provided over the insulating layer 125 has a function of filling the recess portion of the insulating layer 125, which is formed between the adjacent light-emitting devices. In other words, the insulating layer 127 has an effect of improving the planarity of the formation surface of the common electrode 115. As the insulating layer 127, an insulating layer containing an organic material can be favorably used. For example, the insulating layer 127 can be formed using an acrylic resin, a polyimide resin, an epoxy resin, an imide resin, a polyamide resin, a polyimide-amide resin, a silicone resin, a siloxane resin, a benzocyclobutene-based resin, a phenol resin, precursors of these resins, or the like. The insulating layer 127 may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. Moreover, the insulating layer 127 can be formed using a photosensitive resin. A photoresist may be used as the photosensitive resin. The photosensitive resin can be of positive or negative type.

The difference between the height of the top surface of the insulating layer 127 and the height of the top surface of one of the first layer 113*a*, the second layer 113*b*, and the third layer 113*c* is preferably less than or equal to 0.5 times, further preferably less than or equal to 0.3 times the thickness of the insulating layer 127, for example. As another example, the insulating layer 127 may be provided so that the height of the top surface of one of the first layer 113*a*, the second layer 113*b*, and the third layer 113*c* is greater than the height of the top surface of the insulating layer 127. As another example, the insulating layer 127 may be provided so that the height of the top surface of the insulating layer 127 is greater than the height of the top surface of the light-emitting layer included in the first layer 113*a*, the second layer 113*b*, or the third layer 113*c*.

Providing the insulating layer 127 can prevent at least some of the layers in the island-shaped EL layer from being in contact with the carrier-injection layer or the common electrode. Thus, a short circuit of the light-emitting device can be suppressed, and the reliability of the light-emitting device can be increased. Moreover, providing the insulating layer 127 can fill the space between the adjacent island-shaped EL layers; hence, the formation surface of a layer (e.g., the carrier-injection layer and the common electrode) provided over the island-shaped EL layer has less unevenness and can be flatter. Consequently, the carrier-injection layer or the common electrode can more favorably cover the formation surface.

The insulating layer 127 can be formed at the same time as an external lead terminal portion (e.g., the after-mentioned connection portion 140 placed outside the display portion), and thus can be formed without increasing the number of manufacturing steps. Moreover, providing the insulating layer 127 brings about an effect of preventing film separation. Specifically, the organic layer (e.g., one or more of the hole-injection layer, the hole-transport layer, the light-emitting layer, the electron-transport layer, and the electron-injection layer) and the insulating layer 125 can be provided in contact with each other; hence, adhesion between the organic layer and the insulating layer 125 can be higher than that in the structure where the insulating layer 127 is not provided.

When a photosensitive organic resin film is used as the insulating layer 127 and an aluminum oxide film formed by an ALD method is used as the insulating layer 125, it is possible to achieve a structure where the photosensitive organic resin film is not in direct contact with a side surface of the EL layer. For example, in the case where the side surface of the EL layer and the photosensitive organic resin film are in direct contact with each other, an organic solvent or the like that can be included in the photosensitive organic resin film might cause damage to the side surface of the EL layer. In contrast, in the structure of one embodiment of the present invention, the side surface of the EL layer is covered with the aluminum oxide film formed by an ALD method; hence, the organic solvent that can be included in the photosensitive organic resin film is not in direct contact with the side surface of the EL layer.

The protective layers 131 and 132 are preferably provided over the light-emitting devices 130*a*, 130*b*, and 130*c*. Providing the protective layers 131 and 132 can improve the reliability of the light-emitting devices.

There is no limitation on the conductivity of the protective layers 131 and 132. As the protective layers 131 and 132, at least one type of insulating films, semiconductor films, and conductive films can be used.

The protective layers 131 and 132 including inorganic films can suppress deterioration of the light-emitting devices by preventing oxidation of the common electrode 115 and inhibiting entry of impurities (e.g., moisture and oxygen) into the light-emitting devices 130*a*, 130*b*, and 130*c*, for example; thus, the reliability of the display apparatus can be improved.

As the protective layers 131 and 132, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film.

Each of the protective layers 131 and 132 preferably includes a nitride insulating film or a nitride oxide insulating film, and further preferably includes a nitride insulating film.

As the protective layers 131 and 132, an inorganic film containing In—Sn oxide (also referred to as ITO), In—Zn oxide, Ga—Zn oxide, Al—Zn oxide, indium gallium zinc oxide (In—Ga—Zn oxide, also referred to as IGZO), or the like can also be used. The inorganic film preferably has high resistance, specifically, higher resistance than the common electrode 115. The inorganic film may further contain nitrogen.

When light emitted from the light-emitting device is extracted through the protective layers 131 and 132, the protective layers 131 and 132 preferably have a high visible-light-transmitting property. For example, ITO, IGZO, and aluminum oxide are preferable because they are inorganic materials having a high visible-light-transmitting property.

The protective layers 131 and 132 can be, for example, a stack of an aluminum oxide film and a silicon nitride film over the aluminum oxide film, or a stack of an aluminum oxide film and an IGZO film over the aluminum oxide film. Such a stacked-layer structure can suppress entry of impurities (e.g., water and oxygen) into the EL layer.

Furthermore, the protective layers 131 and 132 may include an organic film. For example, the protective layer 132 may include both an organic film and an inorganic film.

The protective layer 131 and the protective layer 132 may be formed by different deposition methods. Specifically, the protective layer 131 may be formed by an ALD method, and the protective layer 132 may be formed by a sputtering method.

The color conversion layer 129 (the color conversion layer 129*a* and the color conversion layer 129*b*) is provided over the protective layer 132. The color conversion layer 129*a* includes a region overlapping the light-emitting device 130*a*, and the color conversion layer 129*b* includes a region overlapping the light-emitting device 130*b*. The color conversion layers 129a and 129b each include a region overlapping at least the light-emitting layer included in the corresponding light-emitting device 130.

The color conversion layer 129 has a function of converting light emitted from the light-emitting device 130 into light with a different wavelength. The color conversion layer 129a and the color conversion layer 129b have a function of converting light into light of different colors. For example, the color conversion layer 129a has a function of converting blue light emitted from the light-emitting device 130a into red light, and the color conversion layer 129b has a function of converting blue light emitted from the light-emitting device 130b into green light. From the subpixel 110c not including a color conversion layer, blue light emitted from the light-emitting device 130c is extracted. Thus, the display apparatus 100 can perform full-color display.

For the color conversion layer 129, a fluorescent material, quantum dots, or the like can be used. In particular, quantum dots are preferably used for the color conversion layer 129. The color conversion layer 129 using quantum dots can exhibit vivid-color light with a narrow half width of the emission spectrum. In addition, the color reproducibility of the display apparatus can be improved.

There is no limitation on a material of quantum dots, and examples include a Group 14 element, a Group 15 element, a Group 16 element, a compound of a plurality of Group 14 elements, a compound of an element belonging to any of Groups 4 to 14 and a Group 16 element, a compound of a Group 2 element and a Group 16 element, a compound of a Group 13 element and a Group 15 element, a compound of a Group 13 element and a Group 17 element, a compound of a Group 14 element and a Group 15 element, a compound of a Group 11 element and a Group 17 element, iron oxides, titanium oxides, spinel chalcogenides, and semiconductor clusters.

Specific examples include, but are not limited to, cadmium selenide; cadmium sulfide; cadmium telluride; zinc selenide; zinc oxide; zinc sulfide; zinc telluride; mercury sulfide; mercury selenide; mercury telluride; indium arsenide; indium phosphide; gallium arsenide; gallium phosphide; indium nitride; gallium nitride; indium antimonide; gallium antimonide; aluminum phosphide; aluminum arsenide; aluminum antimonide; lead selenide; lead telluride; lead sulfide; indium selenide; indium telluride; indium sulfide; gallium selenide; arsenic sulfide; arsenic selenide; arsenic telluride; antimony sulfide; antimony selenide; antimony telluride; bismuth sulfide; bismuth selenide; bismuth telluride; silicon; silicon carbide; germanium; tin; selenium; tellurium; boron; carbon; phosphorus; boron nitride; boron phosphide; boron arsenide; aluminum nitride; aluminum sulfide; barium sulfide; barium selenide; barium telluride; calcium sulfide; calcium selenide; calcium telluride; beryllium sulfide; beryllium selenide; beryllium telluride; magnesium sulfide; magnesium selenide; germanium sulfide; germanium selenide; germanium telluride; tin sulfide; tin selenide; tin telluride; lead oxide; copper fluoride; copper chloride; copper bromide; copper iodide; copper oxide; copper selenide; nickel oxide; cobalt oxide; cobalt sulfide; iron oxide; iron sulfide; manganese oxide; molybdenum sulfide; vanadium oxide; tungsten oxide; tantalum oxide; titanium oxide; zirconium oxide; silicon nitride; germanium nitride; aluminum oxide; barium titanate; a compound of selenium, zinc, and cadmium; a compound of indium, arsenic, and phosphorus; a compound of cadmium, selenium, and sulfur; a compound of cadmium, selenium, and tellurium; a compound of indium, gallium, and arsenic; a compound of indium, gallium, and selenium; a compound of indium, selenium, and sulfur; a compound of copper, indium, and sulfur; and a combinations thereof. What is called an alloyed quantum dot, whose composition is represented by a given ratio, may be used.

Examples of the quantum dot include a core-type quantum dot, a core-shell quantum dot, and a core-multishell quantum dot. Quantum dots have a high proportion of surface atoms and thus have high reactivity and easily cohere together. For this reason, it is preferable that a protective agent be attached to, or a protective group be provided at the surfaces of quantum dots. The attachment of the protective agent or the provision of the protective group can prevent cohesion and increase solubility in a solvent. It can also reduce reactivity and improve electrical stability.

Since band gaps of quantum dots are increased as their size is decreased, the size is adjusted as appropriate so that light with a desired wavelength can be obtained. Light emission from the quantum dots is shifted to a blue color side, i.e., a high energy side, as the crystal size is decreased; thus, emission wavelengths of the quantum dots can be adjusted over a wavelength range in the spectrum of an ultraviolet region, a visible light region, and an infrared region by changing the size of quantum dots. The range of size (diameter) of quantum dots is, for example, greater than or equal to 0.5 nm and less than or equal to 20 nm, preferably greater than or equal to 1 nm and less than or equal to 10 nm. The emission spectra are narrowed as the size distribution of quantum dots gets smaller, and thus light can be obtained with high color purity. The shape of quantum dots is not particularly limited and may be a spherical shape, a rod shape, a circular shape, or the like. A quantum rod, which is a rod-shaped quantum dot, has a function of emitting directional light.

There is no particular limitation on a material included in a fluorescent material, and an inorganic fluorescent material or an organic fluorescent material can be used. For example, a fluorescent material can contain a rare earth element, an alkali metal element, an alkaline earth metal element, other metal elements, a metalloid element, or the like. Moreover, a fluorescent material may contain oxygen, nitrogen, sulfur, carbon, hydrogen, or a halogen element, for example, as a nonmetallic element.

Examples of the inorganic fluorescent material include materials containing europium (Eu), cerium (Ce), yttrium (Y), aluminum (Al), barium (Ba), magnesium (Mg), calcium (Ca), zirconium (Zr), terbium (Tb), strontium (Sr), lutetium (Lu), praseodymium (Pr), gadolinium (Gd), silicon (Si), and the like.

Specifically, as a blue fluorescent material, it is possible to use, for example, $BaMgAl_{10}O_{17}:Eu^{2+}$, $CaMgSi_2O_6:Eu^{2+}$, $Ba_3MgSi_2O_8:Eu^{2+}$, or $Sr_{10}(PO_4)_6Cl_2:Eu^{2+}$.

As a greenish-blue or bluish-green fluorescent material, it is possible to use, for example, $Sr_4Si_3O_8Cl_4:Eu^{2+}$, $Sr_4Al_{14}O_{24}:Eu^{2+}$, $BaAl_8O_{13}:Eu^{2+}$, $Ba_2SiO_4:Eu^{2+}$, $BaZrSi_3O_9:Eu^{2+}$, $Ca_2YZr_2(AlO_4)_3:Ce^{3+}$, $Ca_2YHf_2(AlO_4)_3:Ce^{3+}$, or $Ca_2YZr_2(AlO_4)_3:Ce^{3+},Tb^{3+}$.

As a green fluorescent material, it is possible to use, for example, $(Ba,Sr)_2SiO_4:Eu^{2+}$, $Ca_8Mg(SiO_4)_4Cl_2:Eu^{2+}$, $Ca_8Mg(SiO_4)_4Cl_2:Eu^{2+},Mn^{2+}$, $BaMgAl_{10}O_{17}:Eu^{2+},Mn^{2+}$, $CeMgAl_{11}O_{19}:Mn^{2+}$, $Y_3Al_2(AlO_4)_3:Ce^{3+}$, $Lu_3Al_2(AlO_4)_3:Ce^{3+}$, $Y_3Ga_2(AlO_4)_3:Ce^{3+}$, $Ca_3Sc_2Si_3O_{12}:Ce^{3+}$, $CaSc_2O_4:Ce^{3+}$, $\beta\text{-}Si_3N_4:Eu^{2+}$, $SrSi_2O_2N_2:Eu^{2+}$, $Ba_3Si_6O_{12}N_2:Eu^{2+}$, $Sr_3Si_{13}Al_3O_2N_{21}:Eu^{2+}$, $YTbSi_4N_6C:Ce^{3+}$, $SrGa_2S_4:Eu^{2+}$, $Ca_2LaZr_2(AlO_4)_3:Ce^{3+}$, $Ca_2TbZr_2(AlO_4)_3:Ce^{3+}$, $Ca_2TbZr_2(AlO_4)_3:Ce^{3+},Pr^{3+}$, $Zn_2SiO_4:Mn^{2+}$, $MgGa_2O_4:Mn^{2+}$, $LaPO_4:Ce^{3+},Tb^{3+}$, $Y_2SiO_4:Ce^{3+}$, $CeMgAl_{11}O_{19}:Tb^{3+}$, or $GdMgB_5O_{10}:Ce^{3+},Tb^{3+}$.

As a yellow or orange fluorescent material, it is possible to use, for example, $(Sr,Ba)_2SiO_4:Eu^{2+}$, $(Y,Gd)_3Al_5O_{12}:Ce^{3+}$, $\alpha$-Ca—SiAlON:$Eu^{2+}$, $Y_2Si_4N_6C:Ce^{3+}$, $La_3Si_6N_{11}:Ce^{3+}$, or $Y_3MgAl(AlO_4)_2(SiO_4):Ce^{3+}$. As a red fluorescent material, it is possible to use, for example, $Sr_2Si_5N_8:Eu^{2+}$, $CaAlSiN_3:Eu^{2+}$, $SrAlSi_4N_7:Eu^{2+}$, $CaS:Eu^{2+}$, $La_2O_2S:Eu^{3+}$, $Y_3Mg_2(AlO_4)(SiO_4)_2:Ce^{3+}$, $Y_2O_3:Eu^{3+}$, $Y_2O_2S:Eu^{3+}$, $Y(P,V)O_4:Eu^{3+}$, $YVO_4:Eu^{3+}$, $3.5MgO\cdot0.5MgF_2\cdot GeO_2:Mn^{4+}$, $K_2SiF_6:Mn^{4+}$, or $GdMgB_5O_{10}:Ce^{3+},Mn^{2+}$.

As the organic fluorescent material, the materials given below can be used.

Examples of red fluorescent materials include anions of a Brønsted acid and the like, β-diketonate, β-diketone, and a rare earth ion complex having an aromatic carboxylic acid as a ligand. Other examples include a perylene-based pigment (e.g., dibenzo{[f,f']-4,4',7,7'-tetraphenyl}diindeno[1,2,3-cd:1',2',3'-lm]perylene), an anthraquinone-based pigment, a lake-based pigment, an azo-based pigment, a quinacridone-based pigment, an anthracene-based pigment, an isoindoline-based pigment, an isoindolinone-based pigment, a phthalocyanine-based pigment, a triphenylmethane-based basic pigment, an indanthrone-based pigment, an indophenol-based pigment, a cyanine-based pigment, and a dioxazine-based pigment.

Examples of green fluorescent materials include a pyridine-phthalimide fused derivative; benzoxazinone-based, quinazolinone-based, coumarin-based, quinophthalone-based, and naphthalic acid imide-based fluorescent pigments; and a terbium complex having hexyl salicylate as a ligand.

Examples of blue fluorescent materials include fluorescent pigments of naphthalic acid imide-based, benzoxazole-based, styryl-based, coumarin-based, pyrazoline-based, and triazole-based compounds and a thulium complex.

Note that any of the above fluorescent materials may be used alone, or two or more kinds of the fluorescent materials may be used in an appropriate combination with an appropriate ratio. Combining the above fluorescent materials enables various colors such as white, cyan, magenta, and yellow to be exhibited.

The adjacent color conversion layers 129 preferably include an overlapping region. Specifically, one color conversion layer 129 in a region not overlapping the light-emitting device 130 preferably includes a region overlapping the adjacent color conversion layer 129. When the color conversion layers 129 that transmit light of different colors overlap, the color conversion layers 129 in a region where they overlap can function as light-blocking layers. Thus, light emitted from the light-emitting device 130 can be prevented from leaking to an adjacent subpixel. For example, light emitted from the light-emitting device 130*a*, which is overlapped by the color conversion layer 129*a*, can be prevented from entering the color conversion layer 129*b*. Consequently, the contrast of images displayed on the display apparatus can be increased, and the display apparatus can have high display quality.

Note that the adjacent color conversion layers 129 may include no overlapping region. In the case where the adjacent color conversion layers 129 have no overlapping region, a light-blocking layer is preferably provided in a region where the color conversion layer 129 and the light-emitting device 130 do not overlap. The light-blocking layer can be provided on a surface of the substrate 120 on the resin layer 122 side, for example. Furthermore, the color conversion layer 129 may be provided on the surface of the substrate 120 on the resin layer 122 side.

When the color conversion layers 129 are formed over the protective layer 132, the light-emitting devices 130 and the color conversion layers 129 of the respective colors are aligned with each other more easily than in the case where the color conversion layers 129 are formed over the substrate 120; hence, a ultrahigh-definition display apparatus can be achieved.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

In this specification and the like, a light-emitting device capable of emitting blue light may be referred to as a blue light-emitting device. Combining blue light-emitting devices with color conversion layers (e.g., quantum dots) as described above enables a full-color display apparatus.

Structures of light-emitting devices can be classified roughly into a single structure and a tandem structure. A light-emitting device with a single structure includes one light-emitting unit between a pair of electrodes, and the light-emitting unit preferably includes one or more light-emitting layers. To obtain blue light emission, one or more light-emitting layers that emit blue light may be provided, or a plurality of light-emitting layers that emit light other than blue light may be stacked such that the light-emitting device as a whole emits blue light. Alternatively, one or more light-emitting layers that emit blue light and a plurality of light-emitting layers that emit light other than blue light may be stacked such that the light-emitting device as a whole emits blue light.

A light-emitting device with a tandem structure includes a plurality of light-emitting units between a pair of electrode, and each light-emitting unit preferably includes one or more light-emitting layers. Blue light emission is obtained by combining light from the light-emitting layers in the plurality of light-emitting units. Note that a structure for obtaining blue light emission is similar to that in the case of a single structure. In the light-emitting device with a tandem structure, an intermediate layer such as a charge-generation layer is preferably provided between the plurality of light-emitting units.

The aforementioned blue light-emitting device (with a single structure or a tandem structure) is preferable because its manufacturing process is simpler than a structure in which light-emitting devices of different colors are separately formed (hereinafter sometimes referred to as a side-by-side (SBS) structure), and thus lower manufacturing cost or a higher manufacturing yield is achieved.

In the display apparatus of this embodiment, the distance between the light-emitting devices can be narrowed. Specifically, the distance between the light-emitting devices, the distance between the EL layers, or the distance between the pixel electrodes can be less than 10 μm, 5 μm or less, 3 μm or less, 2 μm or less, 1 μm or less, 500 nm or less, 200 nm or less, 100 nm or less, 90 nm or less, 70 nm or less, 50 nm or less, 30 nm or less, 20 nm or less, 15 nm or less, or 10 nm or less. In other words, the display apparatus includes a region where the distance between the side surface of the first layer 113*a* and the side surface of the second layer 113*b* or the distance between the side surface of the second layer 113*b* and the side surface of the third layer 113*c* is 1 μm or less, preferably 0.5 μm (500 nm) or less, further preferably 100 nm or less.

A light-blocking layer may be provided on the surface of the substrate 120 on the resin layer 122 side. Moreover, a variety of optical members can be provided on the outer side of the substrate 120 (the surface opposite to the resin layer 122). Examples of optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be provided on the outer surface of the substrate 120.

For the substrate 120, glass, quartz, ceramic, sapphire, a resin, a metal, an alloy, a semiconductor, or the like can be used. The substrate on the side from which light from the light-emitting device is extracted is formed using a material that transmits the light. When a flexible material is used for the substrate 120, the flexibility of the display apparatus can be increased. Furthermore, a polarizing plate may be used as the substrate 120.

For the substrate 120, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used as the substrate 120.

In the case where a circularly polarizing plate overlaps the display apparatus, a highly optically isotropic substrate is preferably used as the substrate included in the display apparatus. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of films having high optical isotropy include a triacetyl cellulose (TAC, also referred to as cellulose triacetate) film, a cycloolefin polymer (COP) film, a cycloolefin copolymer (COC) film, and an acrylic film.

When a film used as the substrate absorbs water, the shape of the display panel might be changed, e.g., creases might be caused. Thus, as the substrate, a film with a low water absorption rate is preferably used. For example, the water absorption rate of the film is preferably 1% or lower, further preferably 0.1% or lower, still further preferably 0.01% or lower.

For the resin layer 122, a variety of curable adhesives such as a photocurable adhesive like an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As materials for a gate electrode, a source electrode, and a drain electrode of a transistor and conductive layers functioning as wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used, for example. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, stacked films of any of the above materials can be used for the conductive layers. For example, stacked films of indium tin oxide and an alloy of silver and magnesium are preferably used, in which case the conductivity can be increased. These materials can also be used for conductive layers such as wirings and electrodes included in the display apparatus, and conductive layers (e.g., a conductive layer functioning as the pixel electrode or the common electrode) included in the light-emitting device.

Examples of insulating materials that can be used for insulating layers include resins such as an acrylic resin and an epoxy resin, and inorganic insulating materials such as silicon oxide, silicon oxynitride, silicon nitride oxide, silicon nitride, and aluminum oxide.

Next, variation examples of the cross-sectional shape of the display apparatus 100 will be described with reference to FIGS. 2A and 2B and FIGS. 3A to 3C.

Figure 2A:
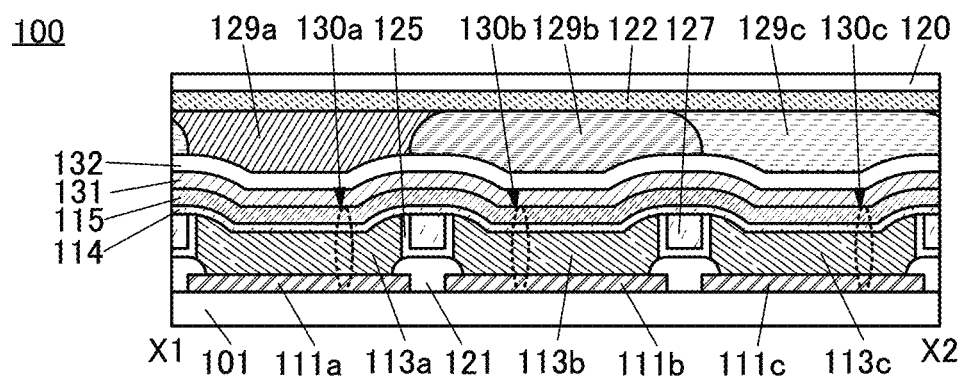
FIGS. 2A and 2B are cross-sectional views illustrating examples of a display apparatus.

As illustrated in FIG. 2A, color conversion layers 129a, 129b, and 129c that have a function of converting light into light of different colors may be provided over the respective light-emitting devices 130a, 130b, and 130c to form the subpixels 110a, 110b, and 110c that emit light of different colors.

For example, the color conversion layer 129a can convert blue light emitted from the light-emitting device 130a into yellow (Y) light, the color conversion layer 129b can convert blue light emitted from the light-emitting device 130b into cyan (C) light, and the color conversion layer 129c can convert blue light emitted from the light-emitting device 130c into magenta (M) light. Note that one embodiment of the present invention is not limited thereto, and the subpixels 110a, 110b, and 110c may exhibit three colors of red (R), green (G), and blue (B). When the subpixel 110c emits blue light, extracting blue light emitted from the light-emitting device 130c to the outside through the color conversion layer 129c allows vivid blue light with a small half width of the emission spectrum to be emitted from the subpixel, as compared to the case where the subpixel 110c does not include the color conversion layer 129c.

Figure 2B:
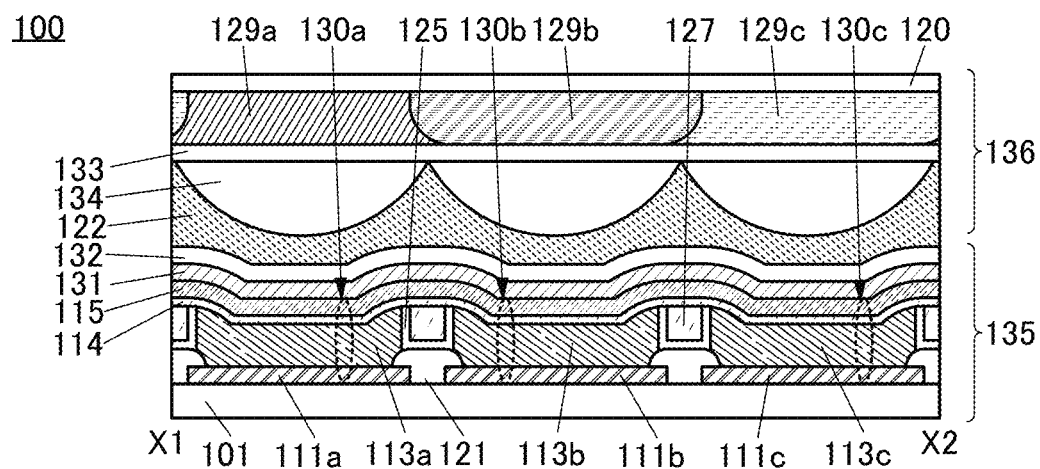

As illustrated in FIG. 2B, microlenses 134 may be provided in the display apparatus 100. Here, the display apparatus 100 in FIG. 2B includes a first substrate 135 and a second substrate 136. The first substrate 135 includes the layer 101, the pixel electrodes 111a, 111b, and 111c, the first layer 113a, the second layer 113b, the third layer 113c, the fifth layer 114, the common electrode 115, the protective layers 131 and 132, and the insulating layers 121, 125, and 127. The second substrate 136 includes the substrate 120, the color conversion layers 129a, 129b, and 129c, an insulating layer 133, and the microlenses 134.

In the second substrate 136, the color conversion layer 129 is provided over the substrate 120, the insulating layer 133 is provided over the color conversion layer 129, and the microlens 134 is provided over the insulating layer 133. The microlens 134 and the color conversion layer 129 are arranged so as to overlap the corresponding light-emitting device 130.

A resin, glass, or the like that has a high visible-light-transmitting property can be used for the microlens 134. The microlens 134 may be formed separately in each subpixel or may be integrated in a plurality of subpixels. Providing the microlenses 134 makes it possible to collect light emitted from the light-emitting devices 130 and improve the efficiency of extracting light from the display apparatus 100.

As the insulating layer 133, an inorganic insulating film or an organic insulating film that can be used as the protective layers 131 and 132 is used. The insulating layer 133 preferably functions as a planarization film, in which case an organic insulating film is preferably used as the insulating layer 133. Alternatively, a structure where the insulating layer 133 is not provided may be employed.

As illustrated in FIG. 2B, the display apparatus 100 can be formed by attaching the first substrate 135 and the second substrate 136 with the resin layer 122.

Figure 3A:
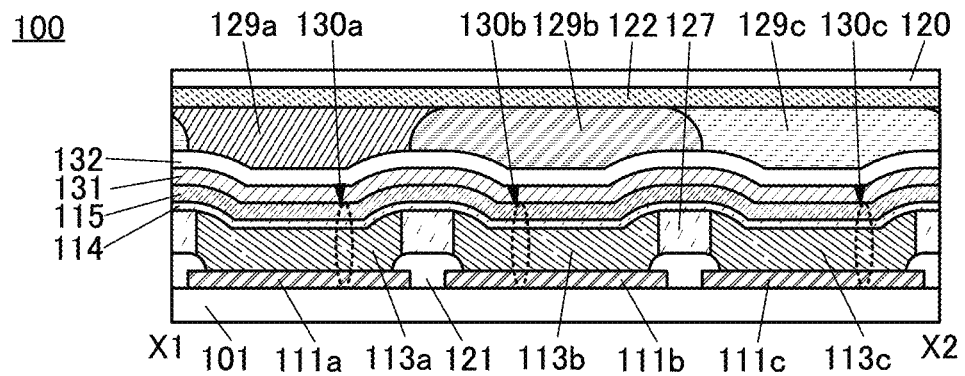
FIGS. 3A to 3C are cross-sectional views illustrating examples of a display apparatus.

Although FIG. 1B illustrates the structure where the insulating layer 125 is provided, the present invention is not limited thereto, and a structure where the insulating layer 125 is not provided as illustrated in FIG. 3A may be employed. In this case, the bottom surface of the insulating layer 127 is in contact with the top surface of the insulating layer 121. The insulating layer 127 is preferably formed using an organic material that causes less damage to the first layer 113a, the second layer 113b, and the third layer 113c. For example, the insulating layer 127 is preferably formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin.

In FIG. 1B, the height of the top surface of the insulating layer 125 and the height of the top surface of the insulating layer 127 are each equal to or substantially equal to the height of the top surface of at least one of the first layer 113a, the second layer 113b, and the third layer 113c; however, the present invention is not limited thereto. For example, as illustrated in FIG. 3B, the height of the top surface of the insulating layer 125 and the height of the top surface of the insulating layer 127 may be greater than those of the top surfaces of the first layer 113a, the second layer 113b, and the third layer 113c.

Figure 3B:
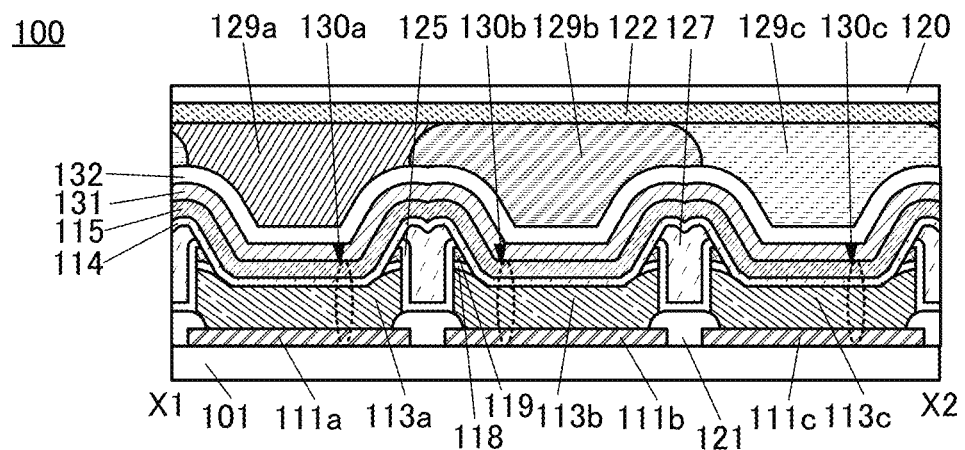

As illustrated in FIG. 3B, one or both of a first sacrificial layer 118 and a second sacrificial layer 119 may be formed over the first layer 113a, the second layer 113b, or the third layer 113c. For example, the first sacrificial layer 118 is formed over the top surfaces of the first layer 113a, the second layer 113b, and the third layer 113c, and the second sacrificial layer 119 is formed over the first sacrificial layer 118. One side surface of the first sacrificial layer 118 and one side surface of the second sacrificial layer 119 are in contact with the insulating layer 125. The other side surface of the first sacrificial layer 118 and the other side surface of the second sacrificial layer 119 are in contact with the fifth layer 114. Note that the first sacrificial layer 118 and the second sacrificial layer 119 are sacrificial layers used in the process of manufacturing the display apparatus 100 and will be described later in detail.

Here, a plane formed by the side surface of the first sacrificial layer 118, the side surface of the second sacrificial layer 119, part of the side surface of the insulating layer 125, and part of the side surface of the insulating layer 127 (a plane in contact with the fifth layer 114) preferably forms a taper angle in the cross-sectional view. When the plane forms a taper angle in the cross-sectional view, the fifth layer 114 and the common electrode 115, which cover the first sacrificial layer 118, the second sacrificial layer 119, the insulating layer 125, and the insulating layer 127, are formed with good coverage; hence, disconnection or the like can be prevented from occurring in the fifth layer 114 and the common electrode 115.

Figure 3C:
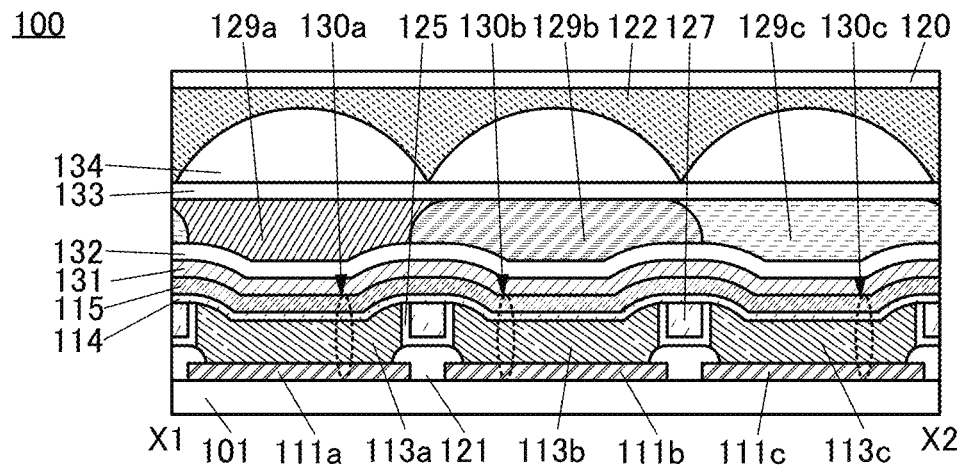

Although the microlenses 134 are provided on the substrate 120 side in FIG. 2B, the present invention is not limited thereto. For example, the microlenses 134 may be provided on the layer 101 side as illustrated in FIG. 3C. In this case, the insulating layer 133 is provided over the color conversion layers 129, and the microlenses 134 are provided over the insulating layer 133. The substrate 120 is attached above the microlenses 134 with the resin layer 122 provided over the microlenses 134.

Figure 4A:
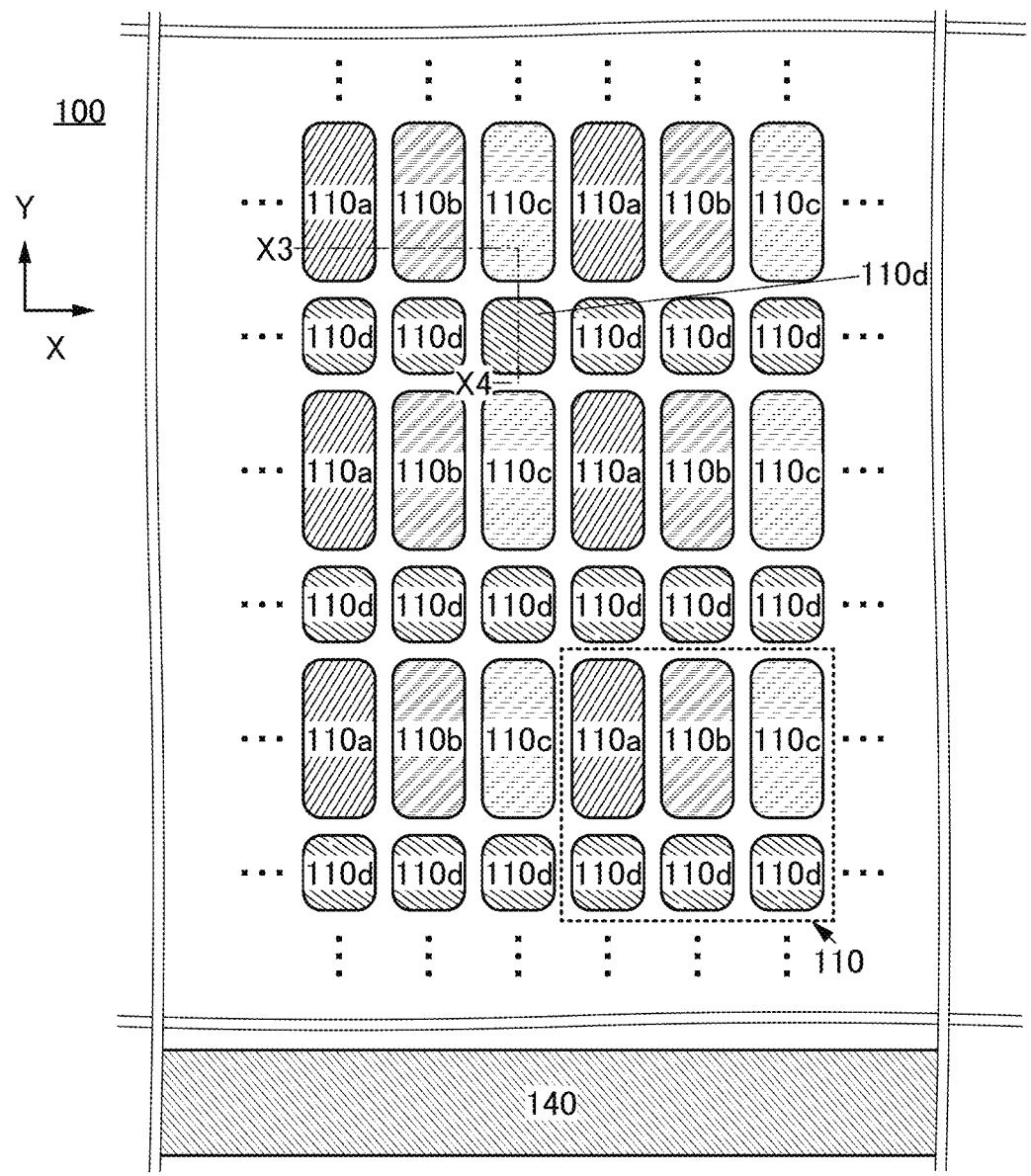
FIG. 4A is a top view illustrating an example of a display apparatus.
Figure 4B:
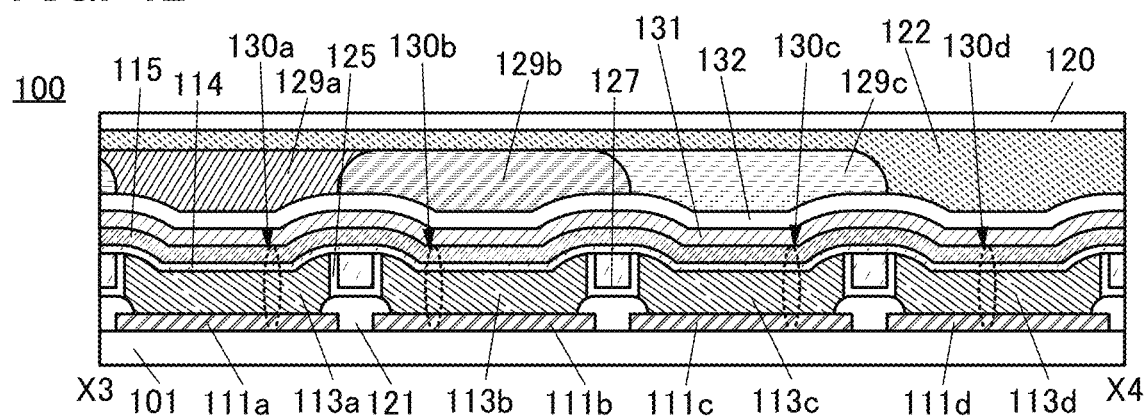
FIG. 4B is a cross-sectional view illustrating an example of the display apparatus.

Note that the display apparatus of one embodiment of the present invention is not limited to having the structure in which subpixels of three colors express one color. For example, the display apparatus may employ a structure in which subpixels of four colors of red (R), green (G), blue (B), and white (W) express one color. FIGS. 4A and 4B illustrate an example where a pixel is composed of four types of subpixels.

As illustrated in FIG. 4A, the pixel can include four types of subpixels.

FIG. 4A is a top view of the display apparatus 100. The display apparatus 100 includes a display portion in which a plurality of pixels 110 are arranged in a matrix, and the connection portion 140 placed outside the display portion.

The pixel 110 illustrated in FIG. 4A is composed of four types of subpixels 110a, 110b, 110c, and 110d.

For example, the subpixels 110a, 110b, 110c, and 110d can emit light of different colors. Like the subpixels 110a, 110b, and 110c, the subpixel 110d includes a light-emitting device 130d that emits blue light. For example, the subpixel 110a includes the color conversion layer 129a capable of converting blue light into red light; the subpixel 110b includes the color conversion layer 129b capable of converting blue light into green light; the subpixel 110c includes the color conversion layer 129c capable of converting blue light into white light, and the subpixel 110d does not include a color conversion layer. With this structure, the subpixels 110a, 110b, and 110c can be red, green, and white subpixels, respectively, and the subpixel 110d can be a blue subpixel.

FIG. 4A illustrates an example in which one pixel 110 consists of two rows and three columns. The pixel 110 includes three subpixels (the subpixels 110a, 110b, and 110c) in the upper row (first row) and three subpixels 110d in the lower row (second row). In other words, the pixel 110 includes the subpixel 110a and the subpixel 110d in the left column (first column), the subpixel 110b and another subpixel 110d in the center column (second column), and the subpixel 110c and another subpixel 110d in the right column (third column). Matching the positions of the subpixels in the upper row and the lower row as illustrated in FIG. 4A enables dust and the like that would be produced in the manufacturing process to be removed efficiently. Thus, a display apparatus having high display quality can be provided.

FIG. 4B is a cross-sectional view along the dashed-dotted line X3-X4 in FIG. 4A. The structure illustrated in FIG. 4B is the same as that in FIG. 1B except that the light-emitting device 130d is provided. Therefore, the description of portions similar to those in FIG. 1B is omitted.

As illustrated in FIG. 4B, the display apparatus 100 includes the light-emitting devices 130a, 130b, 130c, and 130d over the layer 101, and the protective layers 131 and 132 provided to cover these light-emitting devices. The substrate 120 is attached above the protective layer 132 with the resin layer 122. The insulating layers 125 and 127 are provided in a region between the adjacent light-emitting devices. The insulating layers 125 and 127 are provided over the insulating layer 121.

The light-emitting devices 130a, 130b, 130c, and 130d emit blue light. The color conversion layer 129a is provided to overlap the light-emitting device 130a, the color conversion layer 129b is provided to overlap the light-emitting device 130b, and the color conversion layer 129c is provided to overlap the light-emitting device 130c. A color conversion layer is not provided over the light-emitting device 130d. For example, when the color conversion layer 129a converts blue light into red (R) light, the color conversion layer 129b converts blue light into green (G) light, and the color conversion layer 129c converts blue light into white (W) light, it is possible to achieve a combination of subpixels that emit light of four colors, i.e., red (R) light, green (G) light, blue (B) light, and white (W) light.

The light-emitting device 130d includes a pixel electrode 111d over the layer 101, an island-shaped fourth layer 113d over the pixel electrode 111d, the fifth layer 114 over the island-shaped fourth layer 113d, and the common electrode 115 over the fifth layer 114. In the light-emitting device 130d, the fourth layer 113d and the fifth layer 114 can be collectively referred to as an EL layer. The pixel electrode 111d is formed using a material similar to that for the pixel electrodes 111a, 111b, and 111c. The fourth layer 113d is formed using a material similar to that for the first layer 113a, the second layer 113b, and the third layer 113c.

The three subpixels 110d in the pixel 110 may each independently include the light-emitting device 130d or may share one light-emitting device 130d. That is, the pixel 110 may include one light-emitting device 130d or three light-emitting devices 130d.

[Pixel Layout]

Next, pixel layouts different from those in FIG. 1A and FIG. 4A will be described. There is no particular limitation on the arrangement of subpixels, and a variety of methods can be employed. Examples of the arrangement of subpixels include stripe arrangement, S-stripe arrangement, matrix arrangement, delta arrangement, Bayer arrangement, and pentile arrangement.

Examples of a top surface shape of the subpixel include polygons such as a triangle, a tetragon (including a rectangle and a square), and a pentagon; polygons with rounded corners; an ellipse; and a circle. Here, a top surface shape of the subpixel corresponds to a top surface shape of a light-emitting region of the light-emitting device.

Figure 5A:
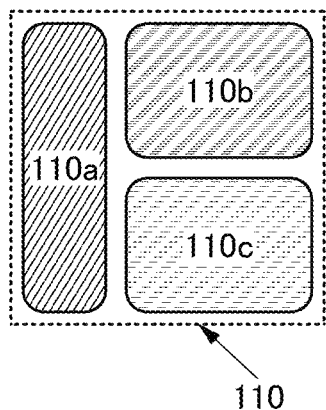
FIGS. 5A to 5F are top views illustrating examples of pixels.

The pixel 110 illustrated in FIG. 5A employs S-stripe arrangement. The pixel 110 in FIG. 5A consists of three subpixels 110a, 110b, and 110c. For example, the subpixel 110a may be a blue subpixel B, the subpixel 110b may be a red subpixel R, and the subpixel 110c may be a green subpixel G.

Figure 5B:
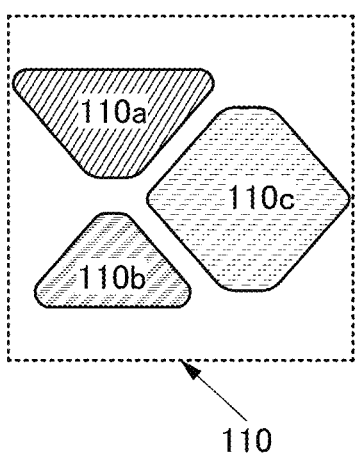

The pixel 110 illustrated in FIG. 5B includes the subpixel 110a whose top surface has a rough trapezoidal shape with rounded corners, the subpixel 110b whose top surface has a rough triangle shape with rounded corners, and the subpixel 110c whose top surface has a rough tetragonal or rough hexagonal shape with rounded corners. The subpixel 110a has a larger light-emitting area than the subpixel 110b. In this manner, the shapes and sizes of the subpixels can be determined independently. For example, the size of a subpixel including a light-emitting device with higher reliability can be smaller. For example, the subpixel 110a may be a green subpixel G, the subpixel 110b may be a red subpixel R, and the subpixel 110c may be a blue subpixel B.

Figure 5C:
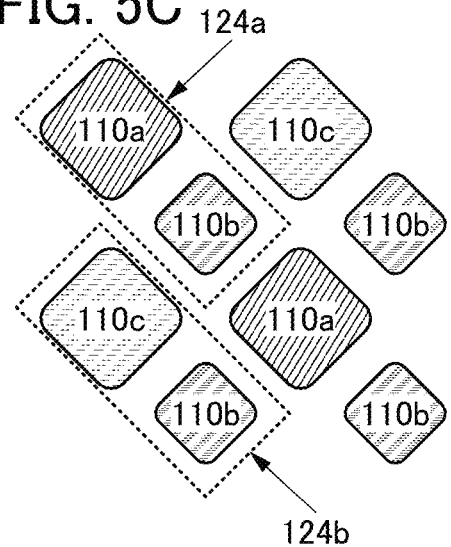

Pixels 124a and 124b illustrated in FIG. 5C employ pentile arrangement. FIG. 5C illustrates an example in which the pixels 124a including the subpixels 110a and 110b and the pixels 124b including the subpixels 110b and 110c are alternately arranged. For example, the subpixel 110a may be a red subpixel R, the subpixel 110b may be a green subpixel G, and the subpixel 110c may be a blue subpixel B.

Figure 5D:
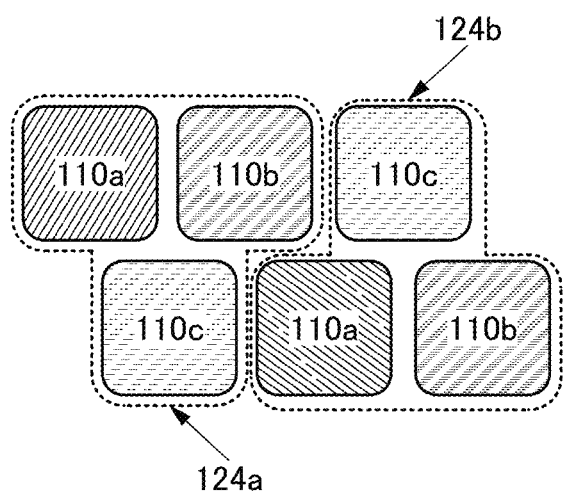
Figure 5E:
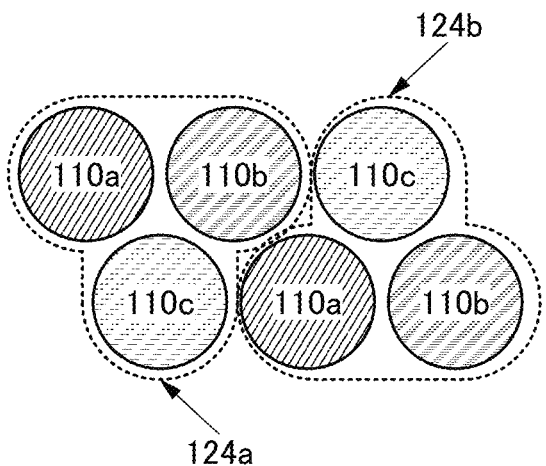

The pixels 124a and 124b illustrated in FIGS. 5D and 5E employ delta arrangement. The pixel 124a includes two subpixels (the subpixels 110a and 110b) in the upper row (first row) and one subpixel (the subpixel 110c) in the lower row (second row). The pixel 124b includes one subpixel (the subpixel 110c) in the upper row (first row) and two subpixels (the subpixels 110a and 110b) in the lower row (second row). For example, the subpixel 110a may be a red subpixel R, the subpixel 110b may be a green subpixel G, and the subpixel 110c may be a blue subpixel B.

FIG. 5D shows an example where the top surface of each subpixel has a rough tetragonal shape with rounded corners, and FIG. 5E shows an example where the top surface of each subpixel is circular.

Figure 5F:
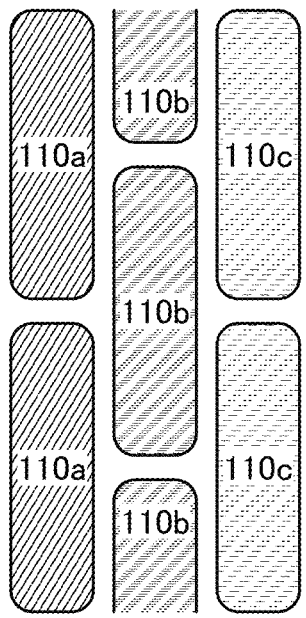

FIG. 5F shows an example where subpixels of different colors are arranged in a zigzag manner. Specifically, the positions of the top sides of two subpixels arranged in the column direction (e.g., the subpixel 110a and the subpixel 110b or the subpixel 110b and the subpixel 110c) are not aligned in the top view. For example, the subpixel 110a may be a red subpixel R, the subpixel 110b may be a green subpixel G, and the subpixel 110c may be a blue subpixel B.

In a photolithography method, as a pattern to be processed becomes finer, the influence of light diffraction becomes more difficult to ignore; therefore, the fidelity in transferring a photomask pattern by light exposure is degraded, and it becomes difficult to process a resist mask into a desired shape. Thus, a pattern with rounded corners is likely to be formed even with a rectangular photomask pattern. Consequently, the top surface of a subpixel can have a polygonal shape with rounded corners, an elliptical shape, a circular shape, or the like.

Furthermore, in the method for manufacturing the display apparatus of one embodiment of the present invention, the EL layer is processed into an island shape with the use of a resist mask. A resist film formed over the EL layer needs to be cured at a temperature lower than the upper temperature limit of the EL layer. Therefore, the resist film is insufficiently cured in some cases depending on the upper temperature limit of the material of the EL layer and the curing temperature of the resist material. An insufficiently cured resist film may have a shape different from a desired shape by processing. As a result, the top surface of the EL layer may have a polygonal shape with rounded corners, an elliptical shape, a circular shape, or the like. For example, when a resist mask with a square top surface is intended to be formed, a resist mask with a circular top surface may be formed, and the top surface of the EL layer may be circular.

To obtain a desired top surface shape of the EL layer, a technique of correcting a mask pattern in advance so that a transferred pattern agrees with a design pattern (an optical proximity correction (OPC) technique) may be used. Specifically, with the OPC technique, a pattern for correction is added to a corner portion or the like of a figure on a mask pattern.

An electronic device including the display apparatus of one embodiment of the present invention can have one or both of a flashlight function using subpixels W and a lighting function using the subpixels W.

Here, white light emitted from the subpixel W may be light that instantaneously has high luminance, such as light emitted from a flashlight or a strobe light, or may be light with high rendering properties, such as light emitted from a reading light. In the case where white light is used for a reading light or the like, the color temperature of white light is set low. For example, when white light is made to have incandescent light color (e.g., higher than or equal to 2500 K and lower than 3250 K) or warm white (higher than or equal to 3250 K and lower than 3800 K), a light source that is easy on the user's eyes can be obtained.

A strobe light function can be obtained, for example, by repetition of light emission and non-light emission at short intervals. A flashlight function can be obtained, for example, with a structure where flash of light is caused by instantaneous discharge using principles of an electric double layer.

Figure 6A:
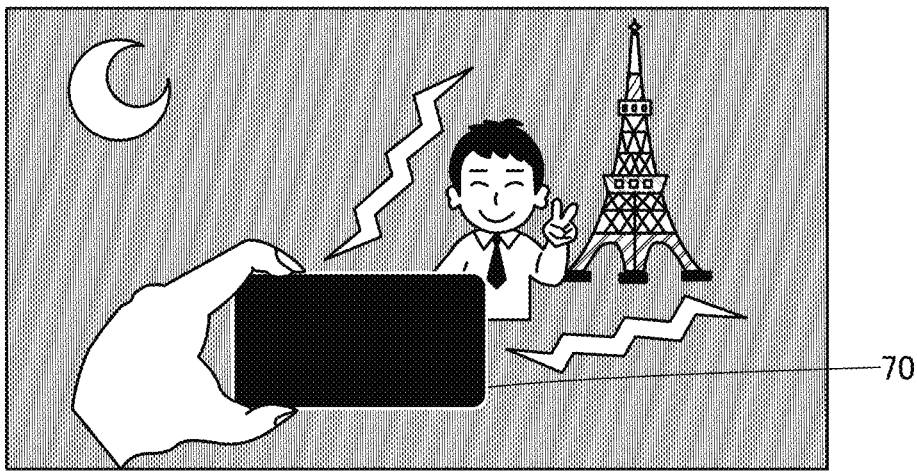
FIGS. 6A to 6C are schematic diagrams illustrating examples of an electronic device.

For example, when an electronic device 70 has a camera function, the electronic device 70 can take images at night by using a strobe light function or a flashlight function, as illustrated in FIG. 6A. Here, the display apparatus 100 provided in the electronic device 70 functions as a planar light source, so that a subject is less likely to be shadowed; thus, a clear image can be taken. Note that a strobe light function or a flashlight function can be used in any environment including night. In the case where the electronic device 70 has a strobe light function or a flashlight function, the color temperature of white light can be set high. For example, the color temperature of light emitted from the electronic device 70 can be set to white (higher than or equal to 3800 K and lower than 4500 K), neutral white (higher than or equal to 4500 K and lower than 5500 K), or daylight white (higher than or equal to 5500 K and lower than 7100 K).

When the intensity of light from a flash is excessively high, portions that originally have different brightnesses might be uniformly white in an image (i.e., blown-out highlights). On the other hand, when the intensity of light from a flash is too low, dark portions might be uniformly black in an image (i.e., blocked up shadows). In view of the above, a light-receiving device (also referred to as a light-receiving element) included in the display apparatus may sense brightness around a subject, whereby the amount of light from the light-emitting device included in the subpixel can be adjusted to be optimal. That is, the electronic device 70 can be regarded as having a function of an exposure meter.

Figure 6B:
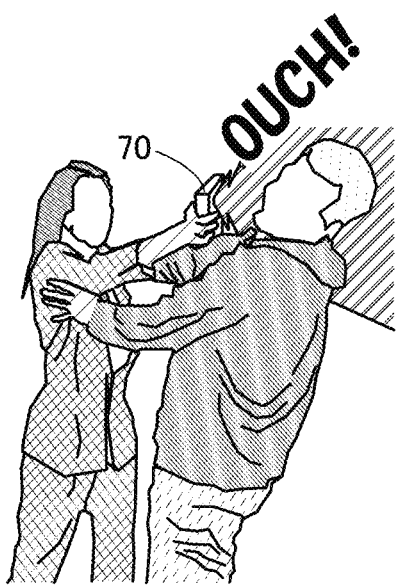

A strobe light function and a flashlight function can be used for crime prevention, self-defense, or the like. For example, as illustrated in FIG. 6B, making the electronic device 70 emit light toward an attacker can hold back the attacker. In case of emergency such as an attack, it is sometimes difficult to deal with the attacker calmly and aim light from a self-defense light with a narrow illuminating range at the face of the attacker. Meanwhile, since the display apparatus 100 of the electronic device 70 is a planar light source, the attacker will see light emitted from the display apparatus 100 even when the display apparatus 100 does not point directly to the eyes of the attacker.

Note that in the case where the display apparatus 100 provided in the electronic device 70 functions as a flashlight for crime prevention or self-defense as illustrated in FIG. 6B, the luminance is preferably made higher than that in the case of taking images at night in FIG. 6A. Making the display apparatus 100 emit light intermittently a plurality of times can more easily hold back an attacker. Furthermore, the electronic device 70 may emit a sound, such as a buzzer sound with a relatively large volume, to ask for help from nearby people. When a sound is emitted around the face of an attacker, not only light but also a sound can hold back the attacker, which is preferable.

To improve the color-rendering properties of light from the light-emitting device included in the subpixel W, it is preferable to increase the number of light-emitting layers included in the light-emitting device or the number of kinds of light-emitting substances contained in the light-emitting layer. Accordingly, a board light emission spectrum having intensities in a wider wavelength range can be obtained; thus, light that is close to sunlight and has higher color-rendering properties can be emitted.

Figure 6C:
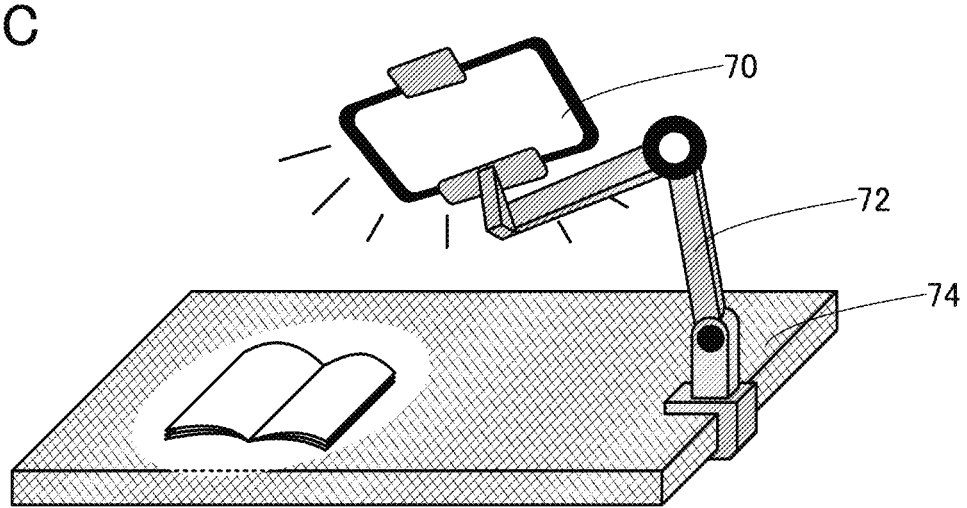

For example, the electronic device 70 that can emit light with high color-rendering properties may be used as a reading light or the like as illustrated in FIG. 6C. In FIG. 6C, the electronic device 70 is fixed to a desk 74 with a support 72. The use of the support 72 enables the electronic device 70 to be used as a reading light. Since the display apparatus 100 provided in the electronic device 70 functions as a planar light source, an object (a book in FIG. 6C) is less likely to be shadowed, and light is less likely to be projected on the object because light reflected by the object is distributed broadly. This increases visibility of the object and makes the object easy to see or read. In addition, the emission spectrum of the light-emitting device that emits white light is broad; hence, "blue light" (high-energy visible light) is relatively reduced. Thus, eye fatigue and the like of the user of the electronic device 70 can be reduced.

Note that the structure of the support 72 is not limited to that illustrated in FIG. 6C. An arm, a movable portion, or the like can be provided as appropriate so that the range of motion increases as much as possible. In FIG. 6C, the support 72 holds the electronic device 70 to put the electronic device 70 between its parts; however, the present invention is not limited thereto. For example, a magnet, a suction cup, or the like may be used as appropriate.

There is no particular limitation on emission colors for the above-described lighting application; the practitioner can appropriately select one or more optimal emission colors from white, blue, violet, bluish violet, green, yellowish green, yellow, orange, red, and the like.

The display apparatus of one embodiment of the present invention may include a light-receiving device in the pixel.

[Example of Method for Manufacturing Display Apparatus]

Figure 7A:
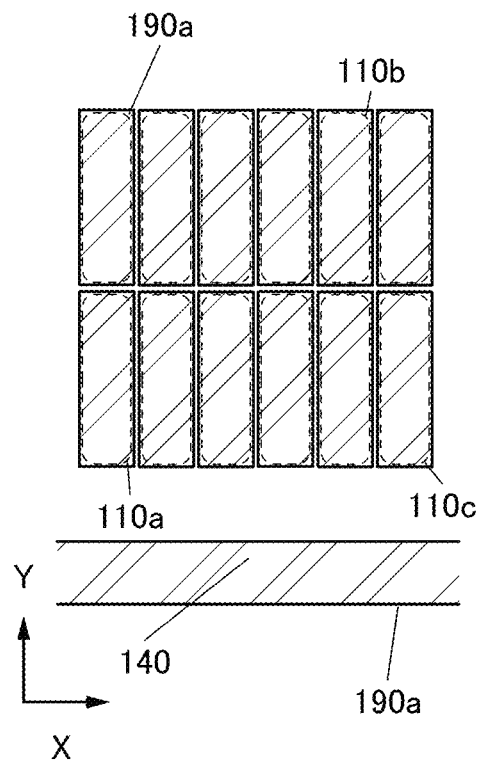
FIGS. 7A and 7B are top views illustrating an example of a method for manufacturing a display apparatus.
Figure 7B:
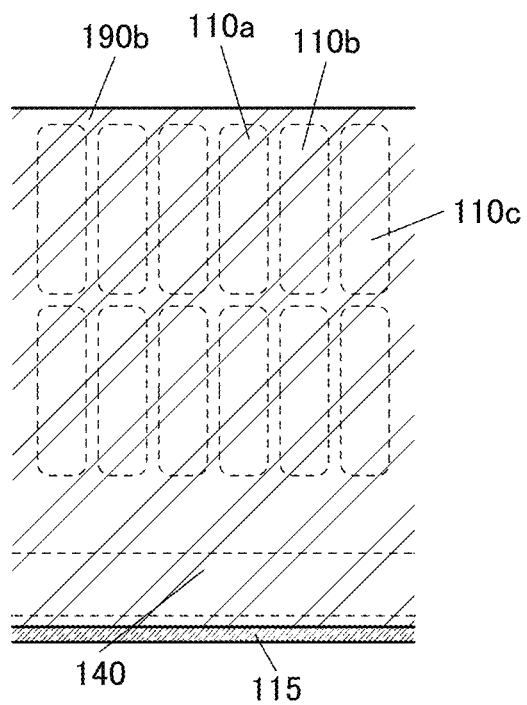

Next, an example of a method for manufacturing the display apparatus will be described with reference to FIGS. 7A and 7B to FIGS. 13A to 13F. FIGS. 7A and 7B are top views illustrating a method for manufacturing the display apparatus. FIGS. 8A to 8C each illustrate a cross section along the dashed-dotted line X1-X2 and a cross section along the dashed-dotted line Y1-Y2 in FIG. 1A side by side. FIGS. 9A to 9C to FIGS. 12A to 12C are similar to FIGS. 8A to 8C. FIGS. 13A to 13F are enlarged views each illustrating a cross-sectional structure of and around the insulating layer 127.

Thin films included in the display apparatus (e.g., insulating films, semiconductor films, and conductive films) can be formed by a sputtering method, a CVD method, a vacuum evaporation method, a PLD method, an ALD method, or the like. Examples of a CVD method include a PECVD method and a thermal CVD method. An example of a thermal CVD method is a metal organic CVD (MOCVD) method.

Alternatively, thin films included in the display apparatus (e.g., insulating films, semiconductor films, and conductive films) can be formed by a method such as spin coating, dipping, spray coating, ink-jetting, dispensing, screen printing, or offset printing or with a doctor knife, a slit coater, a roll coater, a curtain coater, or a knife coater.

Specifically, for fabrication of the light-emitting device, a vacuum process such as an evaporation method and a solution process such as a spin coating method or an inkjet method can be used. Examples of an evaporation method include physical vapor deposition methods (PVD methods) such as a sputtering method, an ion plating method, an ion beam evaporation method, a molecular beam evaporation method, and a vacuum evaporation method, and a chemical vapor deposition method (CVD method). Specifically, functional layers (e.g., a hole-injection layer, a hole-transport layer, a light-emitting layer, an electron-transport layer, an electron-injection layer, a hole-blocking layer, and an electron-blocking layer) included in the EL layer can be formed by an evaporation method (e.g., a vacuum evaporation method), a coating method (e.g., a dip coating method, a die coating method, a bar coating method, a spin coating method, or a spray coating method), a printing method (e.g., an inkjet method, screen printing (stencil), offset printing (planography), flexography (relief printing), gravure printing, or micro-contact printing), or the like.

Thin films included in the display apparatus can be processed by a photolithography method or the like. Alternatively, thin films may be processed by a nanoimprinting method, a sandblasting method, a lift-off method, or the like. Alternatively, island-shaped thin films may be directly formed by a film formation method using a shielding mask such as a metal mask.

There are two typical examples of photolithography methods. In one of the methods, a resist mask is formed over a thin film that is to be processed, the thin film is processed by etching or the like, and then the resist mask is removed. In the other method, a photosensitive thin film is formed and then processed into a desired shape by light exposure and development.

As light for exposure in a photolithography method, it is possible to use light with the i-line (wavelength: 365 nm), light with the g-line (wavelength: 436 nm), light with the h-line (wavelength: 405 nm), or light in which the i-line, the g-line, and the h-line are mixed. Alternatively, ultraviolet light, KrF laser light, ArF laser light, or the like can be used. Exposure may be performed by liquid immersion exposure technique. As the light for exposure, extreme ultraviolet (EUV) light or X-rays may also be used. Furthermore, instead of the light used for the exposure, an electron beam can also be used. It is preferable to use EUV light, X-rays, or an electron beam because they can perform extremely minute processing. Note that a photomask is not needed when exposure is performed by scanning with a beam such as an electron beam.

For etching of thin films, a dry etching method, a wet etching method, a sandblast method, or the like can be used.

First, as illustrated in FIG. 8A, the pixel electrodes 111a, 111b, and 111c and a conductive layer 123 are formed over the layer 101. The pixel electrodes are provided in the display portion, and the conductive layer 123 is provided in the connection portion 140.

When the pixel electrodes 111a, 111b, and 111c and the conductive layer 123 are formed, part of the layer 101 (specifically, an insulating layer positioned on the uppermost surface) may be processed to form a recess portion.

Next, the insulating layer 121 that covers end portions of the pixel electrodes 111a, 111b, and 111c and end portions of the conductive layer 123 is formed. This can prevent a short circuit of the light-emitting devices due to a contact between films formed later (the fifth layer 114 or the common electrode 115) and the pixel electrodes 111a, 111b, and 111c.

Then, a first layer 113A is formed over the pixel electrodes 111a, 111b, and 111c and the insulating layer 121; a first sacrificial layer 118A is formed over the first layer 113A; and a second sacrificial layer 119A is formed over the first sacrificial layer 118A.

Materials that can be used for the pixel electrodes are as described above. The pixel electrodes can be formed by a sputtering method or a vacuum evaporation method, for example. The pixel electrodes can be processed by a wet etching method or a dry etching method. The pixel electrodes are preferably processed by anisotropic etching.

The insulating layer 121 can have a single-layer structure or a stacked-layer structure including one or both of an inorganic insulating film and an organic insulating film.

Examples of an organic insulating material that can be used for the insulating layer 121 include an acrylic resin, an epoxy resin, a polyimide resin, a polyamide resin, a polyimide-amide resin, a polysiloxane resin, a benzocyclobutene-based resin, and a phenol resin. As an inorganic insulating film that can be used for the insulating layer 121, an inorganic insulating film that can be used as the protective layers 131 and 132 can be used.

As illustrated in FIG. 8A, in the cross-sectional view along Y1-Y2, the end portion of the first layer 113A on the connection portion 140 side is positioned closer to the inner side (closer to the display portion) than the end portion of the first sacrificial layer 118A. For example, by using a mask for specifying a film formation area (also referred to as an area mask or a rough metal mask to be distinguished from a fine metal mask), the first layer 113A can be formed in a region different from a region where the first sacrificial layer 118A and the second sacrificial layer 119A are formed. In one embodiment of the present invention, the light-emitting device is formed using a resist mask; by using a combination of a resist mask and an area mask as described above, the light-emitting device can be formed in a relatively simple process.

The first layer 113A is a layer to be the first layer 113a, the second layer 113b, and the third layer 113c later. Therefore, the first layer 113A can employ the above-described structure applicable to the first layer 113a, the second layer 113b, and the third layer 113c. The first layer 113A can be formed by an evaporation method (including a vacuum evaporation method), a transfer method, a printing method, an inkjet method, a coating method, or the like. The first layer 113A is preferably formed by an evaporation method. A premix material may be used in the film formation by an evaporation method. Note that in this specification and the like, a premix material is a composite material in which a plurality of materials are combined or mixed in advance.

As the first sacrificial layer 118A and the second sacrificial layer 119A, a film that is highly resistant to the process conditions for the first layer 113A and the like, specifically, a film having high etching selectivity with EL layers is used.

The first sacrificial layer 118A and the second sacrificial layer 119A can be formed by a sputtering method, an ALD method (a thermal ALD method or a PEALD method), a CVD method, or a vacuum evaporation method, for example. The first sacrificial layer 118A, which is formed on and in contact with the EL layer, is preferably formed by a formation method that causes less damage to the EL layer than a formation method for the second sacrificial layer 119A. For example, the first sacrificial layer 118A is preferably formed by an ALD method or a vacuum evaporation method rather than a sputtering method. The first sacrificial layer 118A and the second sacrificial layer 119A are formed at a temperature lower than the upper temperature limit of the EL layer (typically at 200° C. or lower, preferably 100° C. or lower, further preferably 80° C. or lower).

The first sacrificial layer 118A and the second sacrificial layer 119A are preferably films that can be removed by a wet etching method. The use of a wet etching method can reduce damage to the first layer 113A in processing of the first sacrificial layer 118A and the second sacrificial layer 119A, compared to the case of using a dry etching method.

The first sacrificial layer 118A is preferably a film having high etching selectivity with the second sacrificial layer 119A.

In the method for manufacturing the display apparatus of this embodiment, it is preferred that the layers (e.g., the hole-injection layer, the hole-transport layer, the light-emitting layer, the hole-blocking layer, the electron-blocking layer, and the electron-transport layer) included in the EL layer not be easily processed in the step of processing the sacrificial layers, and that the sacrificial layers not be easily processed in the steps of processing the layers included in the EL layer. In consideration of the above, the materials and a processing method for the sacrificial layers and processing methods for the EL layer are preferably selected.

Although this embodiment shows an example in which the sacrificial layer is formed with a two-layer structure of the first sacrificial layer 118A and the second sacrificial layer 119A, the sacrificial layer may have a single-layer structure or a stacked-layer structure of three or more layers.

As the first sacrificial layer 118A and the second sacrificial layer 119A, it is preferable to use an inorganic film such as a metal film, an alloy film, a metal oxide film, a semiconductor film, or an inorganic insulating film, for example.

For the first sacrificial layer 118A and the second sacrificial layer 119A, it is preferable to use a metal material such as gold, silver, platinum, magnesium, nickel, tungsten, chromium, molybdenum, iron, cobalt, copper, palladium, titanium, aluminum, yttrium, zirconium, or tantalum or an alloy material containing any of the metal materials, for example. It is particularly preferable to use a low-melting-point material such as aluminum or silver. The use of a metal material capable of blocking ultraviolet light for one or both of the first sacrificial layer 118A and the second sacrificial layer 119A is preferable, in which case the EL layer can be prevented from being irradiated with ultraviolet light and deteriorating.

For the first sacrificial layer 118A and the second sacrificial layer 119A, a metal oxide such as In—Ga—Zn oxide can be used. As the first sacrificial layer 118A or the second sacrificial layer 119A, an In—Ga—Zn oxide film can be formed by a sputtering method, for example. Furthermore, indium oxide, In—Zn oxide, In—Sn oxide, indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like can be used. Indium tin oxide containing silicon, or the like can also be used.

In addition, in place of gallium described above, an element M (M is one or more selected from aluminum, silicon, boron, yttrium, copper, vanadium, beryllium, titanium, iron, nickel, germanium, zirconium, molybdenum, lanthanum, cerium, neodymium, hafnium, tantalum, tungsten, magnesium, and the like) may be used. In particular, M is preferably one or more selected from gallium, aluminum, and yttrium.

As the first sacrificial layer 118A and the second sacrificial layer 119A, a variety of inorganic insulating films that can be used as the protective layers 131 and 132 can be used. In particular, an oxide insulating film is preferable because its adhesion to the EL layer is higher than that of a nitride insulating film. For example, an inorganic insulating material such as aluminum oxide, hafnium oxide, or silicon oxide can be used for the first sacrificial layer 118A and the second sacrificial layer 119A. As the first sacrificial layer 118A or the second sacrificial layer 119A, an aluminum oxide film can be formed by an ALD method, for example. The use of an ALD method is preferable, in which case damage to a base (in particular, the EL layer or the like) can be reduced.

For example, an inorganic insulating film (e.g., an aluminum oxide film) formed by an ALD method can be used as the first sacrificial layer 118A, and a tungsten film formed by a sputtering method can be used as the second sacrificial layer 119A. Alternatively, an aluminum film or an In—Ga—Zn oxide film may be used as the second sacrificial layer 119A.

A material dissolvable in a solvent that is chemically stable with respect to at least a film on the outermost side of the first layer 113A may be used for the first sacrificial layer 118A and the second sacrificial layer 119A. Specifically, a material that will be dissolved in water or alcohol can be suitably used for the first sacrificial layer 118A and the second sacrificial layer 119A. In forming a film of such a material, it is preferable to apply the material dissolved in a solvent such as water or alcohol by a wet process and then perform heat treatment for evaporating the solvent. At this time, the heat treatment is preferably performed in a reduced-pressure atmosphere, in which case the solvent can be removed at a low temperature in a short time and thermal damage to the EL layer can be reduced accordingly.

The first sacrificial layer 118A and the second sacrificial layer 119A may be formed by a wet process such as spin coating, dipping, spray coating, ink-jetting, dispensing, screen printing, offset printing, doctor blade coating, slit coating, roll coating, curtain coating, or knife coating.

The first sacrificial layer 118A and the second sacrificial layer 119A may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin.

Next, a resist mask 190a is formed over the second sacrificial layer 119A as illustrated in FIG. 8B. The resist mask can be formed by application of a photosensitive resin (photoresist), exposure, and development.

The resist mask may be formed using either a positive resist material or a negative resist material.

The resist mask 190a is provided at positions overlapping a region to be the subpixel 110a, a region to be the subpixel 110b, and a region to be the subpixel 110c, as illustrated in FIG. 7A. As the resist mask 190a, one island-shaped pattern for one subpixel 110a, one subpixel 110b, or one subpixel 110c is preferably provided. Alternatively, one belt-like pattern for a plurality of subpixels 110a, subpixels 110b, or subpixels 110c aligned in one column (arranged in the Y direction in FIG. 7A) may be formed as the resist mask 190a.

Note that the resist mask 190a is preferably provided also at a position overlapping the conductive layer 123. This can prevent the conductive layer 123 from being damaged during the process of manufacturing the display apparatus.

Then, as illustrated in FIG. 8C, part of the second sacrificial layer 119A is removed using the resist mask 190a, so that a second sacrificial layer 119a is formed. The second sacrificial layer 119a remains in regions overlapping the pixel electrodes 111a, 111b, and 111c and a region overlapping the conductive layer 123.

In the etching of the second sacrificial layer 119A, an etching condition with high selectively is preferably employed so that the first sacrificial layer 118A is not removed by the etching. Since the EL layer is not exposed in processing the second sacrificial layer 119A, the range of choices of the processing method is wider than that for processing the first sacrificial layer 118A. Specifically, deterioration of the EL layer can be further suppressed even when a gas containing oxygen is used as an etching gas for processing the second sacrificial layer 119A.

After that, the resist mask 190a is removed. The resist mask 190a can be removed by ashing using oxygen plasma, for example. Alternatively, the resist mask 190a may be removed by wet etching. At this time, in a region where the resist mask 190a is not provided, the first sacrificial layer 118A is positioned on the outermost surface, and the first layer 113A is not exposed; thus, the first layer 113A can be prevented from being damaged in the step of removing the resist mask 190a. In addition, the range of choices of the method for removing the resist mask 190a can be widened.

Next, as illustrated in FIG. 9A, part of the first sacrificial layer 118A is removed using the second sacrificial layer 119a as a hard mask, so that a first sacrificial layer 118a is formed.

The first sacrificial layer 118A and the second sacrificial layer 119A can be processed by a wet etching method or a dry etching method. The first sacrificial layer 118A and the second sacrificial layer 119A are preferably processed by anisotropic etching.

In the case of using a wet etching method, damage to the first layer 113A in processing of the first sacrificial layer 118A and the second sacrificial layer 119A can be reduced as compared to the case of using a dry etching method. In the case of using a wet etching method, it is preferable to use a chemical solution of a developer, an aqueous solution of tetramethylammonium hydroxide (TMAH), dilute hydrofluoric acid, oxalic acid, phosphoric acid, nitric acid, acetic acid, or a mixed solution thereof, for example.

In the case of using a dry etching method, deterioration of the first layer 113A can be suppressed by not using a gas containing oxygen as the etching gas. In the case of using a dry etching method, it is preferable to use a gas containing $CF_4$, $C_4F_8$, $SF_6$, $CHF_3$, $Cl_2$, $H_2O$, or $BCl_3$ or a noble gas (also referred to as a rare gas) such as He as the etching gas, for example.

For example, when an aluminum oxide film formed by an ALD method is used as the first sacrificial layer 118A, the first sacrificial layer 118A can be processed by a dry etching method using $CHF_3$ and He. When a tungsten film formed by a sputtering method is used as the second sacrificial layer 119A, the second sacrificial layer 119A can be processed by a dry etching method using $CF_4$ and $Cl_2$.

Subsequently, as illustrated in FIG. 9B, part of the first layer 113A is removed using the second sacrificial layer 119a and the first sacrificial layer 118a as hard masks, whereby the first layer 113a, the second layer 113b, and the third layer 113c are formed.

Thus, as illustrated in FIG. 9B, a stacked-layer structure of the first layer 113a, the first sacrificial layer 118a, and the second sacrificial layer 119a remains over the pixel electrode 111a. A stacked-layer structure of the second layer 113b, the first sacrificial layer 118a, and the second sacrificial layer 119a remains over the pixel electrode 111b. A stacked-layer structure of the third layer 113c, the first sacrificial layer 118a, and the second sacrificial layer 119a remains over the pixel electrode 111c. In the connection portion 140, a stacked-layer structure of the first sacrificial layer 118a and the second sacrificial layer 119a remains over the conductive layer 123.

Through the above steps, regions of the first layer 113A, the first sacrificial layer 118A, and the second sacrificial layer 119A that are not overlapped by the resist mask 190a can be removed.

Note that part of the first layer 113A may be removed using the resist mask 190a. Then, the resist mask 190a may be removed.

The first layer 113A is preferably processed by anisotropic etching. In particular, an anisotropic dry etching method is preferably used. Alternatively, a wet etching method may be used.

In the case of using a dry etching method, deterioration of the first layer 113A can be suppressed by not using a gas containing oxygen as the etching gas.

A gas containing oxygen may be used as the etching gas. When the etching gas contains oxygen, the etching rate can be increased. Therefore, the etching can be performed under a low-power condition while an adequately high etching rate is maintained. Thus, damage to the first layer 113A can be suppressed. Furthermore, a defect such as attachment of a reaction product generated at the etching can be inhibited.

In the case of using a dry etching method, it is preferable to use a gas containing at least one of $H_2$, $CF_4$, $C_4F_8$, $SF_6$, $CHF_3$, $Cl_2$, $H_2O$, $BCl_3$, and a noble gas (also referred to as a rare gas) such as He and Ar as the etching gas, for example. Alternatively, a gas containing oxygen and at least one of the above is preferably used as the etching gas. Alternatively, an oxygen gas may be used as the etching gas. Specifically, for example, a gas containing $H_2$ and Ar or a gas containing $CF_4$ and He can be used as the etching gas. As another example, a gas containing $CF_4$, He, and oxygen can be used as the etching gas.

Note that side surfaces of the first layer 113a, the second layer 113b, and the third layer 113c are preferably perpendicular or substantially perpendicular to their formation surfaces. For example, the angle between the formation surfaces and these side surfaces is preferably greater than or equal to 60° and less than or equal to 90°.

Next, as illustrated in FIG. 9C, an insulating film 125A is formed to cover the insulating layer 121, the first layer 113a, the second layer 113b, the third layer 113c, the first sacrificial layer 118a, and the second sacrificial layer 119a.

As the insulating film 125A, an inorganic insulating film such as an oxide insulating film, a nitride insulating film, an oxynitride insulating film, or a nitride oxide insulating film can be used, for example. Examples of the oxide insulating film include a silicon oxide film, an aluminum oxide film, a magnesium oxide film, a gallium oxide film, a germanium oxide film, an yttrium oxide film, a zirconium oxide film, a lanthanum oxide film, a neodymium oxide film, a hafnium oxide film, and a tantalum oxide film. Examples of the nitride insulating film include a silicon nitride film and an aluminum nitride film. Examples of the oxynitride insulating film include a silicon oxynitride film and an aluminum oxynitride film. Examples of the nitride oxide insulating film include a silicon nitride oxide film and an aluminum nitride oxide film. Alternatively, a metal oxide film such as an indium gallium zinc oxide film may be used.

The insulating film 125A preferably has a function of a barrier insulating film against at least one of water and oxygen. Alternatively, the insulating film 125A preferably has a function of inhibiting the diffusion of at least one of water and oxygen. Alternatively, the insulating film 125A preferably has a function of capturing or fixing (also referred to as gettering) at least one of water and oxygen.

Note that in this specification and the like, a barrier insulating film refers to an insulating film having a barrier property. A barrier property in this specification and the like means a function of inhibiting diffusion of a particular substance (also referred to as a function of less easily transmitting the substance). Alternatively, a barrier property refers to a function of capturing or fixing (also referred to as gettering) a particular substance.

When the insulating film 125A has a function of the barrier insulating film or a gettering function, entry of impurities (typically, water or oxygen) that would diffuse into the light-emitting devices from the outside can be suppressed. With such a structure, a highly reliable display apparatus can be provided.

Next, as illustrated in FIG. 10A, an insulating film 127A is formed over the insulating film 125A.

For the insulating film 127A, an organic material can be used. Examples of the organic material include an acrylic resin, a polyimide resin, an epoxy resin, an imide resin, a polyamide resin, a polyimide-amide resin, a silicone resin, a siloxane resin, a benzocyclobutene-based resin, a phenol resin, and precursors of these resins. The insulating film 127A may be formed using an organic material such as polyvinyl alcohol (PVA), polyvinyl butyral, polyvinylpyrrolidone, polyethylene glycol, polyglycerin, pullulan, water-soluble cellulose, or an alcohol-soluble polyamide resin. Moreover, the insulating film 127A can be formed using a photosensitive resin. A photoresist may be used as the photosensitive resin. The photosensitive resin can be of positive or negative type.

There is no particular limitation on the method of forming the insulating film 127A, and, for example, the insulating film 127A can be formed by a wet process such as spin coating, dipping, spray coating, ink-jetting, dispensing, screen printing, offset printing, doctor blade coating, slit coating, roll coating, curtain coating, or knife coating. Specifically, the insulating film 127A is preferably formed by spin coating.

The insulating film 125A and the insulating film 127A are preferably formed by a formation method by which the EL layer is less damaged. In particular, the insulating film 125A, which is formed in contact with a side surface of the EL layer, is preferably formed by a formation method that causes less damage to the EL layer than the method of forming the insulating film 127A. The insulating film 125A and the insulating film 127A are each formed at a temperature lower than the upper temperature limit of the EL layer (typically at 200° C. or lower, preferably 100° C. or lower, further preferably 80° C. or lower). As the insulating film 125A, an aluminum oxide film can be formed by an ALD method, for example. The use of an ALD method is preferable, in which case damage by the deposition to the EL layer is reduced and a film with good coverage can be formed.

Then, as illustrated in FIG. 10B, the insulating film 125A and the insulating film 127A are processed, whereby the insulating layer 125 and the insulating layer 127 are formed.

The insulating layer 127 is formed in contact with the side surface of the insulating layer 125 and the upper side of the bottom of the recess portion. The insulating layer 125 is provided in contact with the top surface of the insulating layer 121. The insulating layer 125 and the insulating layer 127 are preferably provided to cover the side surfaces of the first layer 113$a$, the second layer 113$b$, and the third layer 113$c$. This inhibits a contact of a film formed later with the side surfaces of these layers, thereby suppressing a short circuit of the light-emitting devices. In addition, damage to the first layer 113$a$, the second layer 113$b$, and the third layer 113$c$ in later steps can be suppressed.

The insulating film 127A is preferably processed by ashing using oxygen plasma, for example.

The insulating film 125A is preferably processed by a dry etching method. The insulating film 125A is preferably processed by anisotropic etching. The insulating film 125A can be processed using an etching gas that can be used for processing the first sacrificial layer 118A and the second sacrificial layer 119A.

Subsequently, as illustrated in FIG. 10C, the first sacrificial layer 118$a$ and the second sacrificial layer 119$a$ are removed. Accordingly, the first layer 113$a$ is exposed over the pixel electrode 111$a$, the second layer 113$b$ is exposed over the pixel electrode 111$b$, the third layer 113$c$ is exposed over the pixel electrode 111$c$, and the conductive layer 123 is exposed in the connection portion 140.

The height of the top surface of the insulating layer 125 and the height of the top surface of the insulating layer 127 are each preferably equal to or substantially equal to the height of the top surface of at least one of the first layer 113$a$, the second layer 113$b$, and the third layer 113$c$. The top surface of the insulating layer 127 is preferably flat and may have a projection, a convex curve, a concave curve, or a projection.

The step of removing the sacrificial layers can be performed by a method similar to that for the step of processing the sacrificial layers. Specifically, the use of a wet etching method can reduce damage to the first layer 113$a$, the second layer 113$b$, and the third layer 113$c$ at the time of removing the first sacrificial layer 118$a$ and the second sacrificial layer 119$a$, as compared to the case of using a dry etching method.

The first sacrificial layer 118$a$ and the second sacrificial layer 119$a$ may be removed in different steps or the same step.

One or both of the first sacrificial layer 118$a$ and the second sacrificial layer 119$a$ may be removed by being dissolved in a solvent such as water or alcohol. Examples of alcohol include ethyl alcohol, methyl alcohol, isopropyl alcohol (IPA), and glycerin.

After the first sacrificial layer 118$a$ and the second sacrificial layer 119$a$ are removed, drying treatment may be performed to remove water included in the EL layer and water adsorbed on the surface of the EL layer. For example, heat treatment in an inert gas atmosphere or a reduced-pressure atmosphere can be performed. The heat treatment can be performed with a substrate temperature higher than or equal to 50° C. and lower than or equal to 200° C., preferably higher than or equal to 60° C. and lower than or equal to 150° C., further preferably higher than or equal to 70° C. and lower than or equal to 120° C. Employing a reduced-pressure atmosphere is preferable, in which case drying at a lower temperature is possible.

Next, as illustrated in FIG. 11A, the fifth layer 114 is formed to cover the insulating layers 125 and 127, the first layer 113$a$, the second layer 113$b$, the third layer 113$c$, and the conductive layer 123.

Materials that can be used for the fifth layer 114 are as described above. The fifth layer 114 can be formed by an evaporation method (including a vacuum evaporation method), a transfer method, a printing method, an inkjet method, a coating method, or the like. The fifth layer 114 may be formed using a premix material.

Here, in the case where the insulating layer 125 and the insulating layer 127 are not provided, the side surfaces of the first layer 113a, the second layer 113b, and the third layer 113c might be in contact with the fifth layer 114. A contact between these layers might cause a short circuit of the light-emitting devices when the fifth layer 114 has high conductivity, for example. Meanwhile, in the display apparatus of one embodiment of the present invention, the insulating layers 125 and 127 cover the side surfaces of the first layer 113a, the second layer 113b, and the third layer 113c; hence, the fifth layer 114 with high conductivity can be prevented from being in contact with these layers, so that a short circuit of the light-emitting devices can be suppressed. Thus, the reliability of the light-emitting devices can be increased.

Then, as illustrated in FIG. 11A, the common electrode 115 is formed over the fifth layer 114. As illustrated in FIG. 11A, the conductive layer 123 is electrically connected to the common electrode 115 through the fifth layer 114.

Materials that can be used for the common electrode 115 are as described above. The common electrode 115 can be formed by a sputtering method or a vacuum evaporation method, for example. Alternatively, the common electrode 115 may be a stack of a film formed by an evaporation method and a film formed by a sputtering method.

Subsequently, the protective layer 131 is formed over the common electrode 115, and the protective layer 132 is formed over the protective layer 131. Then, the color conversion layers 129a and 129b are formed over the protective layer 132 so as to have a region overlapping the pixel electrode 111a and a region overlapping the pixel electrode 111b, respectively.

The color conversion layers can be formed by a droplet discharge method (e.g., an inkjet method), a coating method, an imprinting method, a variety of printing methods (screen printing or offset printing), or the like. A color conversion film such as a quantum dot film may also be used.

Then, the substrate 120 is attached onto the color conversion layers 129a and 129b with the resin layer 122, whereby the display apparatus 100 illustrated in FIG. 1B can be manufactured. Note that as illustrated in FIGS. 2A and 2B and the like, the color conversion layer 129c may be formed to have a region overlapping the pixel electrode 111c.

The materials and formation methods that can be used for the protective layers 131 and 132 are as described above. Examples of methods for forming the protective layers 131 and 132 include a vacuum evaporation method, a sputtering method, a CVD method, and an ALD method. The protective layers 131 and 132 may be films formed by different formation methods. The protective layers 131 and 132 may each have a single-layer structure or a stacked-layer structure.

Note that a mask for specifying a film formation area (also referred to as an area mask or a rough metal mask) may be used to form the common electrode 115. Alternatively, the common electrode 115 may be formed without using the mask, the steps of processing the common electrode 115 and the fifth layer 114 in FIG. 11B and FIG. 11C may be performed after the step illustrated in FIG. 11A, and then the step of forming the protective layer 131 may be performed.

As illustrated in FIG. 11B and FIG. 7B, the resist mask 190b is formed over the common electrode 115. An end portion on the Y2 side in FIG. 11B includes a portion where the resist mask 190b is not provided. As illustrated in FIG. 7B, the resist mask 190b is provided in a region overlapping the subpixels and the connection portion 140. That is, the region where the resist mask 190b is not provided is positioned on the outer side beyond the connection portion 140.

Next, as illustrated in FIG. 11C, part of the common electrode 115 and part of the fifth layer 114 are removed using the resist mask 190b. In the above manner, the common electrode 115 and the fifth layer 114 can be processed.

Note that in the above process, part of the insulating layer 127 is eliminated by ashing or the like to expose the second sacrificial layer 119a and the like (see FIG. 10B); however, the present invention is not limited to this structure. For example, as illustrated in FIG. 12A, openings may be provided in the insulating film 127A at positions overlapping the pixel electrodes 111a, 111b, and 111c and the conductive layer 123, to form the insulating layer 127. For example, a photosensitive resin is applied as the insulating film 127A and is exposed to light and developed, thereby forming a pattern in which openings are provided at positions overlapping the pixel electrodes 111a, 111b, and 111c and the conductive layer 123.

After the insulating layer 127 is formed by patterning as illustrated in FIG. 12A, the display apparatus 100 can be fabricated in a similar manner to the steps illustrated in FIGS. 11A to 11C.

Note that in this case, the height of the top surface of the insulating layer 127 may be greater than that of the top surface of the second sacrificial layer 119a, as illustrated in FIG. 12A. Thus, part of the first sacrificial layer 118a and part of the second sacrificial layer 119a may remain at the time of removing the first sacrificial layer 118a and the second sacrificial layer 119a.

Consequently, as illustrated in FIG. 12B, one or both of the first sacrificial layer 118 and the second sacrificial layer 119 that cannot be removed by etching may be positioned over the first layer 113a, the second layer 113b, the third layer 113c, or the conductive layer 123 even after the formation of the common electrode 115.

Here, a plane formed by the side surface of the first sacrificial layer 118, the side surface of the second sacrificial layer 119, part of the side surface of the insulating layer 125, and part of the side surface of the insulating layer 127 (a plane in contact with the fifth layer 114) preferably forms a taper angle in the cross-sectional view. When the plane forms a taper angle in the cross-sectional view, the fifth layer 114 and the common electrode 115, which cover the first sacrificial layer 118, the second sacrificial layer 119, the insulating layer 125, and the insulating layer 127, are formed with good coverage; hence, disconnection or the like can be prevented from occurring in the fifth layer 114 and the common electrode 115.

By such a method, the display apparatus 100 illustrated in FIG. 3B can be fabricated.

Alternatively, as illustrated in FIG. 12C, without providing the fifth layer 114, the common electrode 115 may be formed to cover the insulating layer 125 and 127, the first layer 113a, the second layer 113b, and the third layer 113c. That is, all layers included in the EL layer in the light-emitting device of one subpixel may be formed separately from those in the light-emitting device of another subpixel. At this time, the entire EL layer of each light-emitting device is formed in an island shape.

Here, when any of the pixel electrodes 111a, 111b, and 111c is in contact with the common electrode 115, the light-emitting device might be short-circuited. However, in the display apparatus of one embodiment of the present invention, the insulating layers 121, 125, and 127 cover the side surfaces of the first layer 113a, the second layer 113b, the third layer 113c, and the pixel electrodes 111a, 111b, and 111c; hence, the common electrode 115 is prevented from being in contact with these layers, and a short circuit of the light-emitting devices can be suppressed. Thus, the reliability of the light-emitting devices can be increased.

In the step illustrated in FIG. 11A, an end portion of the fifth layer 114 on the connection portion 140 side may be positioned closer to the inner side (closer to the display portion) than the connection portion 140 in the cross-sectional view along Y1-Y2, and the fifth layer 114 may not be provided over the conductive layer 123 (see FIG. 12D). For example, a mask for specifying a film formation area (also referred to as an area mask or a rough metal mask) is used to form the fifth layer 114. In this case, since the fifth layer 114 is not provided over the conductive layer 123, the conductive layer 123 is electrically connected to the common electrode 115 without through the fifth layer 114.

FIGS. 13A to 13F each illustrate a cross-sectional structure of a region 139 including the insulating layer 127 and its surroundings.

Figure 13A:
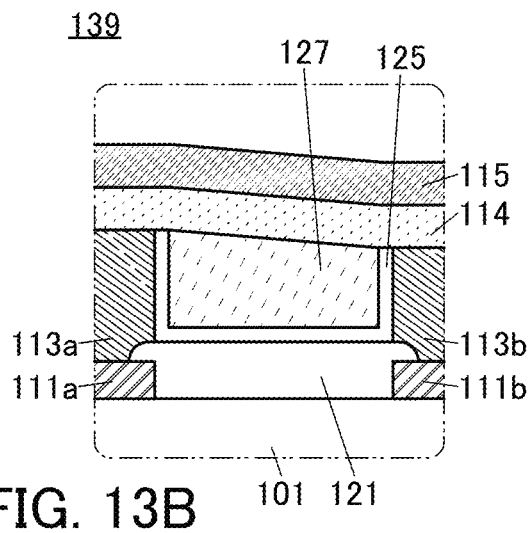
FIGS. 13A to 13F are cross-sectional views illustrating examples of a method for manufacturing a display apparatus.

FIG. 13A illustrates an example in which the first layer 113a and the second layer 113b have different thicknesses. The height of the top surface of the insulating layer 125 agrees with or substantially agrees with the height of the top surface of the first layer 113a on the first layer 113a side, and agrees with or substantially agrees with the height of the top surface of the second layer 113b on the second layer 113b side. The top surface of the insulating layer 127 has a gentle slope such that the side closer to the first layer 113a is higher and the side closer to the second layer 113b is lower. In this manner, the height of the insulating layers 125 and 127 is preferably equal to the height of the top surface of the adjacent EL layer. Alternatively, the height of the insulating layers 125 and 127 may be equal to the height of the top surface of any adjacent EL layer so that their top surfaces can have a flat portion.

Figure 13B:
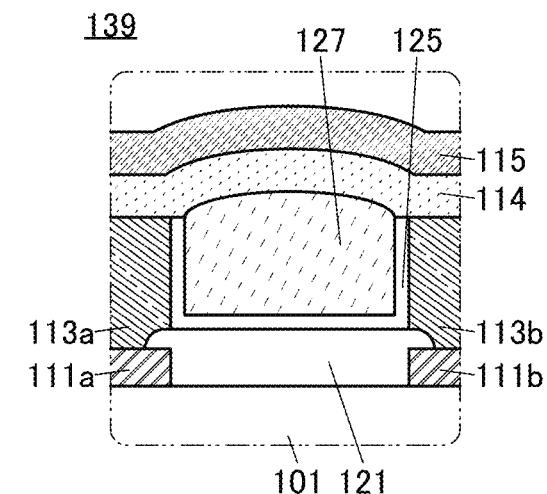

In FIG. 13B, the top surface of the insulating layer 127 includes a region whose height is greater than the height of the top surface of the first layer 113a and the top surface of the second layer 113b. Moreover, the top surface of the insulating layer 127 has a convex shape that is gently curved outward toward the center.

Figure 13C:
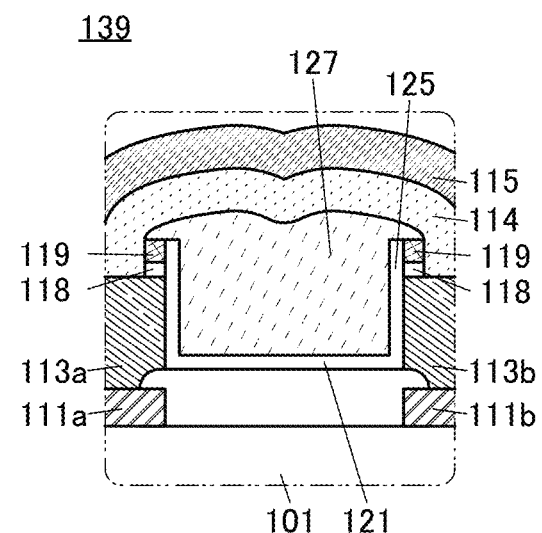

In FIG. 13C, the top surface of the insulating layer 127 includes a region whose height is greater than the height of the top surface of the first layer 113a and the top surface of the second layer 113b. In the region 139, the display apparatus 100 includes at least one of the first sacrificial layer 118 and the second sacrificial layer 119, and includes a region where the top surface of the insulating layer 127 has a height greater than those of the top surface of the first layer 113a and the top surface of the second layer 113b and the insulating layer 127 is located closer to the outer side than the insulating layer 125. The region is positioned over at least one of the first sacrificial layer 118 and the second sacrificial layer 119. In FIG. 13C, the top surface of the insulating layer 127 has a convex shape that is gently curved outward toward the center, and a recess portion is formed in the center portion of the top surface of the insulating layer 127. The recess portion has a shape that is gently recessed toward the center.

Figure 13D:
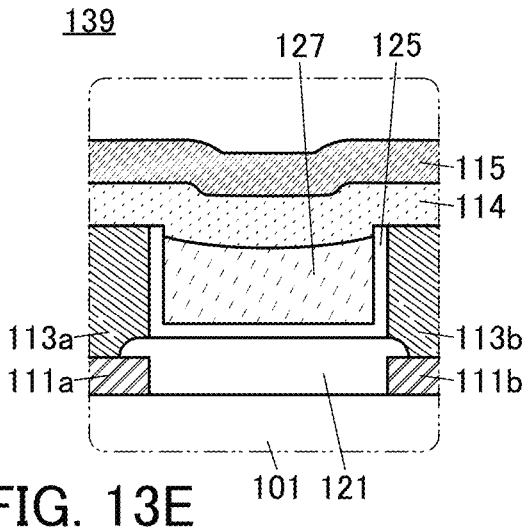

In FIG. 13D, the top surface of the insulating layer 127 includes a region whose height is less than the height of the top surface of the first layer 113a and the top surface of the second layer 113b. Moreover, the top surface of the insulating layer 127 has a concave shape that is gently recessed toward the center.

Figure 13E:
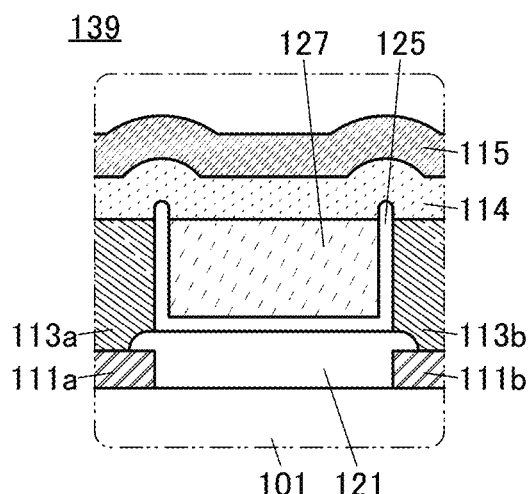

In FIG. 13E, the top surface of the insulating layer 125 includes a region whose height is greater than the height of the top surface of the first layer 113a and the top surface of the second layer 113b. That is, the insulating layer 125 protrudes from the formation surface of the fifth layer 114 and forms a projection.

For example, when the insulating layer 125 is formed so that its height is equal to or substantially equal to the height of the sacrificial layer, the insulating layer 125 may protrude as illustrated in FIG. 13E.

Figure 13F:
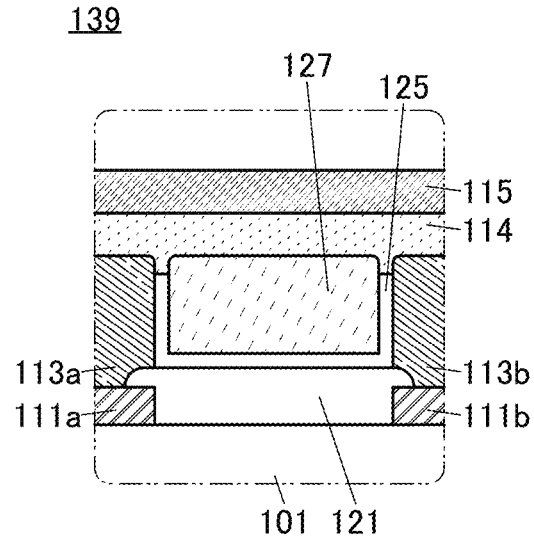

In FIG. 13F, the top surface of the insulating layer 125 includes a region whose height is less than the height of the top surface of the first layer 113a and the top surface of the second layer 113b. That is, the insulating layer 125 forms a recess portion on the formation surface of the fifth layer 114.

As described above, the insulating layer 125 and the insulating layer 127 can have a variety of shapes.

As has been described, in the method for manufacturing the display apparatus of this embodiment, island-shaped EL layers are formed not by patterning using a metal mask but by processing an EL layer formed on the entire surface; thus, the island-shaped EL layers can be formed with a uniform thickness. Consequently, a high-definition display apparatus or a display apparatus with a high aperture ratio can be obtained.

The first layer 113a, the second layer 113b, and the third layer 113c included in blue light-emitting devices can be formed in the same steps. Thus, the process of manufacturing the display apparatus can be simplified, and the manufacturing cost can be reduced.

The display apparatus of one embodiment of the present invention includes an insulating layer that covers an end portion of a pixel electrode, and an insulating layer that covers side surfaces of a light-emitting layer and a carrier-transport layer. In the manufacturing process of the display apparatus, the EL layer is processed while the light-emitting layer and the carrier-transport layer are stacked; hence, damage to the light-emitting layer is reduced in the display apparatus. In addition, the two types of insulating layers prevent the pixel electrode or the light-emitting layer from being in contact with a carrier-injection layer or a common electrode so that the light-emitting device is prevented from being short-circuited.

This embodiment can be combined with any of the other embodiments as appropriate. In this specification, in the case where a plurality of structure examples are shown in one embodiment, the structure examples can be combined as appropriate.

Embodiment 2

In this embodiment, structure examples of a light-emitting device that can be used in the display apparatus of one embodiment of the present invention will be described with reference to FIGS. 14A and 14B and FIGS. 15A and 15B.

Figure 14A:
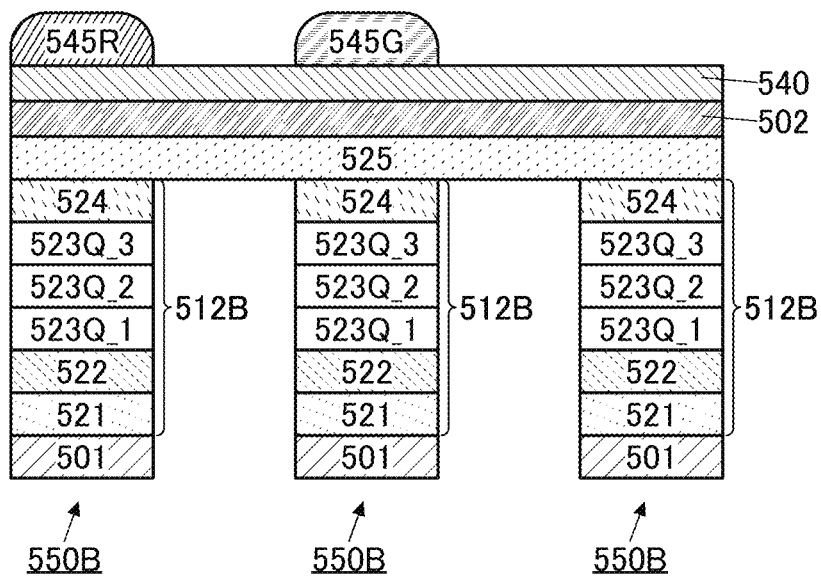
FIGS. 14A and 14B are cross-sectional views illustrating examples of a display apparatus.
Figure 14B:
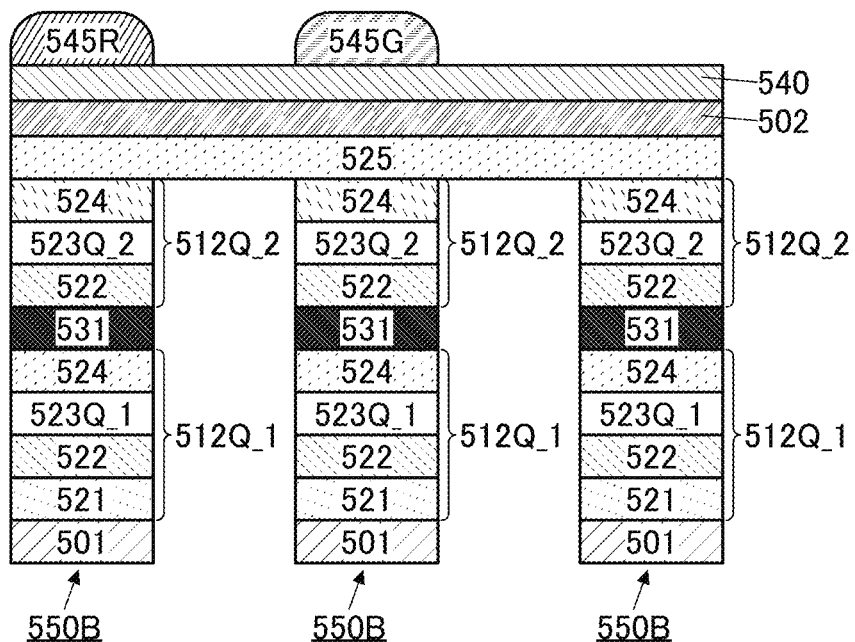

A display apparatus 500 illustrated in FIGS. 14A and 14B includes a plurality of light-emitting devices 550B that emit blue light. In FIGS. 14A and 14B, a color conversion layer 545R that converts blue light into red light and a color conversion layer 545G that converts blue light into green light are provided over the light-emitting devices 550B.

Here, the color conversion layers 545R and 545G are preferably provided over the light-emitting devices 550B with a protective layer 540 therebetween. Note that FIGS. 14A and 14B each illustrate a structure where the light-emitting device 550B adjacent to the light-emitting device 550B provided with the color conversion layer 545G is not provided with a color conversion layer; however, this embodiment is not limited thereto, and a color conversion layer that converts blue light into vivid blue light with a smaller half width may be provided adjacently to the color conversion layer 545G.

The light-emitting device 550B illustrated in FIG. 14A includes a light-emitting unit 512B between a pair of electrodes (an electrode 501 and an electrode 502). The electrode 501 functions as a pixel electrode and is provided in every light-emitting device. The electrode 502 functions as a common electrode and is shared by a plurality of light-emitting devices.

That is, three light-emitting devices 550B illustrated in FIG. 14A each include one light-emitting unit (light-emitting unit 512B). Note that in this specification, a structure including one light-emitting unit between a pair of electrodes as in the light-emitting device 550B illustrated in FIG. 14A is referred to as a single structure.

The light-emitting units 512B illustrated in FIG. 14A can be formed as island-shaped layers. That is, the light-emitting unit 512B illustrated in FIG. 14A corresponds to the first layer 113a, the second layer 113b, or the third layer 113c illustrated in FIG. 1B and the like. The light-emitting device 550B corresponds to the light-emitting device 130a, the light-emitting device 130b, or the light-emitting device 130c. The electrode 501 corresponds to the pixel electrode 111a, the pixel electrode 111b, or the pixel electrode 111c. The electrode 502 corresponds to the common electrode 115.

The light-emitting unit 512B includes a layer 521, a layer 522, a light-emitting layer 523Q_1, a light-emitting layer 523Q_2, a light-emitting layer 523Q_3, a layer 524, and the like. The light-emitting device 550B includes a layer 525 and the like between the light-emitting unit 512B and the electrode 502.

FIG. 14A illustrates an example in which the light-emitting unit 512B does not include the layer 525 and the layer 525 is provided to be shared by the light-emitting devices. In this case, the layer 525 can be referred to as a common layer. By providing one or more common layers for a plurality of light-emitting devices in this manner, the manufacturing process can be simplified, resulting in a reduction in manufacturing cost. Note that the layer 525 may be provided for every light-emitting device. That is, the layer 525 may be included in the light-emitting unit 512B.

The layer 521 includes, for example, a layer containing a substance with a high hole-injection property (a hole-injection layer). The layer 522 includes, for example, a layer containing a substance with a high hole-transport property (a hole-transport layer). The layer 524 includes, for example, a layer containing a substance with a high electron-transport property (an electron-transport layer). The layer 525 includes, for example, a layer containing a substance with a high electron-injection property (an electron-injection layer).

Alternatively, the layer 521 may include an electron-injection layer, the layer 522 may include an electron-transport layer, the layer 524 may include a hole-transport layer, and the layer 525 may include a hole-injection layer.

FIG. 14A illustrates the layer 521 and the layer 522 separately; however, one embodiment of the present invention is not limited thereto. For example, the layer 522 may be omitted when the layer 521 has functions of both a hole-injection layer and a hole-transport layer or the layer 521 has functions of both an electron-injection layer and an electron-transport layer.

In the light-emitting device 550B illustrated in FIG. 14A, blue light emission can be obtained from the light-emitting device 550B by using light-emitting layers that emits blue light as the light-emitting layers 523Q_1, 523Q_2, and 523Q_3. Although the example where the light-emitting unit 512B includes three light-emitting layers is shown here, the number of light-emitting layers is not limited, and the light-emitting unit 512B may include one, two, or four or more light-emitting layers.

The color conversion layer 545R and the color conversion layer 545G are provided over the light-emitting devices 550B capable of emitting blue light, whereby the respective pixels emit red light, green light, and blue light so that full-color display can be performed. Note that FIG. 14A and the like illustrate an example in which the color conversion layer 545R that converts blue light into red light and the color conversion layer 545G that converts blue light into green light are provided, and a color conversion layer is not provided for a pixel from which blue light emission is obtained; however, the present invention is not limited thereto. Visible light of colors converted by the color conversion layers is visible light of at least two different colors that are appropriately selected from red, green, blue, cyan, magenta, and yellow, for example.

Thus, full-color display can be performed by providing color conversion layers as appropriate even when the layer 521, the layer 522, the layer 524, the layer 525, the light-emitting layer 523Q_1, the light-emitting layer 523Q_2, and the light-emitting layer 523Q_3 are formed to have the same structure (material, thickness, and the like) in the pixels of different colors. Consequently, in the display apparatus of one embodiment of the present invention, the light-emitting device does not need to be formed separately in each pixel; hence, the manufacturing process can be simplified, and the manufacturing cost can be reduced. Note that the present invention is not limited thereto, and at least one of the layer 521, the layer 522, the layer 524, the layer 525, the light-emitting layer 523Q_1, the light-emitting layer 523Q_2, and the light-emitting layer 523Q_3 may have a structure that differs among pixels.

The light-emitting device 550B illustrated in FIG. 14B has a structure in which between a pair of electrodes (the electrode 501 and the electrode 502), two light-emitting units (a light-emitting unit 512Q_1 and a light-emitting unit 512Q_2) are stacked with an intermediate layer 531 therebetween.

The intermediate layer 531 has a function of injecting electrons into one of the light-emitting units 512Q_1 and 512Q_2 and injecting holes to the other when voltage is applied between the electrode 501 and the electrode 502. The intermediate layer 531 can also be referred to as a charge-generation layer.

For example, the intermediate layer 531 can be favorably formed using a material that can be used for the electron-injection layer, such as lithium fluoride. As another example, the intermediate layer 531 can be favorably formed using a material that can be used for the hole-injection layer. Moreover, the intermediate layer 531 can be a layer containing a material with a high hole-transport property (hole-transport material) and an acceptor material (electron-accepting material). The intermediate layer 531 can be a layer containing a material with a high electron-transport property (electron-transport material) and a donor material. Forming the intermediate layer 531 including such a layer can suppress an increase in the driving voltage that would be caused when the light-emitting units are stacked.

The light-emitting unit 512Q_1 includes the layer 521, the layer 522, the light-emitting layer 523Q_1, the layer 524, and the like. The light-emitting unit 512Q_2 includes the layer 522, the light-emitting layer 523Q_2, the layer 524, and the like. The light-emitting device 550B includes the layer 525 and the like between the light-emitting unit 512Q_2 and the electrode 502. Note that the layer 525 can also be regarded as part of the light-emitting unit 512Q_2.

In the light-emitting device 550B illustrated in FIG. 14B, the light-emitting units emit blue light, whereby blue light emission can be obtained from the light-emitting device 550B. Note that the plurality of light-emitting units may contain the same light-emitting substance or different light-emitting substances.

A structure where a plurality of light-emitting units are connected in series through the intermediate layer 531 as in the light-emitting device 550B illustrated in FIG. 14B and the like is referred to as a tandem structure in this specification. Note that the term "tandem structure" is used in this specification and the like; however, without being limited to this, a tandem structure may be referred to as a stack structure, for example. A tandem structure enables a light-emitting device capable of emitting high-luminance light. Furthermore, a tandem structure allows the amount of current needed for obtaining the same luminance to be reduced as compared to the case of using a single structure; thus, the display apparatus can have lower power consumption and higher reliability.

Although the example where each of the light-emitting units 512Q_1 and 512Q_2 includes one light-emitting layer is shown here, the number of light-emitting layers in each light-emitting unit is not limited. For example, the light-emitting units 512Q_1 and 512Q_2 may each include a different number of light-emitting layers. For example, one of the light-emitting units may include two light-emitting layers, and the other light-emitting unit may include one light-emitting layer. Alternatively, one of the light-emitting units may include two light-emitting layers, and the other light-emitting unit may include three or more (specifically three or four) light-emitting layers. Note that a structure where a light-emitting unit includes two light-emitting layers may be referred to as a two-layer tandem structure; a structure where a light-emitting unit includes three light-emitting layers, as a three-layer tandem structure; a structure where a light-emitting unit includes four light-emitting layers, as a four-layer tandem structure. A light-emitting device may have a combination of a light-emitting unit having a single structure and a light-emitting unit having a tandem structure (a two-layer tandem structure, a three-layer tandem structure, or a four-layer tandem structure).

Figure 15A:
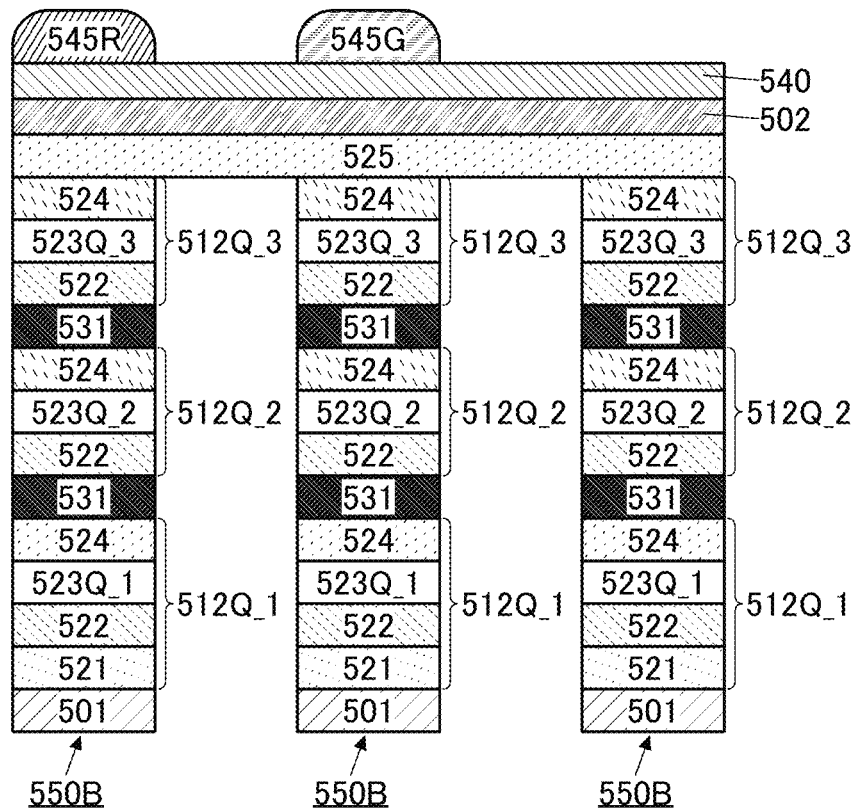
FIGS. 15A and 15B are cross-sectional views illustrating examples of a display apparatus.

FIG. 15A shows an example of the display apparatus 500 in which the light-emitting device 550B has a stack of three light-emitting units. In the light-emitting device 550B in FIG. 15A, a light-emitting unit 512Q_3 is further stacked over the light-emitting unit 512Q_2 with another intermediate layer 531 therebetween. The light-emitting unit 512Q_3 includes the layer 522, the light-emitting layer 523Q_3, the layer 524, and the like. The light-emitting unit 512Q_3 can have a structure similar to that of the light-emitting unit 512Q_2.

When the light-emitting device has a tandem structure, the number of light-emitting units is not particularly limited and can be two or more.

Figure 15B:
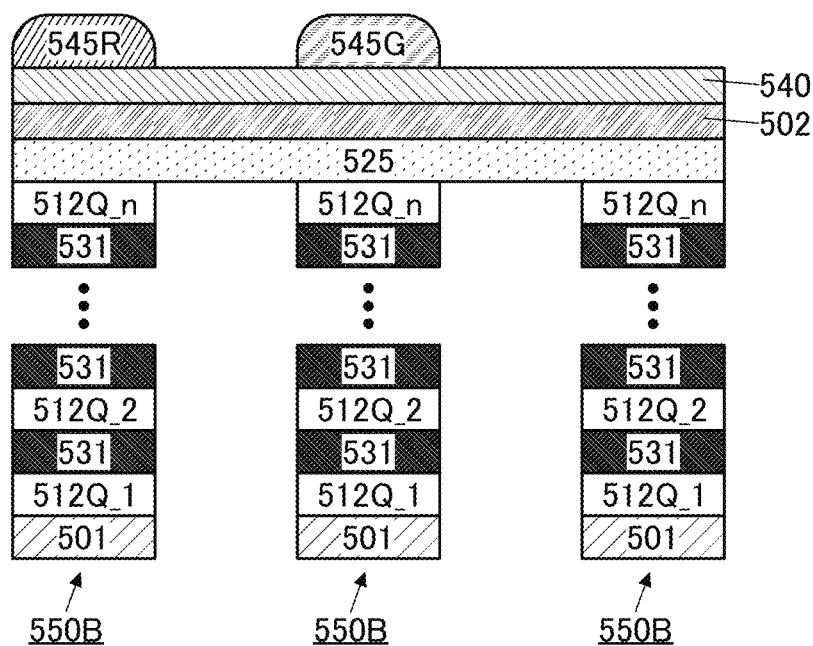

FIG. 15B shows an example in which n light-emitting units 512Q_1 to 512Q_n (n is an integer greater than or equal to 2) are stacked.

When the number of stacked light-emitting units is increased in the above manner, luminance obtained from the light-emitting device with the same amount of current can be increased in accordance with the number of stacked layers. Moreover, increasing the number of stacked light-emitting units can reduce current necessary for obtaining the same luminance; thus, power consumption of the light-emitting device can be reduced in accordance with the number of stacked layers.

There is no particular limitation on the light-emitting material of the light-emitting layer in the display apparatus 500. For example, in the display apparatus 500 illustrated in FIG. 15B, the light-emitting layer 523Q_1 included in the light-emitting unit 512Q_1 can contain a phosphorescent material, and the light-emitting layer 523Q_2 included in the light-emitting unit 512Q_2 can contain a fluorescent material. Alternatively, the light-emitting layer 523Q_1 included in the light-emitting unit 512Q_1 can contain a fluorescent material, and the light-emitting layer 523Q_2 included in the light-emitting unit 512Q_2 can contain a phosphorescent material. The display apparatus can have higher reliability by including a stack of a plurality of fluorescent light-emitting units.

Note that the structure of the light-emitting unit is not limited to the above. For example, in the display apparatus 500 illustrated in FIG. 15B, the light-emitting layer 523Q_1 included in the light-emitting unit 512Q_1 may contain a TADF material, and the light-emitting layer 523Q_2 included in the light-emitting unit 512Q_2 may contain one of a fluorescent material and a phosphorescent material. Using different light-emitting materials, e.g., using a combination of a highly reliable light-emitting material and a light-emitting material with high emission efficiency can compensate for their disadvantages and enables the display apparatus to have both higher reliability and higher emission efficiency.

Note that in the display apparatus of one embodiment of the present invention, all the light-emitting layers may contain a fluorescent material or all the light-emitting layers may contain a phosphorescent material.

This embodiment can be combined with any of the other embodiments as appropriate.

Embodiment 3

In this embodiment, a display apparatus of one embodiment of the present invention will be described with reference to FIG. 16, FIGS. 17A to 17C, and FIG. 18.

The display apparatus in this embodiment can be a high-resolution display apparatus or a large-sized display apparatus. Accordingly, the display apparatus in this embodiment can be used for display portions of electronic devices such as a digital camera, a digital video camera, a digital photo frame, a mobile phone, a portable game console, a portable information terminal, and an audio reproducing device, in addition to display portions of electronic devices with a relatively large screen, such as a television device, a desktop or laptop personal computer, a monitor of a computer and the like, digital signage, and a large game machine such as a pachinko machine.

[Display Apparatus 100A]

Figure 16:
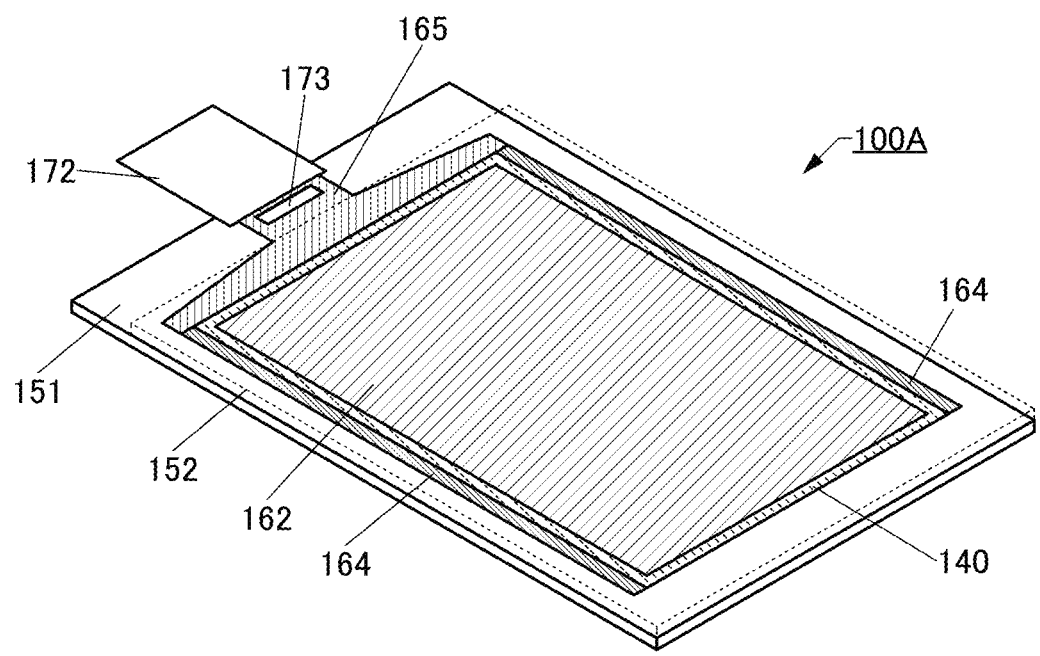
FIG. 16 is a perspective view illustrating an example of a display apparatus.

FIG. 16 is a perspective view of a display apparatus 100A, and FIG. 17A is a cross-sectional view of the display apparatus 100A.

In the display apparatus 100A, a substrate 152 and a substrate 151 are attached to each other. In FIG. 16, the substrate 152 is denoted by a dashed line.

The display apparatus 100A includes a display portion 162, the connection portion 140, a circuit 164, a wiring 165, and the like. FIG. 16 illustrates an example in which an IC 173 and an FPC 172 are mounted on the display apparatus 100A. Thus, the structure illustrated in FIG. 16 can be regarded as a display module including the display apparatus 100A, the IC (integrated circuit), and the FPC.

The connection portion 140 is provided outside the display portion 162. The connection portion 140 can be provided along one side or a plurality of sides of the display portion 162. One or a plurality of connection portions 140 can be provided. FIG. 16 illustrates an example in which the connection portion 140 is provided so as to surround the four sides of the display portion. In the connection portion 140, a common electrode of a light-emitting device is electrically connected to a conductive layer so that a potential can be supplied to the common electrode.

As the circuit 164, a scan line driver circuit can be used, for example.

The wiring 165 has a function of supplying a signal and power to the display portion 162 and the circuits 164. The signal and power are input to the wiring 165 from the outside through the FPC 172 or from the IC 173.

FIG. 16 illustrates an example in which the IC 173 is provided on the substrate 151 by a COG method, a COF method, or the like. An IC including a scan line driver circuit, a signal line driver circuit, or the like can be used as the IC 173, for example. Note that the display apparatus 100A and the display module are not necessarily provided with an IC. The IC may be mounted on the FPC by a COF method or the like.

FIG. 17A illustrates an example of cross sections of part of a region including the FPC 172, part of the circuit 164, part of the display portion 162, part of the connection portion 140, and part of a region including an end portion of the display apparatus 100A.

The display apparatus 100A illustrated in FIG. 17A includes a transistor 201, a transistor 205, the light-emitting devices 130a, 130b, and 130c, the color conversion layers 129a and 129b, and the like between the substrate 151 and the substrate 152. The light-emitting devices 130a, 130b, and 130c emit blue light. The color conversion layers 129a and 129b have a function of converting blue light from the light-emitting device 130 into light with different wavelengths.

Here, when a pixel of the display apparatus includes three types of subpixels that are two subpixels including one of the color conversion layers 129a and 129b, which convert light into light with different wavelengths, and a subpixel not including a color conversion layer, the three subpixels can be subpixels of three colors of R, G, and B, for example. Alternatively, subpixels of three colors of yellow (Y), cyan (C), and magenta (M) may be used as a combination of subpixels that emit light of colors different from the above. When the display apparatus includes four subpixels, the four subpixels can be subpixels of four colors of R, G, B, and white (W) or of four colors of R, G, B, and Y, for example.

The light-emitting devices 130a, 130b, and 130c have the same stacked-layer structure as that illustrated in FIG. 1B except that an optical adjustment layer 126 (an optical adjustment layer 126a, an optical adjustment layer 126b, or an optical adjustment layer 126c) is provided between the pixel electrode and the EL layer. The display apparatus 100A in FIG. 17A differs from the display apparatus 100 in FIG. 1B in that the light-emitting device 130a includes the optical adjustment layer 126a, the light-emitting device 130b includes the optical adjustment layer 126b, and the light-emitting device 130c includes the optical adjustment layer 126c. Embodiment 1 can be referred to for the details of the light-emitting devices.

As illustrated in FIG. 17A, the optical adjustment layer 126 included in the light-emitting device 130 preferably has a thickness that differs among the light-emitting devices. For example, when blue light from the light-emitting device 130a is converted into red light, blue light from the light-emitting device 130b is converted into green light, and blue light from the light-emitting device 130c is not converted into light of another color, the thickness of the optical adjustment layer 126a is the largest among the three optical adjustment layers 126, the thickness of the optical adjustment layer 126b is smaller than that of the optical adjustment layer 126a, and the thickness of the optical adjustment layer 126c is the smallest. In this manner, the optical distance (optical path length) in each light-emitting device can vary.

Among the three light-emitting devices, the light-emitting device 130a overlapped by the color conversion layer 129a has the largest optical path length and thus emits light in which light with the longest wavelength (e.g., red light) is intensified. Meanwhile, the light-emitting device 130c has the smallest optical path length and thus emits light in which light with the shortest wavelength (e.g., blue light) is intensified. The light-emitting device 130b overlapped by the color conversion layer 129b emits light in which light with an intermediate wavelength (e.g., green light) is intensified.

With such a structure, the light-emitting layers included in the light-emitting devices 130 need not be formed separately for subpixels of different colors; hence, color display with high color reproducibility can be performed using the light-emitting devices with the same structure.

The fifth layer 114 is provided over the first layer 113a, the second layer 113b, the third layer 113c, and the insulating layers 125 and 127. The common electrode 115 is provided over the fifth layer 114. The protective layer 131 is provided over the light-emitting devices 130a, 130b, and 130c. The protective layer 132 is provided over the protective layer 131.

The protective layer 132 and the substrate 152 are bonded to each other with an adhesive layer 142 therebetween. A solid sealing structure, a hollow sealing structure, or the like can be employed to seal the light-emitting devices. In FIG. 17A, a space between the substrate 152 and the substrate 151 is filled with the adhesive layer 142, i.e., a solid sealing structure is employed. Alternatively, the space may be filled with an inert gas (e.g., nitrogen or argon), i.e., a hollow sealing structure may be employed. Here, the adhesive layer 142 may be provided not to overlap the light-emitting devices. The space may be filled with a resin other than the frame-shaped adhesive layer 142.

The pixel electrodes 111a, 111b, and 111c are each electrically connected to a conductive layer 222b included in the transistor 205 through an opening provided in an insulating layer 214.

End portions of the pixel electrodes 111a, 111b, and 111c and the optical adjustment layers 126a, 126b, and 126c are covered with an insulating layer 121a, and the insulating layer 121a is covered with an insulating layer 121b. The pixel electrodes 111a, 111b, and 111c contain a material that reflects visible light, and the common electrode 115 contains a material that transmits visible light.

The insulating layer that covers the end portions of the pixel electrodes 111a, 111b, and 111c can have a single-layer structure or a stacked-layer structure using one or both of an inorganic insulating film and an organic insulating film. This embodiment shows an example in which the insulating layer 121a is formed using an organic insulating film and the insulating layer 121b is formed using an inorganic insulating film.

Examples of an organic insulating material that can be used for the insulating layer 121a include an acrylic resin, an epoxy resin, a polyimide resin, a polyamide resin, a polyimide-amide resin, a polysiloxane resin, a benzocyclobutene-based resin, and a phenol resin. As the inorganic insulating film that can be used as the insulating layer 121b, an inorganic insulating film that can be used as the protective layers 131 and 132 can be used.

When an inorganic insulating film is used as the insulating layer that covers the end portions of the pixel electrodes 111a, 111b, and 111c, impurities are less likely to enter the light-emitting devices from the outside as compared with the case where an organic insulating film is used; therefore, the reliability of the light-emitting devices can be improved. When an organic insulating film is used as the insulating layer that covers the end portions of the pixel electrodes 111a, 111b, and 111c, the organic insulating film, which has higher step coverage, is less affected by the shape of the pixel electrodes 111a, 111b, and 111c than in the case of using an inorganic insulating film. Consequently, a short circuit of the light-emitting devices can be prevented. Specifically, when an organic insulating film is used as the insulating layer 121a, the insulating layer 121a can be processed into a tapered shape or the like.

The insulating layer that covers the end portions of the pixel electrodes 111a, 111b, and 111c preferably has a two-layer structure using an organic insulating film and an inorganic film, like the insulating layers 121a and 121b, in which case the reliability of the light-emitting devices can be further increased.

In the connection portion 140, the conductive layer 123 is provided over the insulating layer 214. An example is illustrated in which the conductive layer 123 has a stacked-layer structure of a conductive film obtained by processing the same conductive film as the pixel electrodes 111a, 111b, and 111c and a conductive film obtained by processing the same conductive film as the optical adjustment layers 126a, 126b, and 126c. An end portion of the conductive layer 123 is covered with the insulating layer 121a, the insulating layer 121b, the insulating layer 125, and the insulating layer 127. The fifth layer 114 is provided over the conductive layer 123, and the common electrode 115 is provided over the fifth layer 114. The conductive layer 123 and the common electrode 115 are electrically connected to each other through the fifth layer 114. Note that the fifth layer 114 is not necessarily formed in the connection portion 140. In the case where the fifth layer 114 is not formed in the connection portion 140, the conductive layer 123 and the common electrode 115 are electrically connected to each other by direct contact.

The display apparatus 100A has a top-emission structure. Light emitted from the light-emitting device is emitted toward the substrate 152. For the substrate 152, a material having a high visible-light-transmitting property is preferably used.

A stacked structure including the substrate 151 and the components thereover up to the insulating layer 214 corresponds to the layer 101 in Embodiment 1.

The transistor 201 and the transistor 205 are formed over the substrate 151. These transistors can be fabricated using the same material in the same steps.

An insulating layer 211, an insulating layer 213, an insulating layer 215, and the insulating layer 214 are provided in this order over the substrate 151. Part of the insulating layer 211 functions as a gate insulating layer of each transistor. Part of the insulating layer 213 functions as a gate insulating layer of each transistor. The insulating layer 215 is provided to cover the transistors. The insulating layer 214 is provided to cover the transistors and has a function of a planarization layer. Note that the number of gate insulating layers and the number of insulating layers covering the transistors are not limited and may each be one or two or more.

A material through which impurities such as water and hydrogen do not easily diffuse is preferably used for at least one of the insulating layers covering the transistors. This is because such an insulating layer can function as a barrier layer. Such a structure can effectively inhibit diffusion of impurities into the transistors from the outside and increase the reliability of the display apparatus.

An inorganic insulating film is preferably used as each of the insulating layers 211, 213, and 215. As the inorganic insulating film, a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used.

Here, an organic insulating film often has a lower barrier property than an inorganic insulating film. Therefore, the organic insulating film preferably has an opening in the vicinity of an end portion of the display apparatus 100A. This can inhibit entry of impurities from the end portion of the display apparatus 100A through the organic insulating film. Alternatively, the organic insulating film may be formed so that its end portion is positioned on the inner side compared to the end portion of the display apparatus 100A, to prevent the organic insulating film from being exposed at the end portion of the display apparatus 100A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins. The insulating layer 214 may have a stacked-layer structure of an organic insulating film and an inorganic insulating film. The uppermost layer of the insulating layer 214 preferably has a function of an etching protective film. Accordingly, a recess portion can be prevented from being formed in the insulating layer 214 at the time of processing the pixel electrode 111a, the optical adjustment layer 126a, or the like. Alternatively, a recess portion may be formed in the insulating layer 214 at the time of processing the pixel electrode 111a, the optical adjustment layer 126a, or the like.

Each of the transistors 201 and 205 includes a conductive layer 221 functioning as a gate electrode, the insulating layer 211 functioning as a gate insulating layer, a conductive layer 222a and a conductive layer 222b functioning as a source electrode and a drain electrode, a semiconductor layer 231, the insulating layer 213 functioning as a gate insulating layer, and a conductive layer 223 functioning as a gate electrode. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. A top-gate transistor or a bottom-gate transistor can be used. Alternatively, gate electrodes may be provided above and below a semiconductor layer where a channel is formed.

The transistors 201 and 205 have a structure in which the semiconductor layer where a channel is formed is provided between the two gate electrodes. The two gate electrodes may be connected to each other and supplied with the same signal to operate the transistor. Alternatively, the threshold voltage of the transistor may be controlled by applying a potential for controlling the threshold voltage to one of the two gate electrodes and a potential for driving to the other of the two gate electrodes.

There is no particular limitation on the crystallinity of a semiconductor material used in the transistor, and an amorphous semiconductor or a semiconductor having crystallinity (a microcrystalline semiconductor, a polycrystalline semiconductor, a single crystal semiconductor, or a semiconductor partly including crystal regions) can be used. It is preferable to use a semiconductor having crystallinity, in which case deterioration of the transistor characteristics can be suppressed.

The semiconductor layer of the transistor preferably contains a metal oxide (also referred to as an oxide semiconductor). That is, a transistor including a metal oxide in its channel formation region (hereinafter an OS transistor) is preferably used in the display apparatus of this embodiment. Alternatively, a semiconductor layer of a transistor may contain silicon. Examples of silicon include amorphous silicon and crystalline silicon (e.g., low-temperature polysilicon and single crystal silicon).

The semiconductor layer preferably contains indium, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more of aluminum, gallium, yttrium, and tin.

It is particularly preferable that an oxide containing indium (In), gallium (Ga), and zinc (Zn) (also referred to as IGZO) be used for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide are In:M:Zn=1:1:1, 1:1:1.2, 2:1:3, 3:1:2, 4:2:3, 4:2:4.1, 5:1:3, 5:1:6, 5:1:7, 5:1:8, 6:1:6, and 5:2:5 and a composition in the vicinity of any of the above atomic ratios. Note that the vicinity of the atomic ratio includes ±30% of an intended atomic ratio.

For example, in the case of describing an atomic ratio of In:Ga:Zn=4:2:3 or a composition in the vicinity thereof, the case is included in which with the atomic proportion of In being 4, the atomic proportion of Ga is greater than or equal to 1 and less than or equal to 3 and the atomic proportion of Zn is greater than or equal to 2 and less than or equal to 4. In the case of describing an atomic ratio of In:Ga:Zn=5:1:6 or a composition in the vicinity thereof, the case is included in which with the atomic proportion of In being 5, the atomic proportion of Ga is greater than 0.1 and less than or equal to 2 and the atomic proportion of Zn is greater than or equal to 5 and less than or equal to 7. In the case of describing an atomic ratio of In:Ga:Zn=1:1:1 or a composition in the vicinity thereof, the case is included in which with the atomic proportion of In being 1, the atomic proportion of Ga is greater than 0.1 and less than or equal to 2 and the atomic proportion of Zn is greater than 0.1 and less than or equal to 2.

The transistor included in the circuit 164 and the transistor included in the display portion 162 may have the same structure or different structures. One structure or two or more types of structures may be employed for a plurality of transistors included in the circuit 164. Similarly, one structure or two or more types of structures may be employed for a plurality of transistors included in the display portion 162.

FIGS. 17B and 17C illustrate other structure examples of transistors.

A transistor 209 and a transistor 210 each include the conductive layer 221 functioning as a gate electrode, the insulating layer 211 functioning as a gate insulating layer, the semiconductor layer 231 including a channel formation region 231i and a pair of low-resistance regions 231n, the conductive layer 222a connected to one of the low-resistance regions 231n, the conductive layer 222b connected to the other low-resistance region 231n, an insulating layer 225 functioning as a gate insulating layer, the conductive layer 223 functioning as a gate electrode, and the insulating layer 215 covering the conductive layer 223. The insulating layer 211 is positioned between the conductive layer 221 and the channel formation region 231i. The insulating layer 225 is positioned at least between the conductive layer 223 and the channel formation region 231i. Furthermore, an insulating layer 218 covering the transistor may be provided.

FIG. 17B illustrates an example of the transistor 209 in which the insulating layer 225 covers a top surface and a side surface of the semiconductor layer 231. The conductive layer 222a and the conductive layer 222b are connected to the low-resistance regions 231n through openings provided in the insulating layers 225 and 215. One of the conductive layers 222a and 222b functions as a source electrode, and the other functions as a drain electrode.

In the transistor 210 illustrated in FIG. 17C, the insulating layer 225 overlaps the channel formation region 231i of the semiconductor layer 231 and does not overlap the low-resistance regions 231n. The structure illustrated in FIG. 17C is obtained by processing the insulating layer 225 with the conductive layer 223 as a mask, for example. In FIG. 17C, the insulating layer 215 is provided to cover the insulating layer 225 and the conductive layer 223, and the conductive layer 222a and the conductive layer 222b are connected to the low-resistance regions 231n through openings in the insulating layer 215.

In FIG. 17A, a connection portion 204 is provided in a region of the substrate 151 that is not overlapped by the substrate 152. In the connection portion 204, the wiring 165 is electrically connected to the FPC 172 through a conductive layer 166 and a connection layer 242. An example is illustrated in which the conductive layer 166 has a stacked-layer structure of a conductive film obtained by processing the same conductive film as the pixel electrodes 111a, 111b, and 111c and a conductive film obtained by processing the same conductive film as the optical adjustment layers 126a, 126b, and 126c. The conductive layer 166 is exposed on the top side of the connection portion 204. Thus, the connection portion 204 and the FPC 172 can be electrically connected to each other through the connection layer 242.

A light-blocking layer 117 is preferably provided on a surface of the substrate 152 that faces the substrate 151. The light-blocking layer 117 can be provided between adjacent light-emitting devices and in the connection portion 140 and the circuit 164, for example. In addition, the color conversion layers 129a and 129b may be provided on the surface of the substrate 152 that faces the substrate 151. In FIG. 17A, when the substrate 152 is considered as the bottom, the color conversion layers 129a and 129b are provided to cover part of the light-blocking layer 117.

A variety of optical members can be arranged on the outer surface of the substrate 152. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, an impact-absorbing layer, or the like may be provided on the outer surface of the substrate 152.

Providing the protective layers 131 and 132 that cover the light-emitting devices can inhibit entry of impurities such as water into the light-receiving devices, thereby increasing the reliability of the light-receiving devices.

For each of the substrates 151 and 152, glass, quartz, ceramic, sapphire, a resin, a metal, an alloy, a semiconductor, or the like can be used. The substrate on the side from which light from the light-emitting devices is extracted is formed using a material that transmits the light. When the substrates 151 and 152 are formed using a flexible material, the flexibility of the display apparatus can be increased. Furthermore, a polarizing plate may be used as the substrate 151 or the substrate 152.

For each of the substrate 151 and the substrate 152, any of the following can be used, for example: polyester resins such as polyethylene terephthalate (PET) and polyethylene naphthalate (PEN), a polyacrylonitrile resin, an acrylic resin, a polyimide resin, a polymethyl methacrylate resin, a polycarbonate (PC) resin, a polyethersulfone (PES) resin, polyamide resins (e.g., nylon and aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, and cellulose nanofiber. Glass that is thin enough to have flexibility may be used as one or both of the substrate 151 and the substrate 152.

In the case where a circularly polarizing plate overlaps the display apparatus, a highly optically isotropic substrate is preferably used as the substrate included in the display apparatus. A highly optically isotropic substrate has a low birefringence (i.e., a small amount of birefringence).

The absolute value of a retardation (phase difference) of a highly optically isotropic substrate is preferably less than or equal to 30 nm, further preferably less than or equal to 20 nm, still further preferably less than or equal to 10 nm.

Examples of the film having high optical isotropy include a triacetyl cellulose (TAC, also referred to as cellulose triacetate) film, a cycloolefin polymer (COP) film, a cycloolefin copolymer (COC) film, and an acrylic film.

When a film used as the substrate absorbs water, the shape of the display panel might be changed, e.g., creases might be caused. Thus, as the substrate, a film with a low water absorption rate is preferably used. For example, the water absorption rate of the film is preferably 1% or lower, further preferably 0.1% or lower, still further preferably 0.01% or lower.

For the adhesive layer 142, any of a variety of curable adhesives such as a reactive curable adhesive, a thermosetting curable adhesive, an anaerobic adhesive, and a photocurable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. A two-component-mixture-type resin may be used. An adhesive sheet or the like may be used.

As the connection layer 242, an anisotropic conductive film (ACF), an anisotropic conductive paste (ACP), or the like can be used.

As materials for the gate electrodes, the source electrode, and the drain electrode of a transistor and conductive layers functioning as wirings and electrodes included in the display apparatus, any of metals such as aluminum, titanium, chromium, nickel, copper, yttrium, zirconium, molybdenum, silver, tantalum, and tungsten, or an alloy containing any of these metals as its main component can be used, for example. A single-layer structure or a stacked-layer structure including a film containing any of these materials can be used.

As a light-transmitting conductive material, a conductive oxide such as indium oxide, indium tin oxide, indium zinc oxide, zinc oxide, or zinc oxide containing gallium, or graphene can be used. It is also possible to use a metal material such as gold, silver, platinum, magnesium, nickel, tungsten, chromium, molybdenum, iron, cobalt, copper, palladium, or titanium or an alloy material containing any of these metal materials. Alternatively, a nitride of the metal material (e.g., titanium nitride) or the like may be used. Note that in the case of using the metal material or the alloy material (or the nitride thereof), the thickness is preferably set small enough to transmit light. Alternatively, stacked films of any of the above materials can be used for the conductive layers. For example, stacked films of indium tin oxide and an alloy of silver and magnesium are preferably used, in which case the conductivity can be increased. They can also be used for conductive layers such as wirings and electrodes included in the display apparatus, and conductive layers (e.g., a conductive layer functioning as the pixel electrode or the common electrode) included in a light-emitting device.

Examples of insulating materials that can be used for insulating layers include resins such as an acrylic resin and an epoxy resin, and inorganic insulating materials such as silicon oxide, silicon oxynitride, silicon nitride oxide, silicon nitride, and aluminum oxide.

[Display Apparatus 100B]

Figure 18:
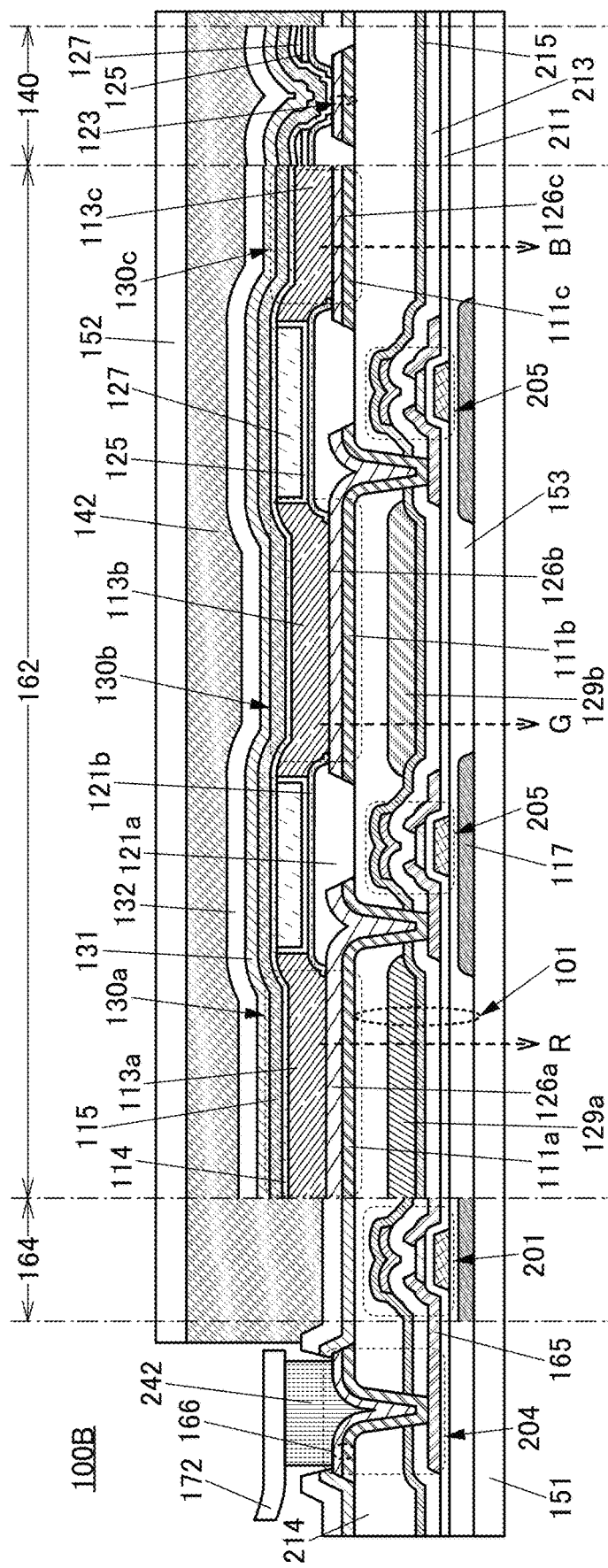
FIG. 18 is a cross-sectional view illustrating an example of a display apparatus.

A display apparatus 100B illustrated in FIG. 18 differs from the display apparatus 100A mainly in having a bottom-emission structure. Note that the description of portions similar to those of the display apparatus 100A is omitted.

Light emitted from the light-emitting devices is emitted toward the substrate 151. For the substrate 151, a material having a high visible-light-transmitting property is preferably used. On the other hand, there is no limitation on the light-transmitting property of a material used for the substrate 152.

In the display apparatus 100B, the pixel electrodes 111a, 111b, and 111c and the optical adjustment layers 126a, 126b, and 126c contain a material that transmits visible light, and the common electrode 115 contains a material that reflects visible light. Here, the conductive layer 166 that is obtained by processing the same conductive film as the pixel electrodes 111a, 111b, and 111c and the optical adjustment layers 126a, 126b, and 126c also contains a material that transmits visible light.

The light-blocking layer 117 is preferably provided between the substrate 151 and the transistor 201 and between the substrate 151 and the transistor 205. FIG. 18 illustrates an example in which the light-blocking layer 117 is provided over the substrate 151, an insulating layer 153 is provided over the light-blocking layer 117, and the transistors 201 and 205 and the like are provided over the insulating layer 153.

Moreover, in the display apparatus 100B, the color conversion layers 129a and 129b are provided between the insulating layer 215 and the insulating layer 214. End portions of the color conversion layers 129a and 129b preferably overlap the light-blocking layer 117.

This embodiment can be combined with any of the other embodiments as appropriate.

Embodiment 4

In this embodiment, a display apparatus of one embodiment of the present invention will be described with reference to FIGS. 19A and 19B and FIGS. 20 to 24.

The display apparatus in this embodiment can be a high-resolution display apparatus. Accordingly, the display apparatus in this embodiment can be used for display portions of information terminals (wearable devices) such as watch-type and bracelet-type information terminals and display portions of wearable devices capable of being worn on the head, such as a virtual reality (VR) device like a head mounted display and a glasses-type augmented reality (AR) device.

[Display Module]

Figure 19A:
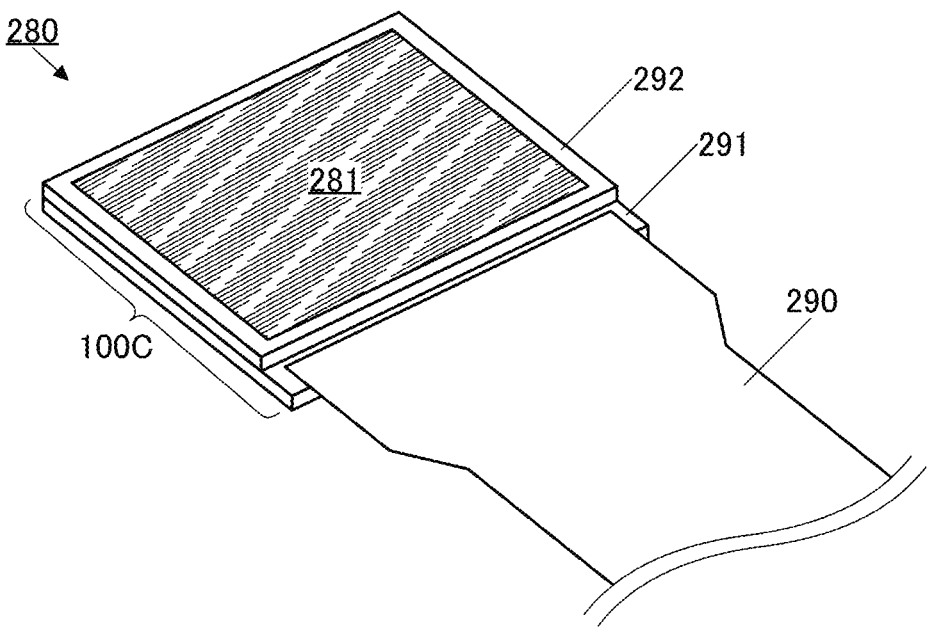
FIGS. 19A and 19B are perspective views illustrating an example of a display module.

FIG. 19A is a perspective view of a display module 280. The display module 280 includes a display apparatus 100C and an FPC 290. Note that the display apparatus included in the display module 280 is not limited to the display apparatus 100C and may be any of display apparatuses 100D to 100G described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 19B:
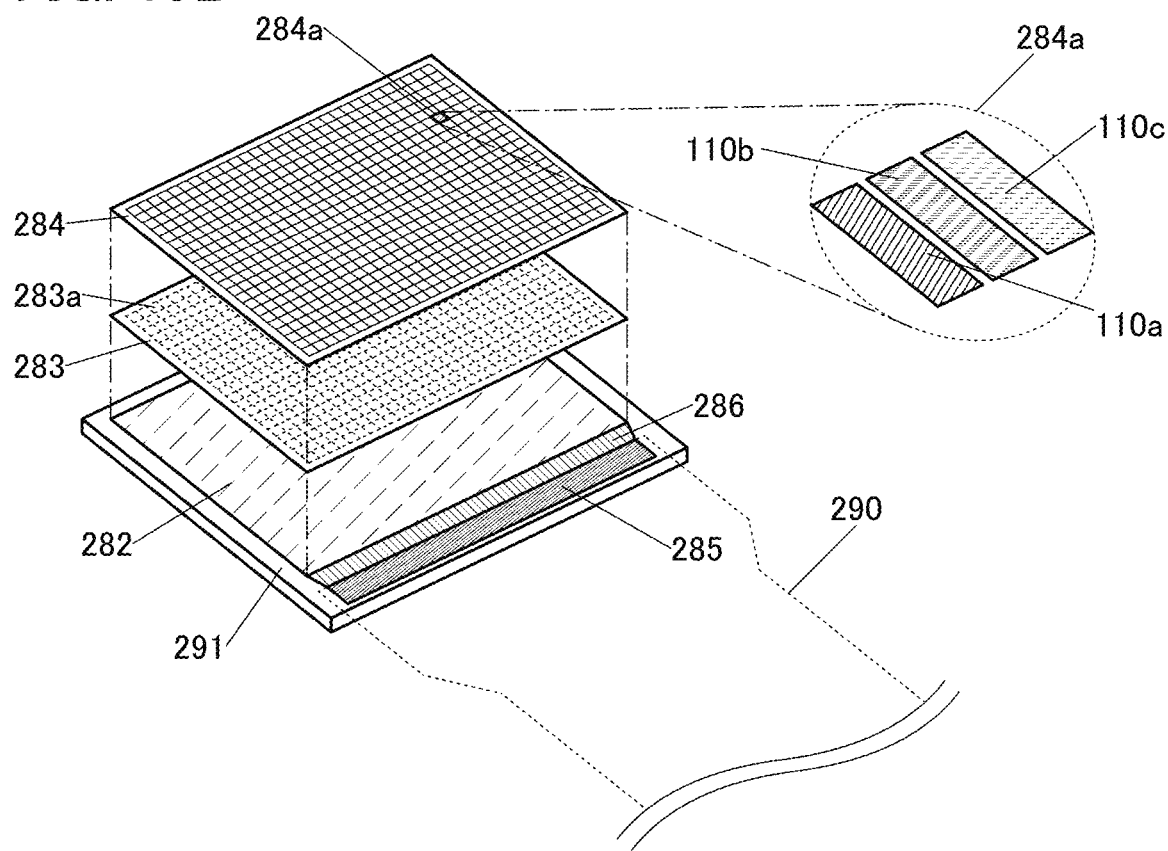

FIG. 19B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion over the substrate 291 that is not overlapped by the pixel portion 284. The terminal portion 285 and the circuit portion 282 are electrically connected to each other through a wiring portion 286 formed of a plurality of wirings.

The pixel portion 284 includes a plurality of pixels 284a arranged periodically. An enlarged view of one pixel 284a is illustrated on the right side of FIG. 19B. The pixel 284a includes the subpixel 110a, the subpixel 110b, and the subpixel 110c. The foregoing embodiment can be referred to for the structures of the subpixels 110a, 110b, and 110c and their surroundings. A plurality of subpixels can be arranged in a stripe pattern as illustrated in FIG. 19B. Alternatively, a variety of arrangement methods for light-emitting devices, such as delta arrangement or pentile arrangement, can be employed.

The pixel circuit portion 283 includes a plurality of pixel circuits 283a arranged periodically.

One pixel circuit 283a is a circuit that controls light emission of three light-emitting devices included in one pixel 284a. One pixel circuit 283a may be provided with three circuits each of which controls light emission of one light-emitting device. For example, the pixel circuit 283a can include at least one selection transistor, one current control transistor (driving transistor), and a capacitor for one light-emitting device. In this case, a gate signal is input to a gate electrode of the selection transistor, and a source signal is input to one of a source electrode and a drain electrode of the selection transistor. Thus, an active-matrix display apparatus is achieved.

The circuit portion 282 includes a circuit for driving the pixel circuits 283a in the pixel circuit portion 283. For example, the circuit portion 282 preferably includes one or both of a gate line driver circuit and a source line driver circuit. The circuit portion 282 may also include at least one of an arithmetic circuit, a memory circuit, a power supply circuit, and the like.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284a can be arranged extremely densely and thus the display portion 281 can have extremely high resolution. For example, the pixels 284a are preferably arranged in the display portion 281 with a resolution greater than or equal to 2000 ppi, preferably greater than or equal to 3000 ppi, further preferably greater than or equal to 5000 ppi, still further preferably greater than or equal to 6000 ppi, and less than or equal to 20000 ppi or less than or equal to 30000 ppi.

Such a display module 280 has extremely high resolution, and thus can be suitably used for a VR device such as a head mounted display or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be favorably used in a display portion of a wearable electronic device, such as a wrist watch.

[Display Apparatus 100C]

Figure 20:
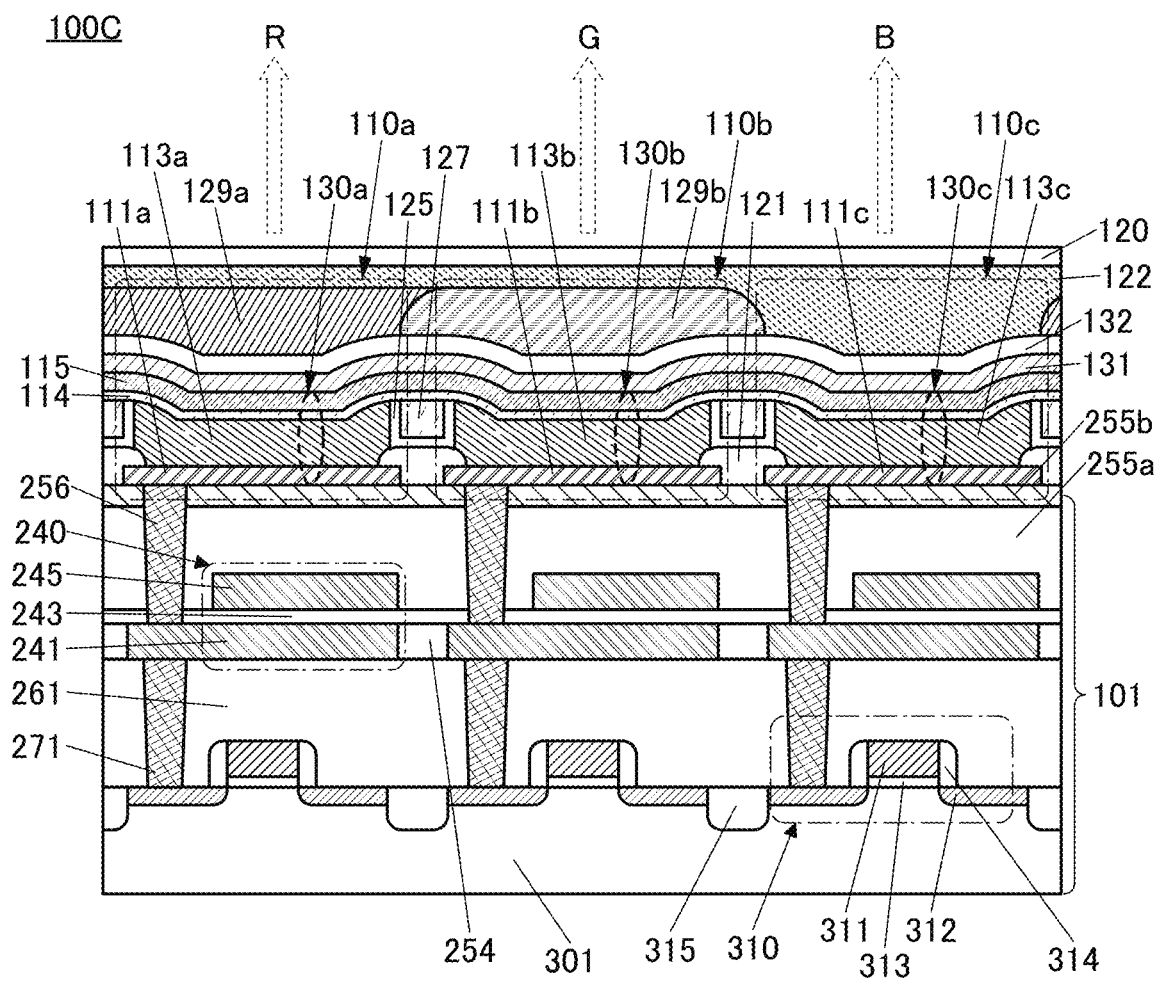
FIG. 20 is a cross-sectional view illustrating an example of a display apparatus.

The display apparatus 100C illustrated in FIG. 20 includes a substrate 301, the subpixels 110a, 110b and 110c, a capacitor 240, and a transistor 310. The subpixel 110a includes the light-emitting device 130a and the color conversion layer 129a. The subpixel 110b includes the light-emitting device 130b and the color conversion layer 129b.

The subpixel 110c includes the light-emitting device 130c and does not include a color conversion layer. Note that a color conversion layer that overlaps the light-emitting device 130c may be provided in the subpixel 110c.

The substrate 301 corresponds to the substrate 291 illustrated in FIGS. 19A and 19B. A stacked structure including the substrate 301 and the components thereover up to an insulating layer 255b corresponds to the layer 101 in Embodiment 1.

The transistor 310 includes a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance regions 312 are regions where the substrate 301 is doped with an impurity, and function as a source and a drain. The insulating layer 314 is provided to cover a side surface of the conductive layer 311 and functions as an insulating layer.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 between the conductive layers 241 and 245. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping the conductive layer 241 with the insulating layer 243 therebetween.

An insulating layer 255a is provided to cover the capacitor 240. The insulating layer 255b is provided over the insulating layer 255a. The light-emitting devices 130a, 130b, and 130c and the like are provided over the insulating layer 255b. This embodiment shows an example in which the light-emitting devices 130a, 130b, and 130c have the stacked-layer structure illustrated in FIG. 1B. Side surfaces of the pixel electrodes 111a, 111b, and 111c are covered with the insulating layer 121. Side surfaces of the first layer 113a, the second layer 113b, and the third layer 113c are covered with the insulating layers 125 and 127. The fifth layer 114 is provided over the first layer 113a, the second layer 113b, the third layer 113c, and the insulating layers 125 and 127. The common electrode 115 is provided over the fifth layer 114. The protective layer 131 is provided over the light-emitting devices 130a, 130b, and 130c. The protective layer 132 is provided over the protective layer 131. The color conversion layers 129a and 129b are provided over the protective layer 132. The substrate 120 is attached above the color conversion layers 129a and 129b with the resin layer 122. Embodiment 1 can be referred to for details of the light-emitting devices and the components thereover up to the substrate 120. The substrate 120 corresponds to the substrate 292 in FIG. 19A.

As each of the insulating layers 255a and 255b, a variety of inorganic insulating films such as an oxide insulating film, a nitride insulating film, an oxynitride insulating film, and a nitride oxide insulating film can be suitably used. As the insulating layer 255a, an oxide insulating film or an oxynitride insulating film, such as a silicon oxide film, a silicon oxynitride film, or an aluminum oxide film, is preferably used. As the insulating layer 255b, a nitride insulating film or a nitride oxide insulating film, such as a silicon nitride film or a silicon nitride oxide film, is preferably used. Specifically, it is preferred that a silicon oxide film be used as the insulating layer 255a and a silicon nitride film be used as the insulating layer 255b. The insulating layer 255b preferably has a function of an etching protective film. Alternatively, a nitride insulating film or a nitride oxide insulating film may be used as the insulating layer 255a, and an oxide insulating film or an oxynitride insulating film may be used as the insulating layer 255b. Although this embodiment shows an example in which a recess portion is not provided in the insulating layer 255b, a recess portion may be provided in the insulating layer 255b.

The pixel electrode of the light-emitting device is electrically connected to one of the source and the drain of the transistor 310 through a plug 256 embedded in the insulating layers 255a and 255b, the conductive layer 241 embedded in the insulating layer 254, and the plug 271 embedded in the insulating layer 261. The top surface of the insulating layer 255b and the top surface of the plug 256 are level with or substantially level with each other. A variety of conductive materials can be used for the plugs.

[Display Apparatus 100D]

Figure 21:
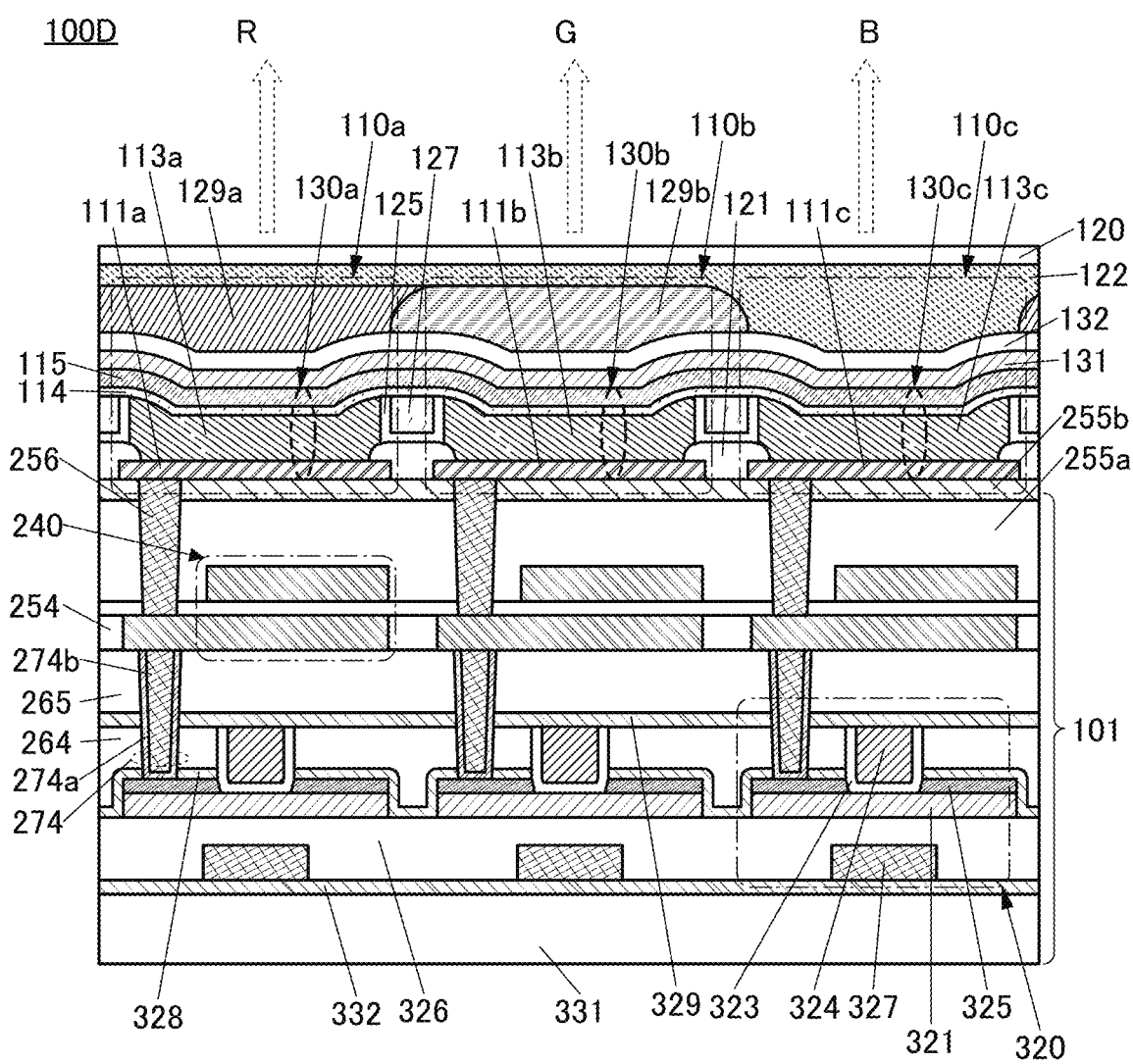
FIG. 21 is a cross-sectional view illustrating an example of a display apparatus.

A display apparatus 100D illustrated in FIG. 21 differs from the display apparatus 100C mainly in a structure of a transistor. Note that portions similar to those in the display apparatus 100C are not be described in some cases.

A transistor 320 is a transistor that contains a metal oxide (also referred to as an oxide semiconductor) in a semiconductor layer where a channel is formed (i.e., an OS transistor).

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIGS. 19A and 19B. A stacked structure including the substrate 331 and the components thereover up to the insulating layer 255b corresponds to the layer 101 in Embodiment 1. As the substrate 331, an insulating substrate or a semiconductor substrate can be used.

An insulating layer 332 is provided over the substrate 331. The insulating layer 332 functions as a barrier layer that prevents diffusion of impurities such as water or hydrogen from the substrate 331 into the transistor 320 and release of oxygen from the semiconductor layer 321 to the insulating layer 332 side. As the insulating layer 332, it is preferable to use, for example, a film in which hydrogen or oxygen is less likely to diffuse than in a silicon oxide film, such as an aluminum oxide film, a hafnium oxide film, or a silicon nitride film.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. A metal oxide film having semiconductor characteristics (also referred to as an oxide semiconductor film) is preferably used as the semiconductor layer 321. A material that can be used for the semiconductor layer 321 will be described in detail later.

The pair of conductive layers 325 are provided on and in contact with the semiconductor layer 321 and function as a source electrode and a drain electrode.

An insulating layer 328 is provided to cover top and side surfaces of the pair of conductive layers 325, a side surface of the semiconductor layer 321, and the like, and an insulating layer 264 is provided over the insulating layer 328. The insulating layer 328 functions as a barrier layer that prevents diffusion of impurities such as water or hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layers 328 and 264. The insulating layer 323 that is in contact with side surfaces of the insulating layers 264 and 328, a side surface of the conductive layer 325, and the top surface of the semiconductor layer 321 and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that they are level with or substantially level with each other, and insulating layers 329 and 265 are provided to cover these layers.

The insulating layers 264 and 265 each function as an interlayer insulating layer. The insulating layer 329 functions as a barrier layer that prevents diffusion of impurities such as water or hydrogen from the insulating layer 265 or the like into the transistor 320. As the insulating layer 329, an insulating film similar to the insulating layers 328 and 332 can be used.

A plug 274 electrically connected to one of the pair of conductive layers 325 is provided to be embedded in the insulating layers 265, 329, and 264. Here, the plug 274 preferably includes a conductive layer 274a that covers a side surface of an opening formed in the insulating layers 265, 329, 264, and 328 and part of the top surface of the conductive layer 325, and a conductive layer 274b in contact with the top surface of the conductive layer 274a. For the conductive layer 274a, a conductive material in which hydrogen and oxygen are less likely to diffuse is preferably used.

The structures of the insulating layer 254 and the components thereover up to the substrate 120 in the display apparatus 100D are similar to those in the display apparatus 100C.

[Display Apparatus 100E]

Figure 22:
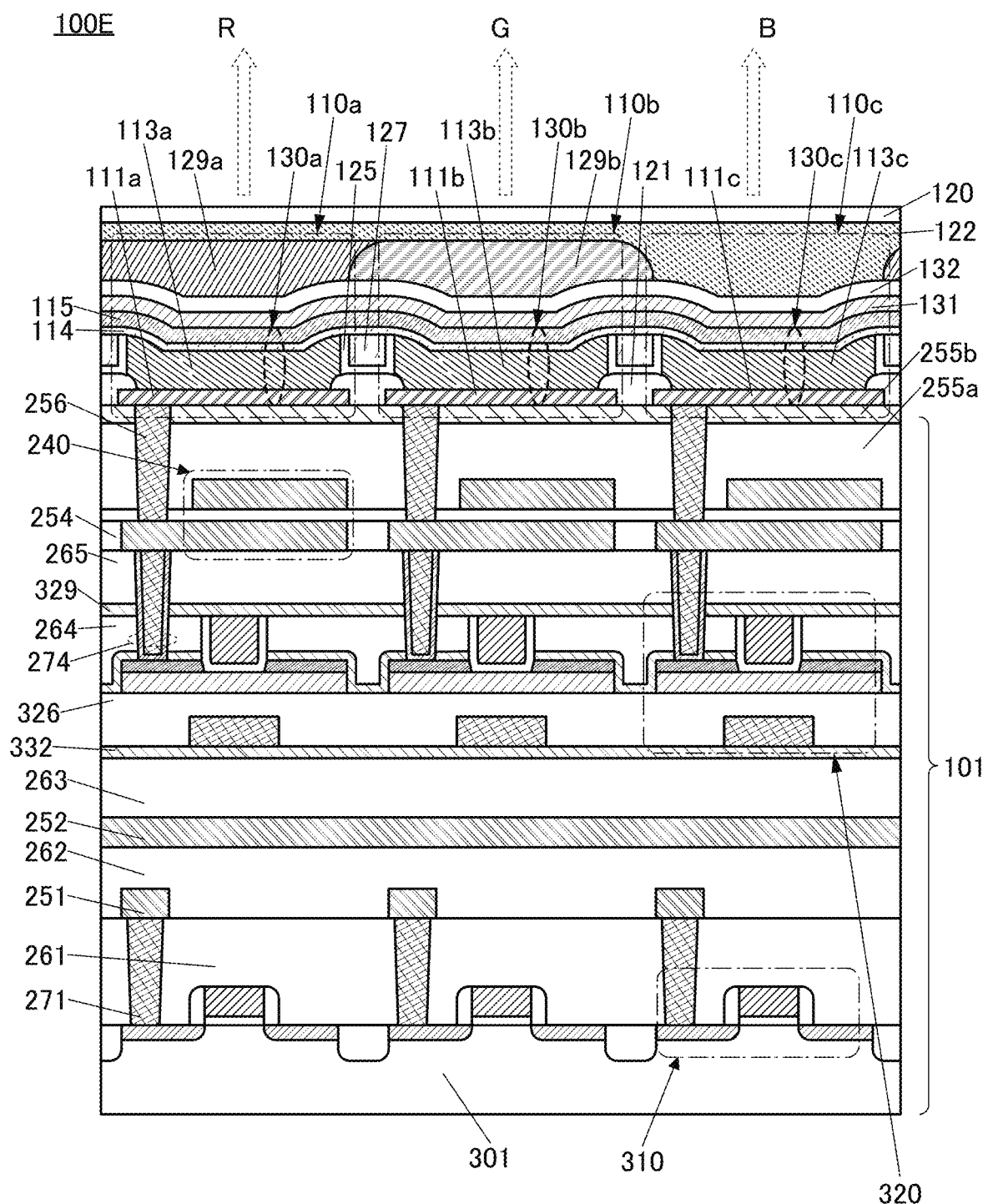
FIG. 22 is a cross-sectional view illustrating an example of a display apparatus.

A display apparatus 100E illustrated in FIG. 22 has a structure in which the transistor 310 whose channel is formed in the substrate 301 and the transistor 320 including a metal oxide in the semiconductor layer where the channel is formed are stacked. Note that portions similar to those in the display apparatuses 100C and 100D are not be described in some cases.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit for driving the pixel circuit (a gate line driver circuit or a source line driver circuit). The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display apparatus can be downsized as compared with the case where a driver circuit is provided around a display portion.

[Display Apparatus 100F]

Figure 23:
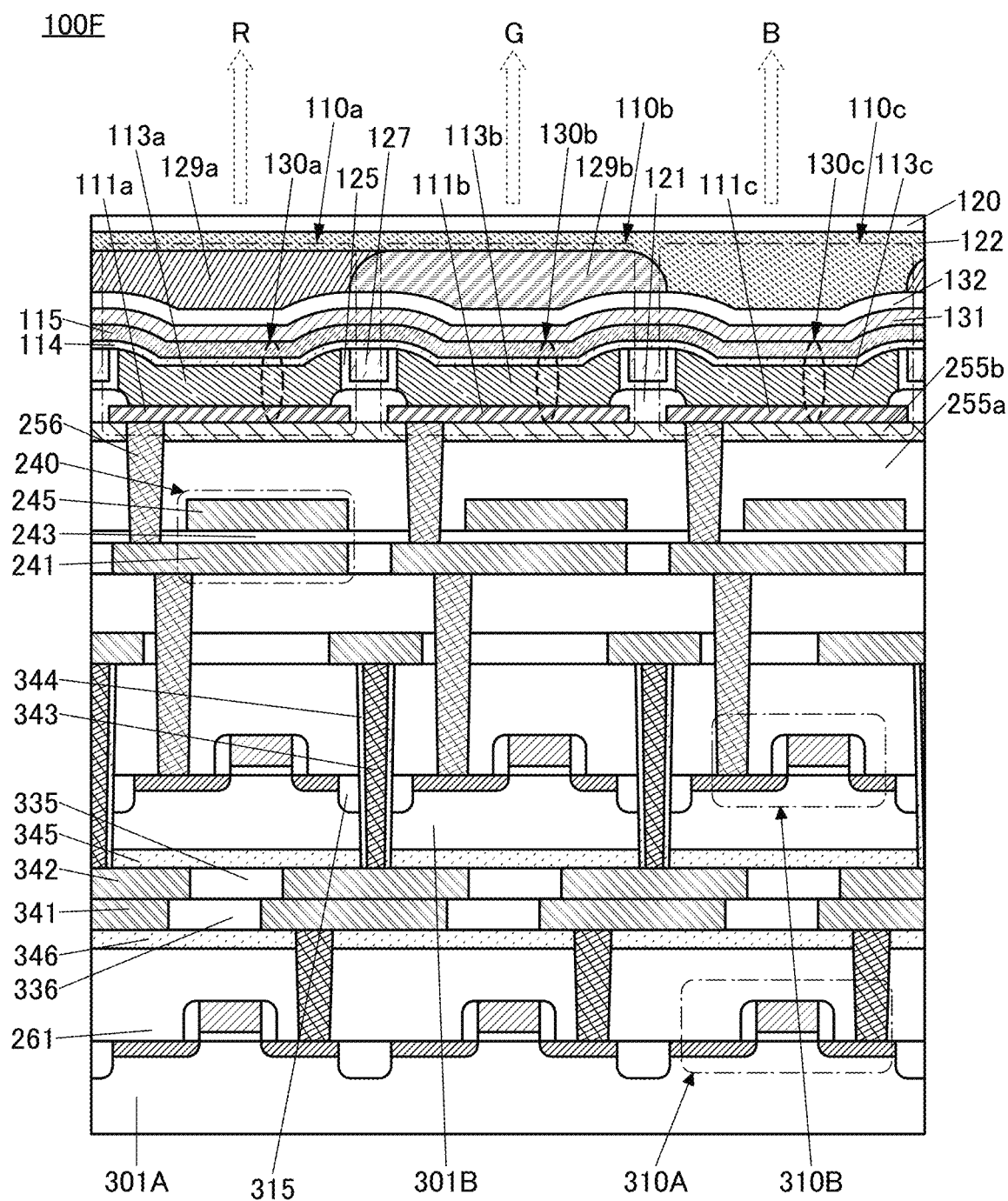
FIG. 23 is a cross-sectional view illustrating an example of a display apparatus.

A display apparatus 100F illustrated in FIG. 23 has a structure where a transistor 310A and a transistor 310B in each of which a channel is formed in a semiconductor substrate are stacked.

In the display apparatus 100F, a substrate 301B provided with the transistor 310B, the capacitor 240, and the light-emitting devices is attached to a substrate 301A provided with the transistor 310A.

Here, an insulating layer 345 is preferably provided on the bottom surface of the substrate 301B. An insulating layer 346 is preferably provided over the insulating layer 261 over the substrate 301A. The insulating layers 345 and 346 function as protective layers and can inhibit diffusion of impurities into the substrate 301B and the substrate 301A. As the insulating layers 345 and 346, an inorganic insulating film that can be used as the protective layers 131 and 132 or the insulating layer 332 illustrated in FIG. 22 can be used.

The substrate 301B is provided with a plug 343 that penetrates the substrate 301B and the insulating layer 345. An insulating layer 344 is preferably provided to cover a side surface of the plug 343. The insulating layer 344 functions as a protective layer and can inhibit diffusion of impurities into the substrate 301B. As the insulating layer 344, an inorganic insulating film that can be used as the protective layers 131 and 132 or the insulating layer 332 illustrated in FIG. 22 can be used.

A conductive layer 342 is provided under the insulating layer 345 on the rear surface of the substrate 301B (the surface opposite to the substrate 120). The conductive layer 342 is preferably provided to be embedded in the insulating layer 335. The bottom surfaces of the conductive layer 342 and the insulating layer 335 are preferably planarized. Here, the conductive layer 342 is electrically connected to the plug 343.

A conductive layer 341 is provided over the insulating layer 346 over the substrate 301A. The conductive layer 341 is preferably provided to be embedded in the insulating layer 336. The top surfaces of the conductive layer 341 and the insulating layer 336 are preferably planarized.

The conductive layer 341 and the conductive layer 342 are bonded to each other, whereby the substrate 301A and the substrate 301B are electrically connected to each other. Here, improving the flatness of a plane formed by the conductive layer 342 and the insulating layer 335 and a plane formed by the conductive layer 341 and the insulating layer 336 allows the conductive layers 341 and 342 to be bonded to each other favorably.

The conductive layers 341 and 342 are preferably formed using the same conductive material. For example, it is possible to use a metal film containing an element selected from Al, Cr, Cu, Ta, Ti, Mo, and W, or a metal nitride film containing any of the above elements as a component (a titanium nitride film, a molybdenum nitride film, or a tungsten nitride film). Copper is particularly preferably used for the conductive layers 341 and 342. In that case, it is possible to employ copper-to-copper (Cu-to-Cu) direct bonding (a technique for achieving electrical continuity by connecting copper (Cu) pads).

[Display Apparatus 100G]

Figure 24:
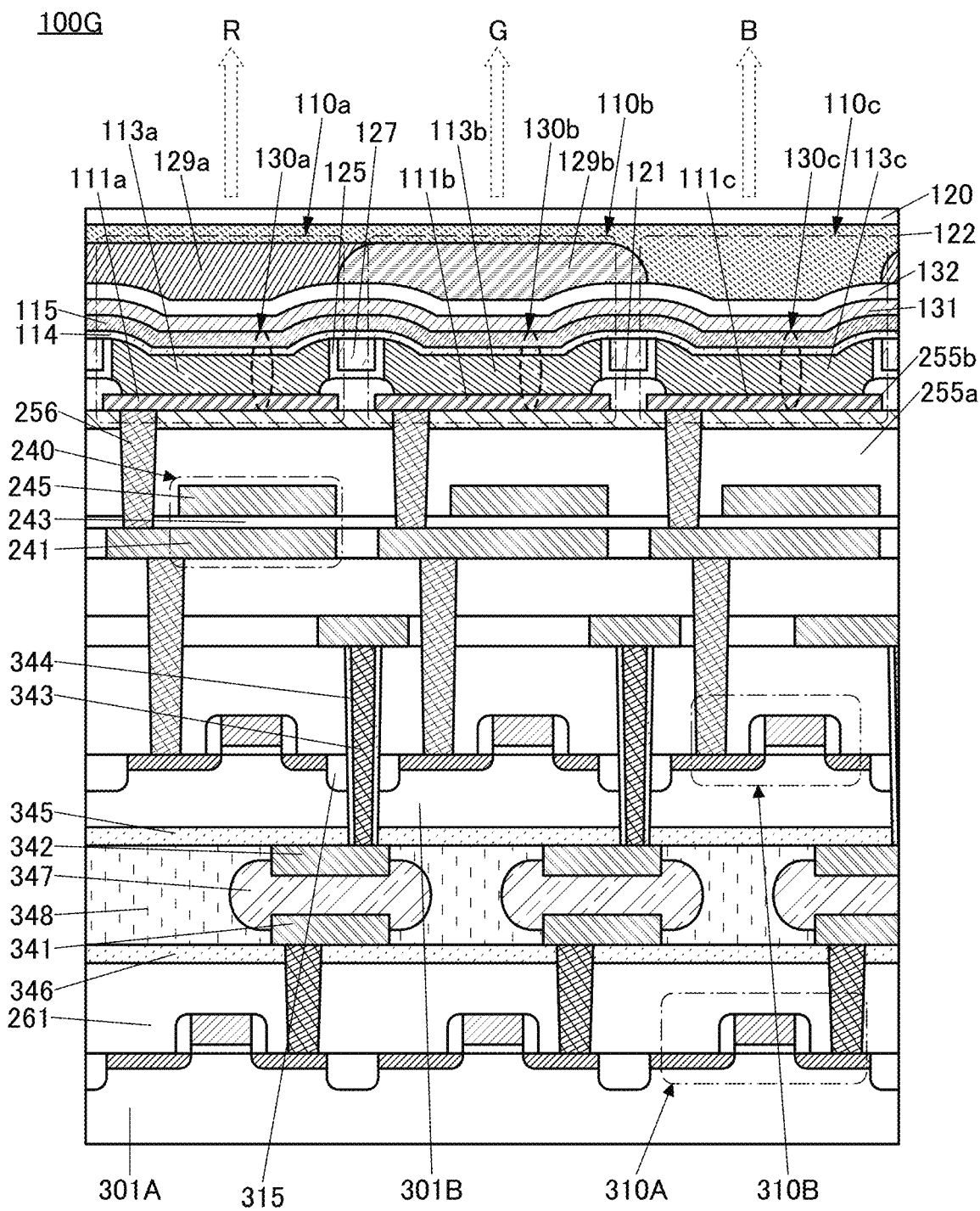
FIG. 24 is a cross-sectional view illustrating an example of a display apparatus.

Although FIG. 23 illustrates an example in which Cu-to-Cu direct bonding is used to bond the conductive layer 341 and the conductive layer 342, the present invention is not limited thereto. As illustrated in FIG. 24, the conductive layer 341 and the conductive layer 342 may be bonded to each other through a bump 347 in a display apparatus 100G.

As illustrated in FIG. 24, providing the bump 347 between the conductive layer 341 and the conductive layer 342 enables the conductive layers 341 and 342 to be electrically connected to each other. The bump 347 can be formed using a conductive material containing gold (Au), nickel (Ni), indium (In), tin (Sn), or the like, for example. As another example, solder may be used for the bump 347. An adhesive layer 348 may be provided between the insulating layer 345 and the insulating layer 346. In the case where the bump 347 is provided, the insulating layer 335 and the insulating layer 336 illustrated in FIG. 23 may be omitted.

This embodiment can be combined with any of the other embodiments as appropriate.

Embodiment 5

In this embodiment, structure examples of a transistor that can be used in the display apparatus of one embodiment of the present invention will be described. Specifically, the case of using a transistor including silicon as a semiconductor where a channel is formed will be described.

One embodiment of the present invention is a display apparatus including light-emitting devices and pixel circuits. The display apparatus includes, for example, light-emitting devices that emit blue light and color conversion layers having a function of converting the wavelength of light from the light-emitting devices, and can perform full-color display by including three types of subpixels that emit red (R) light, green (G) light, and blue (B) light.

Transistors containing silicon in their semiconductor layers where a channel is formed are preferably used as all transistors included in the pixel circuit for driving the light-emitting device. Examples of silicon include single crystal silicon, polycrystalline silicon, and amorphous silicon. In particular, transistors containing low-temperature polysilicon (LTPS) in their semiconductor layers (such transistors are referred to as LTPS transistors below) are preferably used. The LTPS transistor has high field-effect mobility and excellent frequency characteristics.

With the use of the transistors using silicon, such as the LTPS transistors, a circuit required to drive at a high frequency (e.g., a source driver circuit) can be formed on the same substrate as a display portion. This allows simplification of an external circuit mounted on the display apparatus and a reduction in costs of parts and mounting costs.

It is preferable to use a transistor containing a metal oxide (hereinafter also referred to as an oxide semiconductor) in a semiconductor layer where a channel is formed (hereinafter such a transistor is also referred to as an OS transistor) as at least one of the transistors included in the pixel circuit. The OS transistor has much higher field-effect mobility than a transistor containing amorphous silicon. In addition, the OS transistor has an extremely low leakage current between a source and a drain in an off state (hereinafter also referred to as off-state current), and charge accumulated in a capacitor that is connected in series to the transistor can be held for a long period. Furthermore, the power consumption of the display apparatus can be reduced with the OS transistor.

When an LTPS transistor is used as one or more of the transistors included in the pixel circuit and an OS transistor is used as the rest, the display apparatus can have low power consumption and high driving capability. A structure where an LTPS transistor and an OS transistor are used in combination may be referred to as LTPO. As a favorable example, it is preferable that an OS transistor be used as a transistor functioning as a switch for controlling electrical continuity between wirings and an LTPS transistor be used as a transistor for controlling current, for instance.

For example, one of the transistors included in the pixel circuit functions as a transistor for controlling a current flowing through the light-emitting device and can be referred to as a driving transistor. One of a source and a drain of the driving transistor is electrically connected to the pixel electrode of the light-emitting device. An LTPS transistor is preferably used as the driving transistor. Accordingly, the amount of current flowing through the light-emitting device can be increased in the pixel circuit.

Another transistor included in the pixel circuit functions as a switch for controlling selection and non-selection of the pixel and can be referred to as a selection transistor. A gate of the selection transistor is electrically connected to a gate line, and one of a source and a drain thereof is electrically connected to a source line (signal line). An OS transistor is preferably used as the selection transistor. Accordingly, the gray level of the pixel can be maintained even with an extremely low frame frequency (e.g., 1 fps or less); thus, power consumption can be reduced by stopping the driver in displaying a still image.

More specific structure examples will be described below with reference to drawings.

[Structure Example 2 of Display Apparatus]

Figure 25A:
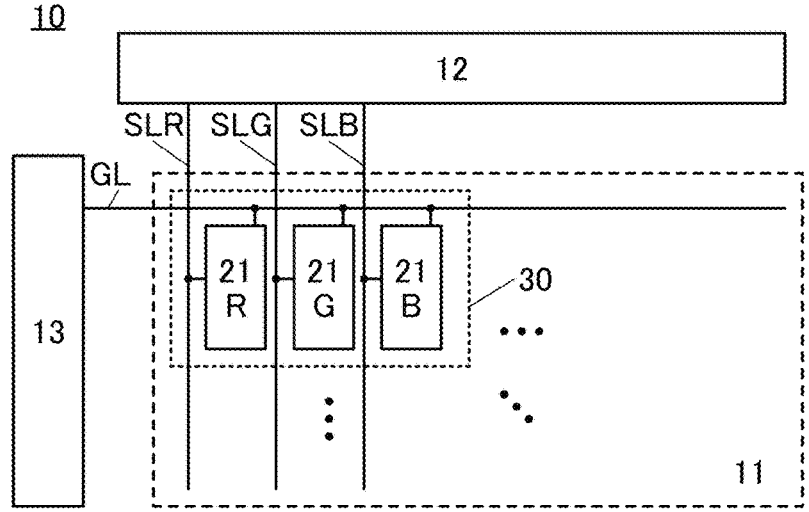
FIG. 25A is a block diagram illustrating an example of a display apparatus.

FIG. 25A is a block diagram of a display apparatus 10. The display apparatus 10 includes a display portion 11, a driver circuit portion 12, a driver circuit portion 13, and the like.

The display portion 11 includes a plurality of pixels 30 arranged in a matrix. The pixels 30 each include a subpixel 21R, a subpixel 21G, and a subpixel 21B. The subpixel 21R, the subpixel 21G, and the subpixel 21B each include a light-emitting device functioning as a display device and a color conversion layer.

The pixel 30 is electrically connected to a wiring GL, a wiring SLR, a wiring SLG, and a wiring SLB. The wirings SLR, SLG, and SLB are electrically connected to the driver circuit portion 12. The wiring GL is electrically connected to the driver circuit portion 13. The driver circuit portion 12 functions as a source line driver circuit (also referred to as a source driver), and the driver circuit portion 13 functions as a gate line driver circuit (also referred to as a gate driver). The wiring GL functions as a gate line, and the wirings SLR, SLG, and SLB function as source lines.

The subpixel 21R includes a light-emitting device that emits blue light and a color conversion layer that converts blue light into light having a red wavelength. The subpixel 21G includes a light-emitting device that emits blue light and a color conversion layer that converts blue light into light having a green wavelength. The subpixel 21B includes a light-emitting device that emits blue light and a color conversion layer that converts blue light into more vivid blue light. Thus, the display apparatus 10 can perform full-color display. Note that the subpixel 21B may be configured not to include a color conversion layer. Alternatively, the pixel 30 may include a subpixel that emits light of another color. For example, the pixel 30 may include, in addition to the three subpixels, a subpixel that emits white light or a subpixel that emits yellow light.

The wiring GL is electrically connected to the subpixel 21R, the subpixel 21G, and the subpixel 21B arranged in the row direction (the extending direction of the wiring GL). The wiring SLR, the wiring SLG, and the wiring SLB are respectively electrically connected to the subpixels 21R, the subpixels 21G, and the subpixels 21B (not illustrated) arranged in the column direction (the extending direction of the wiring SLR and the like).

[Structure Example of Pixel Circuit]

Figure 25B:
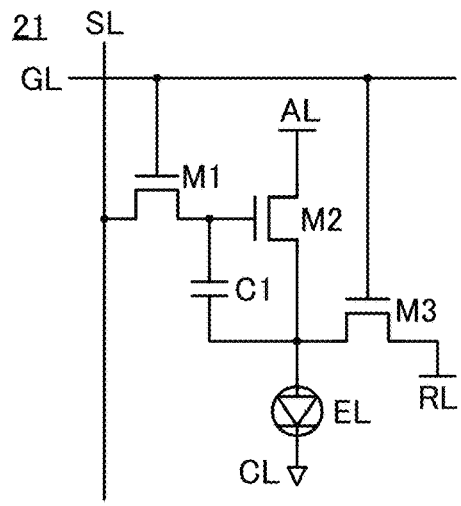
FIGS. 25B to 25D illustrate examples of a pixel circuit.

FIG. 25B illustrates an example of a circuit diagram of a pixel 21 that can be used as the subpixel 21R, the subpixel 21G, and the subpixel 21B. The pixel 21 includes a transistor M1, a transistor M2, a transistor M3, a capacitor C1, and a light-emitting device EL. The wiring GL and a wiring SL are electrically connected to the pixel 21. The wiring SL corresponds to any of the wiring SLR, the wiring SLG, and the wiring SLB illustrated in FIG. 25A.

A gate of the transistor M1 is electrically connected to the wiring GL, one of a source and a drain of the transistor M1 is electrically connected to the wiring SL, and the other of the source and the drain of the transistor M1 is electrically connected to one electrode of the capacitor Cl and a gate of the transistor M2. One of a source and a drain of the transistor M2 is electrically connected to a wiring AL, and the other of the source and the drain of the transistor M2 is electrically connected to one electrode of the light-emitting device EL, the other electrode of the capacitor C1, and one of a source and a drain of the transistor M3. A gate of the transistor M3 is electrically connected to the wiring GL, and the other of the source and the drain of the transistor M3 is electrically connected to a wiring RL. The other electrode of the light-emitting device EL is electrically connected to a wiring CL.

A data potential D is supplied to the wiring SL. A selection signal is supplied to the wiring GL. The selection signal includes a potential for turning on the transistors M1 and M3 and a potential for turning off the transistors.

A reset potential is supplied to the wiring RL. An anode potential is supplied to the wiring AL. A cathode potential is supplied to the wiring CL. In the pixel 21, the anode potential is higher than the cathode potential. The reset potential supplied to the wiring RL can be set such that a potential difference between the reset potential and the cathode potential is lower than the threshold voltage of the light-emitting device EL. The reset potential can be a potential higher than the cathode potential, a potential equal to the cathode potential, or a potential lower than the cathode potential.

The transistor M1 and the transistor M3 function as switches. The transistor M2 functions as a transistor for controlling a current flowing through the light-emitting device EL. For example, the transistor M1 can be regarded as functioning as a selection transistor and the transistor M2 as a driving transistor.

Here, it is preferable to use LTPS transistors as all of the transistors M1 to M3. Alternatively, it is preferable to use OS transistors as the transistor M1 and the transistor M3 and to use an LTPS transistor as the transistor M2.

Alternatively, OS transistors may be used as all the transistors M1 to M3. In that case, in the display apparatus 10 illustrated in FIG. 25A, an LTPS transistor can be used as at least one of a plurality of transistors included in the driver circuit portion 12 and a plurality of transistors included in the driver circuit portion 13, and OS transistors can be used as the other transistors. For example, OS transistors can be used as the transistor provided in the display portion 11, and LTPS transistors can be used as the transistors provided in the driver circuit portions 12 and 13.

A transistor in which an oxide semiconductor is used for a semiconductor layer where a channel is formed can be used as the OS transistor. The semiconductor layer preferably contains indium, M (M is one or more of gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. Specifically, M is preferably one or more of aluminum, gallium, yttrium, and tin. It is particularly preferable to use an oxide containing indium, gallium, and zinc (also referred to as IGZO) for the semiconductor layer of the OS transistor. Alternatively, it is preferable to use an oxide containing indium, tin, and zinc. Further alternatively, it is preferable to use an oxide containing indium, gallium, tin, and zinc.

A transistor using an oxide semiconductor having a wider band gap and a lower carrier density than silicon can achieve an extremely low off-state current. Therefore, owing to the low off-state current, charge accumulated in a capacitor that is connected in series to the transistor can be retained for a long time. Hence, it is particularly preferable to use transistors containing an oxide semiconductor as the transistors M1 and M3 connected in series to the capacitor C1. The use of the transistors containing an oxide semiconductor as the transistors M1 and M3 can prevent leakage of charge held in the capacitor C1 through the transistor M1 or the transistor M3. Furthermore, since charge held in the capacitor C1 can be held for a long period, a still image can be displayed for a long period without rewriting data in the pixel 21.

Although all the transistors are n-channel transistors in FIG. 25B, a p-channel transistor can also be used.

The transistors included in the pixel 21 are preferably formed to be arranged over one substrate.

A transistor including a pair of gates overlapping with a semiconductor layer therebetween can be used as the transistor included in the pixel 21.

In the transistor including a pair of gates, the same potential is supplied to the pair of gates electrically connected to each other, whereby the on-state current of the transistor can be increased and the saturation characteristics can be improved. A potential for controlling the threshold voltage of the transistor may be supplied to one of the pair of gates. Furthermore, when a constant potential is supplied to one of the pair of gates, the stability of the electrical characteristics of the transistor can be improved. For example, one of the gates of the transistor may be electrically connected to a wiring to which a constant potential is supplied or may be electrically connected to a source or a drain of the transistor.

Figure 25C:
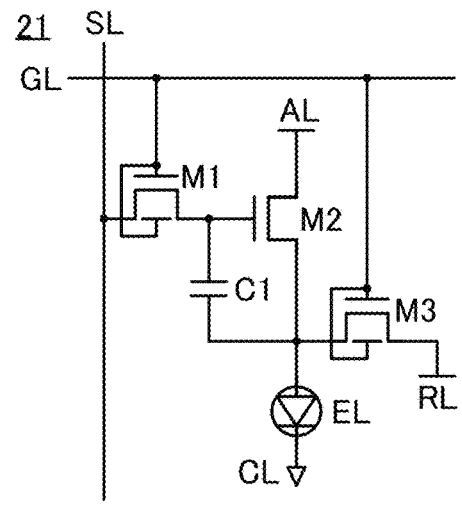

FIG. 25C shows an example of the pixel 21 in which a transistor including a pair of gates is used as each of the transistors M1 and M3. The gates are electrically connected to each other in each of the transistors M1 and M3. Such a structure makes it possible to shorten the period in which data is written to the pixel 21.

Figure 25D:
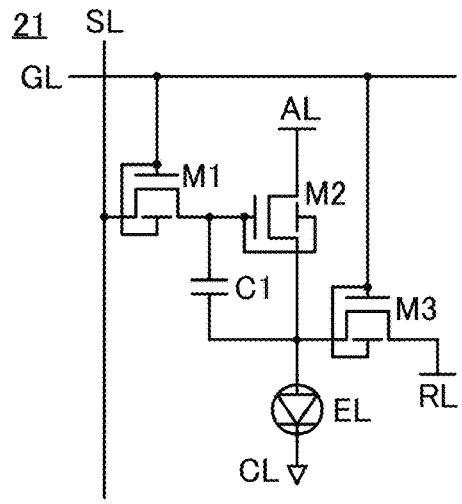

FIG. 25D shows an example of the pixel 21 in which a transistor including a pair of gates is used as the transistor M2 in addition to the transistors M1 and M3. The gates of the transistor M2 are electrically connected to each other. The transistor M2 having such a structure enables the saturation characteristics to be improved, whereby the luminance of the light-emitting device EL can be easily controlled and the display quality can be increased.

[Structure Examples of Transistor]

Cross-sectional structure examples of a transistor that can be used in the above display apparatus will be described below.

[Structure Example 1]

Figure 26A:
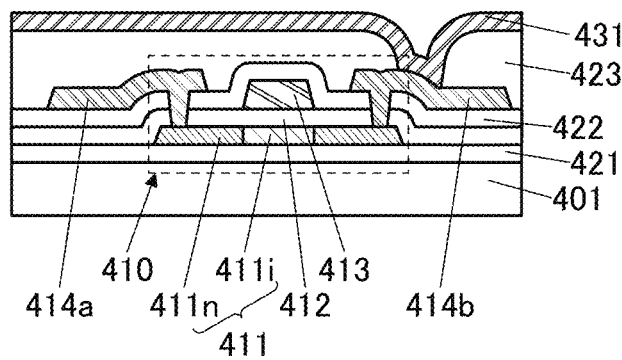
FIGS. 26A to 26D are cross-sectional views illustrating examples of transistors.

FIG. 26A is a cross-sectional view including a transistor 410.

The transistor 410 is provided over a substrate 401 and contains polycrystalline silicon in its semiconductor layer. For example, the transistor 410 corresponds to the transistor M2 in the pixel 21 illustrated in FIGS. 25B to 25D. In other words, FIG. 26A illustrates an example in which one of a source electrode and a drain electrode of the transistor 410 is electrically connected to a conductive layer 431 of the light-emitting device.

The transistor 410 includes a semiconductor layer 411, an insulating layer 412, a conductive layer 413, and the like. The semiconductor layer 411 includes a channel formation region 411i and low-resistance regions 411n. The semiconductor layer 411 contains silicon. The semiconductor layer 411 preferably contains polycrystalline silicon. Part of the insulating layer 412 functions as a gate insulating layer. The conductive layer 413 functions as a gate electrode.

Note that the semiconductor layer 411 can alternatively contain a metal oxide exhibiting semiconductor characteristics (also referred to as an oxide semiconductor). In this case, the transistor 410 can be referred to as an OS transistor.

The low-resistance regions 411n contain an impurity element. For example, to form an n-channel transistor 410, phosphorus, arsenic, or the like is added to the low-resistance regions 411n. Meanwhile, to form a p-channel transistor 410, boron, aluminum, or the like is added to the low-resistance regions 411n. Moreover, in order to control the threshold voltage of the transistor 410, the above-described impurity may be added to the channel formation region 411i.

An insulating layer 421 is provided over the substrate 401. The semiconductor layer 411 is provided over the insulating layer 421. The insulating layer 412 is provided to cover the semiconductor layer 411 and the insulating layer 421. The conductive layer 413 is provided over the insulating layer 412 to overlap the semiconductor layer 411.

An insulating layer 422 is provided to cover the conductive layer 413 and the insulating layer 412. A conductive layer 414a and a conductive layer 414b are provided over the insulating layer 422. The conductive layer 414a and the conductive layer 414b are electrically connected to the low-resistance regions 411n in openings provided in the insulating layer 422 and the insulating layer 412. Part of the conductive layer 414a functions as one of the source electrode and the drain electrode, and part of the conductive layer 414b functions as the other of the source electrode and the drain electrode. An insulating layer 423 is provided to cover the conductive layer 414a, the conductive layer 414b, and the insulating layer 422.

The conductive layer 431 functioning as a pixel electrode is provided over the insulating layer 423. The conductive layer 431 is provided over the insulating layer 423 and is electrically connected to the conductive layer 414b through an opening provided in the insulating layer 423. Although not shown here, an EL layer and a common electrode can be stacked over the conductive layer 431.

[Structure Example 2]

Figure 26B:
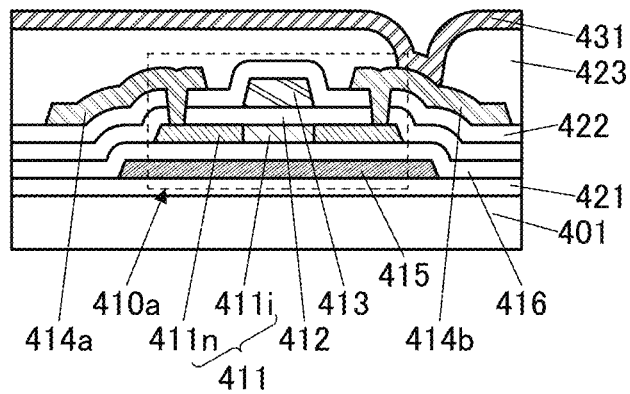

FIG. 26B illustrates a transistor 410a including a pair of gate electrodes. The transistor 410a in FIG. 26B is different from the transistor 410 in FIG. 26A mainly in that a conductive layer 415 and an insulating layer 416 are provided.

The conductive layer 415 is provided over the insulating layer 421. The insulating layer 416 is provided to cover the conductive layer 415 and the insulating layer 421. The semiconductor layer 411 is provided such that at least the channel formation region 411i overlaps the conductive layer 415 with the insulating layer 416 therebetween.

In the transistor 410a in FIG. 26B, part of the conductive layer 413 functions as a first gate electrode, and part of the conductive layer 415 functions as a second gate electrode. In this case, part of the insulating layer 412 functions as a first gate insulating layer, and part of the insulating layer 416 functions as a second gate insulating layer.

To electrically connect the first gate electrode to the second gate electrode, the conductive layer 413 is electrically connected to the conductive layer 415 through an opening provided in the insulating layers 412 and 416 in a region not illustrated. To electrically connect the second gate electrode to a source electrode or a drain electrode, the conductive layer 415 is electrically connected to the conductive layer 414a or the conductive layer 414b through an opening provided in the insulating layers 422, 412, and 416 in a region not illustrated.

In the case where all of the transistors included in the pixel 21 are LTPS transistors, the transistor 410 illustrated in FIG. 26A or the transistor 410a illustrated in FIG. 26B can be used. In this case, the transistors included in the pixels 21 may all be the transistors 410a or the transistors 410 or may be a combination of the transistors 410a and the transistors 410.

[Structure Example 3]

Described below is an example of a structure including both a transistor containing silicon in its semiconductor layer and a transistor containing a metal oxide in its semiconductor layer.

Figure 26C:
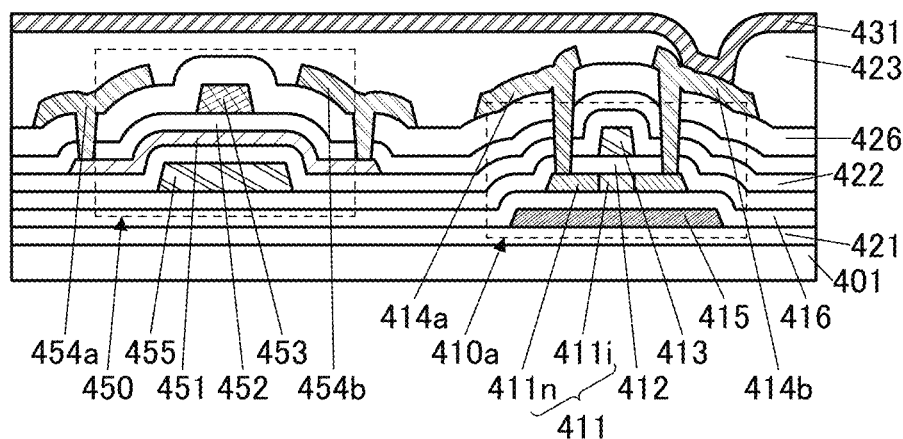

FIG. 26C is a schematic cross-sectional view including the transistor 410a and a transistor 450.

Structure example 2 described above can be referred to for the transistor 410a. Although an example using the transistor 410a is shown here, a structure including the transistor 410 and the transistor 450 or a structure including all the transistors 410, 410a, and 450 may alternatively be employed.

The transistor 450 contains a metal oxide in its semiconductor layer. The structure in FIG. 26C shows an example in which the transistor 450 and the transistor 410a correspond to the transistor M1 and the transistor M2, respectively, in the pixel 21 illustrated in FIGS. 25B to 25D. That is, FIG. 26C illustrates an example in which one of the source electrode and the drain electrode of the transistor 410a is electrically connected to the conductive layer 431.

Moreover, FIG. 26C illustrates an example in which the transistor 450 includes a pair of gate electrodes.

The transistor 450 includes a conductive layer 455, the insulating layer 422, a semiconductor layer 451, an insulating layer 452, a conductive layer 453, and the like. Part of the conductive layer 453 functions as a first gate electrode of the transistor 450, and part of the conductive layer 455 functions as a second gate electrode of the transistor 450. In this case, part of the insulating layer 452 functions as a first gate insulating layer of the transistor 450, and part of the insulating layer 422 functions as a second gate insulating layer of the transistor 450.

The conductive layer 455 is provided over the insulating layer 412. The insulating layer 422 is provided to cover the conductive layer 455. The semiconductor layer 451 is provided over the insulating layer 422. The insulating layer 452 is provided to cover the semiconductor layer 451 and the insulating layer 422. The conductive layer 453 is provided over the insulating layer 452 and includes a region overlapping the semiconductor layer 451 and the conductive layer 455.

An insulating layer 426 is provided to cover the insulating layer 452 and the conductive layer 453. A conductive layer 454a and a conductive layer 454b are provided over the insulating layer 426. The conductive layer 454a and the conductive layer 454b are electrically connected to the semiconductor layer 451 in openings provided in the insulating layer 426 and the insulating layer 452. Part of the conductive layer 454a functions as one of a source electrode and a drain electrode, and part of the conductive layer 454b functions as the other of the source electrode and the drain electrode. The insulating layer 423 is provided to cover the conductive layer 454a, the conductive layer 454b, and the insulating layer 426.

Here, the conductive layers 414a and 414b electrically connected to the transistor 410a are preferably formed by processing the same conductive film as the conductive layers 454a and 454b. In FIG. 26C, the conductive layer 414a, the conductive layer 414b, the conductive layer 454a, and the conductive layer 454b are formed on the same plane (i.e., in contact with the top surface of the insulating layer 426) and contain the same metal element. In this case, the conductive layer 414a and the conductive layer 414b are electrically connected to the low-resistance regions 411n through openings provided in the insulating layers 426, 452, 422, and 412. This is preferable because the manufacturing process can be simplified.

Moreover, the conductive layer 413 functioning as the first gate electrode of the transistor 410a and the conductive layer 455 functioning as the second gate electrode of the transistor 450 are preferably formed by processing the same conductive film. In FIG. 26C, the conductive layer 413 and the conductive layer 455 are formed on the same plane (i.e., in contact with the top surface of the insulating layer 412) and contain the same metal element. This is preferable because the manufacturing process can be simplified.

Figure 26D:
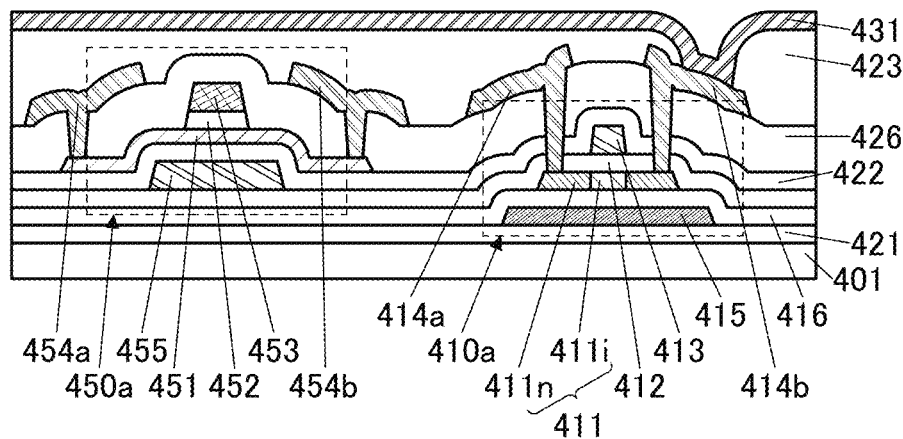

In FIG. 26C, the insulating layer 452 functioning as the first gate insulating layer of the transistor 450 covers an end portion of the semiconductor layer 451. Alternatively, as in a transistor 450a illustrated in FIG. 26D, the insulating layer 452 may be processed to have the same or substantially the same top surface shape as that of the conductive layer 453.

Note that in this specification and the like, the expression "having substantially the same top surface shapes" means that at least outlines of stacked layers partly overlap each other. For example, the case of patterning or partly patterning an upper layer and a lower layer with the use of the same mask pattern is included in the expression. The expression "having substantially the same top surface shapes" also includes the case where the outlines do not completely overlap each other; for instance, the edge of the upper layer may be positioned on the inner side or the outer side of the edge of the lower layer.

Although the example in which the transistor 410a corresponds to the transistor M2 in FIGS. 25B to 25D and is electrically connected to the pixel electrode is shown here, one embodiment of the present invention is not limited thereto. For example, a structure where the transistor 450 or the transistor 450a corresponds to the transistor M2 may be employed. In that case, the transistor 410a corresponds to the transistor M1, the transistor M3, or another transistor.

This embodiment can be combined with any of the other embodiments as appropriate.

Embodiment 6

Described in this embodiment is a metal oxide (also referred to as an oxide semiconductor) applicable to an OS transistor described in the above embodiment.

A metal oxide preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a CVD method such as an MOCVD method, an ALD method, or the like.

<Classification of Crystal Structure>

Examples of a crystal structure of an oxide semiconductor include amorphous (including completely amorphous), c-axis-aligned crystalline (CAAC), nanocrystalline (nc), cloud-aligned composite (CAC), single crystal, and polycrystalline structures.

A crystal structure of a film or a substrate can be analyzed with an X-ray diffraction (XRD) spectrum. For example, evaluation is possible using an XRD spectrum which is obtained by grazing-incidence XRD (GIXD) measurement. Note that a GIXD method is also referred to as a thin film method or a Seemann-Bohlin method.

For example, the peak of the XRD spectrum of a quartz glass substrate has a substantially bilaterally symmetrical shape. On the other hand, the peak of the XRD spectrum of an IGZO film having a crystal structure has a bilaterally asymmetrical shape. The bilaterally asymmetrical peak of the XRD spectrum shows the existence of crystal in the film or the substrate. In other words, the crystal structure of the film or the substrate cannot be regarded as "amorphous" unless it has a bilaterally symmetrical peak in the XRD spectrum.

The crystal structure of a film or a substrate can be analyzed with a diffraction pattern obtained by nanobeam electron diffraction (NBED) (also referred to as a nanobeam electron diffraction pattern). For example, a halo pattern is observed in the diffraction pattern of a quartz glass substrate, which indicates that the quartz glass substrate is in an amorphous state. Furthermore, not a halo pattern but a spot-like pattern is observed in the diffraction pattern of an IGZO film formed at room temperature. Thus, it is presumed that the IGZO film formed at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC and nc-OS. Other examples of the non-single-crystal oxide semiconductor include a polycrystalline oxide semiconductor, an amorphous-like oxide semiconductor (a-like OS), and an amorphous oxide semiconductor.

Next, the CAAC-OS, nc-OS, and a-like OS will be described in detail.

[CAAC-OS]

The CAAC-OS is an oxide semiconductor that has a plurality of crystal regions each of which has c-axis alignment in a particular direction. Note that the particular direction refers to the thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction.

Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more of aluminum, gallium, yttrium, tin, titanium, and the like), the CAAC-OS tends to have a layered crystal structure (also referred to as a stacked-layer structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution transmission electron microscope (TEM) image, for example.

When the CAAC-OS film is subjected to structural analysis by out-of-plane XRD measurement with an XRD apparatus using θ/2θ scanning, for example, a peak indicating c-axis alignment is detected at or around 2θ=31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are symmetric with respect to a spot of the incident electron beam which passes through a sample (also referred to as a direct spot).

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear grain boundary cannot be observed even in the vicinity of the distortion in the CAAC-OS. That is, formation of a grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear grain boundary is observed is what is called a polycrystal structure. It is highly probable that the grain boundary becomes a recombination center and traps carriers and thus decreases the on-state current and field-effect mobility of a transistor, for example. Thus, the CAAC-OS in which no clear grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a grain boundary as compared with an In oxide.

The CAAC-OS is an oxide semiconductor with high crystallinity in which no clear grain boundary is observed. Thus, in the CAAC-OS, a reduction in electron mobility due to the grain boundary is less likely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Therefore, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. There is no regularity of crystal orientation between different nanocrystals in the nc-OS. Hence, the orientation in the whole film is not observed. Accordingly, the nc-OS cannot be distinguished from an a-like OS or an amorphous oxide semiconductor by some analysis methods. For example, when an nc-OS film is subjected to structural analysis by out-of-plane XRD measurement with an XRD apparatus using θ/2θ scanning, a peak indicating crystallinity is not observed. Furthermore, a halo pattern is shown in a selected-area electron diffraction pattern of the nc-OS film obtained using an electron beam having a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

<<Composition of Oxide Semiconductor>>

Next, the CAC-OS will be described in detail. Note that the CAC-OS relates to the material composition.

[CAC-OS]

The CAC-OS has, for example, a composition in which elements included in a metal oxide are unevenly distributed. Materials including unevenly distributed elements each have a size greater than or equal to 0.5 nm and less than or equal to 10 nm, preferably greater than or equal to 1 nm and less than or equal to 3 nm, or a similar size. Note that in the following description of a metal oxide, a state in which one or more types of metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 3 nm, or a similar size.

In addition, the CAC-OS has a composition in which materials are separated into a first region and a second region to form a mosaic pattern, and the first regions are distributed in the film. This composition is hereinafter also referred to as a cloud-like composition. That is, the CAC-OS is a composite metal oxide having a composition in which the first regions and the second regions are mixed.

Here, the atomic ratios of In, Ga, and Zn to a metal element included in a CAC-OS in an In—Ga—Zn oxide are expressed as [In], [Ga], and [Zn], respectively. For example, the first region in the CAC-OS in the In—Ga—Zn oxide has [In] higher than that in the composition of the CAC-OS film. Moreover, the second region of the CAC-OS in the In—Ga—Zn oxide has [Ga] higher than that in the composition of the CAC-OS film. Alternatively, for example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly dispersed to form a mosaic pattern. Thus, it is suggested that the CAC-OS has a structure in which metal elements are unevenly distributed.

The CAC-OS can be formed by a sputtering method under conditions where a substrate is not heated, for example. In the case of forming the CAC-OS by a sputtering method, one or more selected from an inert gas (typically, argon), an oxygen gas, and a nitrogen gas can be used as a deposition gas. The ratio of the flow rate of an oxygen gas to the total flow rate of the deposition gas at the time of film formation is preferably as low as possible, and for example, the flow ratio of an oxygen gas is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a composition in which the regions containing In as a main component (the first regions) and the regions containing Ga as a main component (the second regions) are unevenly distributed and mixed.

Here, the first region has a higher conductivity than the second region. In other words, when carriers flow through the first region, the conductivity of a metal oxide is exhibited. Accordingly, when the first regions are distributed in a metal oxide as a cloud, high field-effect mobility ($\mu$) can be achieved.

The second region has a higher insulating property than the first region. In other words, when the second regions are distributed in a metal oxide, leakage current can be inhibited.

Thus, in the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, a high on-state current (Ion), high field-effect mobility ($\mu$), a low leakage current, and favorable switching operation can be achieved.

A transistor including the CAC-OS is highly reliable. Thus, the CAC-OS is suitably used in a variety of semiconductor devices typified by a display apparatus.

An oxide semiconductor can have any of various structures that show various different properties. Two or more of an amorphous oxide semiconductor, a polycrystalline oxide semiconductor, an a-like OS, the CAC-OS, an nc-OS, and the CAAC-OS may be included in an oxide semiconductor of one embodiment of the present invention.

<Transistor Including Oxide Semiconductor>

Next, a transistor including the above oxide semiconductor will be described.

When the oxide semiconductor is used for a transistor, the transistor can have high field-effect mobility. In addition, the transistor can have high reliability.

An oxide semiconductor having a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and accordingly has a low density of trap states in some cases.

Charges trapped by the trap states in an oxide semiconductor take a long time to be released and may behave like fixed charges. A transistor whose channel formation region is formed in an oxide semiconductor having a high density of trap states has unstable electrical characteristics in some cases.

In order to obtain stable electrical characteristics of the transistor, reducing the concentration of impurities in the oxide semiconductor is effective. In order to reduce the impurity concentration in the oxide semiconductor, the impurity concentration in a film that is adjacent to the oxide semiconductor is preferably reduced. Examples of impurities include hydrogen, nitrogen, alkali metal, alkaline earth metal, iron, nickel, and silicon.

<Impurities>

The influence of impurities in the oxide semiconductor will be described.

When silicon or carbon, which is a Group 14 element, is contained in an oxide semiconductor, defect states are formed in the oxide semiconductor. Thus, the concentration of silicon or carbon in the oxide semiconductor and in the vicinity of an interface with the oxide semiconductor (the concentration measured by secondary ion mass spectrometry (SIMS)) is lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated in some cases. Accordingly, a transistor including an oxide semiconductor that contains alkali metal or alkaline earth metal tends to have normally-on characteristics. Thus, the concentration of alkali metal or alkaline earth metal in the oxide semiconductor, which is measured by SIMS, is lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. A transistor including, as a semiconductor, an oxide semiconductor that contains nitrogen tends to have normally-on characteristics. When nitrogen is contained in the oxide semiconductor, a trap state is sometimes formed. This might make the electrical characteristics of the transistor unstable. Thus, the concentration of nitrogen in the oxide semiconductor, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, some hydrogen may react with oxygen bonded to a metal atom and generate an electron serving as a carrier. Thus, a transistor including an oxide semiconductor that contains hydrogen tends to have normally-on characteristics. For this reason, hydrogen in the oxide semiconductor is preferably reduced as much as possible. Specifically, the hydrogen concentration in the oxide semiconductor, which is measured by SIMS, is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for a channel formation region in a transistor, the transistor can have stable electrical characteristics.

This embodiment can be combined with any of the other embodiments as appropriate.

Embodiment 7

In this embodiment, electronic devices of embodiments of the present invention will be described with reference to FIGS. 27A and 27B to FIGS. 31A to 31G.

Electronic devices of this embodiment are each provided with the display apparatus of one embodiment of the present invention in a display portion. The display apparatus of one embodiment of the present invention can be easily increased in definition and resolution. Thus, the display apparatus of one embodiment of the present invention can be used for a display portion of a variety of electronic devices.

Examples of the electronic devices include a digital camera, a digital video camera, a digital photo frame, a mobile phone, a portable game console, a portable information terminal, and an audio reproducing device, in addition to electronic devices with a relatively large screen, such as a television device, desktop and laptop personal computers, a monitor of a computer and the like, digital signage, and a large game machine such as a pachinko machine.

In particular, the display apparatus of one embodiment of the present invention can have a high definition, and thus can be favorably used for an electronic device having a relatively small display portion. Examples of such an electronic device include watch-type and bracelet-type information terminal devices (wearable devices) and wearable devices worn on the head, such as a VR device like a head mounted display, a glasses-type AR device, and a mixed reality (MR) device.

The resolution of the display apparatus of one embodiment of the present invention is preferably as high as HD (number of pixels: 1280×720), FHD (number of pixels: 1920×1080), WQHD (number of pixels: 2560×1440), WQXGA (number of pixels: 2560×1600), 4K (number of pixels: 3840×2160), or 8K (number of pixels: 7680×4320). In particular, a resolution of 4K, 8K, or higher is preferable. The pixel density (definition) of the display apparatus of one embodiment of the present invention is preferably 100 ppi or higher, further preferably 300 ppi or higher, further preferably 500 ppi or higher, further preferably 1000 ppi or higher, still further preferably 2000 ppi or higher, still further preferably 3000 ppi or higher, still further preferably 5000 ppi or higher, yet further preferably 7000 ppi or higher. The use of the display apparatus having one or both of such high resolution and high definition can further increase realistic sensation, sense of depth, and the like. There is no particular limitation on the screen ratio (aspect ratio) of the display apparatus of one embodiment of the present invention. For example, the display apparatus is compatible with a variety of screen ratios such as 1:1 (a square), 4:3, 16:9, and 16:10.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Examples of head-mounted wearable devices will be described with reference to FIGS. 27A and 27B and FIGS. 28A and 28B. These wearable devices have one or both of a function of displaying AR contents and a function of displaying VR contents. Note that these wearable devices may have a function of displaying substitutional reality (SR) or MR contents, in addition to AR and VR contents. The electronic device having a function of displaying contents of AR, VR, SR, MR, or the like enables the user to reach a higher level of immersion.

Figure 27A:
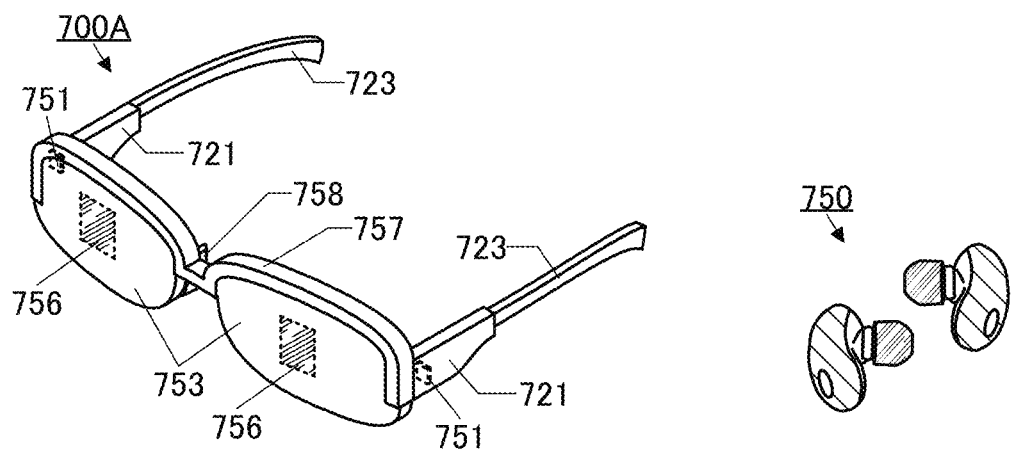
FIGS. 27A and 27B illustrate examples of electronic devices.
Figure 27B:
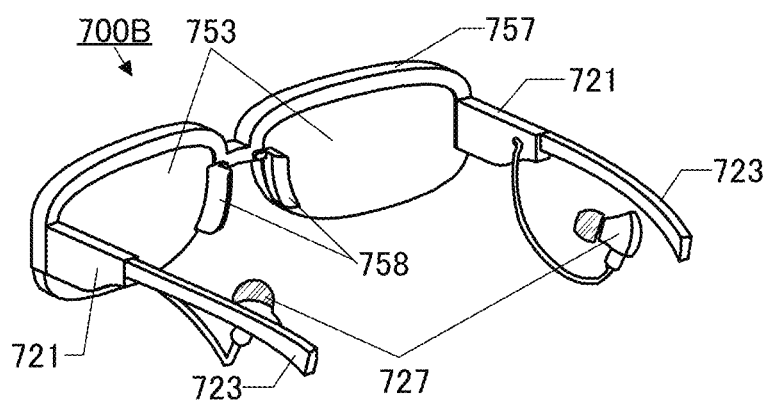

An electronic device 700A illustrated in FIG. 27A and an electronic device 700B illustrated in FIG. 27B each include a pair of display panels 751, a pair of housings 721, a communication portion (not illustrated), a pair of mounting portions 723, a control portion (not illustrated), an imaging portion (not illustrated), a pair of optical members 753, a frame 757, and a pair of nose pads 758.

The display apparatus of one embodiment of the present invention can be used for the display panels 751. Thus, the electronic devices are capable of performing ultrahigh-definition display.

The electronic devices 700A and 700B can each project images displayed on the display panels 751 onto display regions 756 of the optical members 753. Since the optical members 753 have a light-transmitting property, the user can see images displayed on the display regions 756, which are superimposed on transmission images seen through the optical members 753.

Accordingly, the electronic devices 700A and 700B are electronic devices capable of AR display.

In the electronic devices 700A and 700B, a camera capable of taking pictures of the front side may be provided as the imaging portion. Furthermore, when the electronic devices 700A and 700B are provided with an acceleration sensor such as a gyroscope sensor, the orientation of the user's head can be sensed and an image corresponding to the orientation can be displayed on the display regions 756.

The communication portion includes a wireless communication device, and a video signal and the like can be supplied by the wireless communication device. Instead of or in addition to the wireless communication device, a connector that can be connected to a cable for supplying a video signal and a power supply potential may be provided.

The electronic devices 700A and 700B are provided with a battery so that they can be charged wirelessly and/or wired.

A touch sensor module may be provided in the housing 721. The touch sensor module has a function of detecting a touch on the outer surface of the housing 721. Detecting a tap operation, a slide operation, or the like by the user with the touch sensor module enables various types of processing. For example, a video can be paused or restarted by a tap operation, and can be fast-forwarded or fast-reversed by a slide operation. When the touch sensor module is provided in each of the two housings 721, the range of the operation can be increased.

Various touch sensors can be applied to the touch sensor module. For example, any of touch sensors of the following types can be used: a capacitive type, a resistive type, an infrared type, an electromagnetic induction type, a surface acoustic wave type, and an optical type. In particular, a capacitive sensor or an optical sensor is preferably used for the touch sensor module.

In the case of using an optical touch sensor, a photoelectric conversion device (also referred to as a photoelectric conversion element) can be used as a light-receiving device. One or both of an inorganic semiconductor and an organic semiconductor can be used for an active layer of the photoelectric conversion device.

Figure 28A:
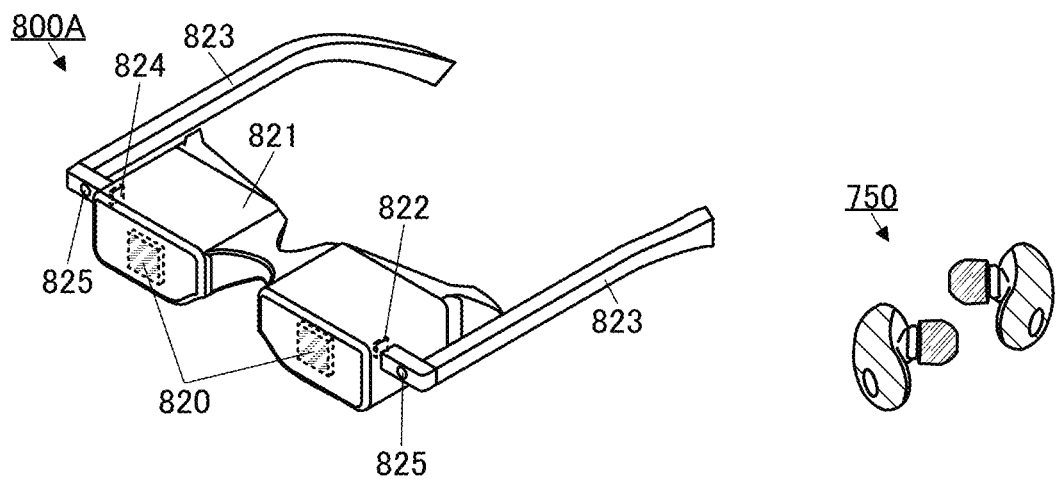
FIGS. 28A and 28B illustrate examples of electronic devices.
Figure 28B:
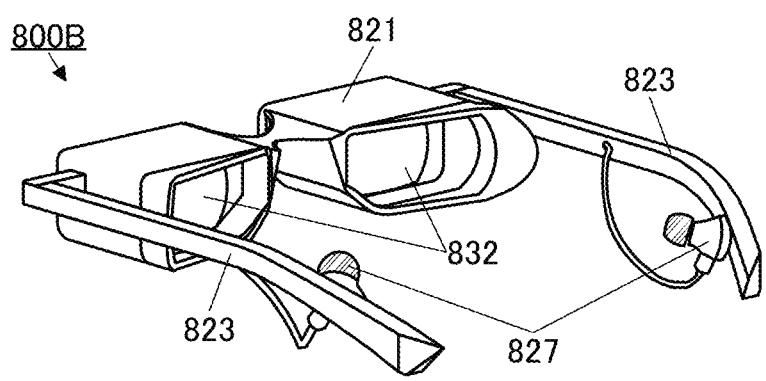

An electronic device 800A illustrated in FIG. 28A and an electronic device 800B illustrated in FIG. 28B each include a pair of display portions 820, a housing 821, a communication portion 822, a pair of mounting portions 823, a control portion 824, a pair of imaging portions 825, and a pair of lenses 832.

The display apparatus of one embodiment of the present invention can be used in the display portions 820. Thus, the electronic devices are capable of performing ultrahigh-definition display. Such electronic devices provide an enhanced sense of immersion to the user.

The display portions 820 are provided at positions where the user can see through the lenses 832 inside the housing 821. When the pair of display portions 820 display different images, three-dimensional display using parallax can be performed.

The electronic devices 800A and 800B can be regarded as electronic devices for VR. The user who wears the electronic device 800A or the electronic device 800B can see images displayed on the display portions 820 through the lenses 832.

The electronic devices 800A and 800B preferably include a mechanism for adjusting the lateral positions of the lenses 832 and the display portions 820 so that the lenses 832 and the display portions 820 are positioned optimally in accordance with the positions of the user's eyes. Moreover, the electronic devices 800A and 800B preferably include a mechanism for adjusting focus by changing the distance between the lenses 832 and the display portions 820.

The electronic device 800A or the electronic device 800B can be mounted on the user's head with the mounting portions 823. FIG. 28A and the like show examples where the mounting portion 823 has a shape like a temple of glasses; however, one embodiment of the present invention is limited thereto. The mounting portion 823 can have any shape with which the user can wear the electronic device, for example, a shape of a helmet or a band.

The imaging portion 825 has a function of obtaining information on the external environment. Data obtained by the imaging portion 825 can be output to the display portion 820. An image sensor can be used for the imaging portion 825. Moreover, a plurality of cameras may be provided so as to support a plurality of fields of view, such as a telescope field of view and a wide field of view.

Although an example where the imaging portions 825 are provided is shown here, a range sensor capable of measuring a distance between the user and an object (hereinafter also referred to as a sensing portion) just needs to be provided. In other words, the imaging portion 825 is one embodiment of the sensing portion. As the sensing portion, an image sensor or a range image sensor such as a light detection and ranging (LiDAR) sensor can be used, for example. By using images obtained by the camera and images obtained by the range image sensor, more information can be obtained and a gesture operation with higher accuracy is possible.

The electronic device 800A may include a vibration mechanism that functions as bone-conduction earphones. For example, at least one of the display portion 820, the housing 821, and the mounting portion 823 can include the vibration mechanism. Thus, without additionally requiring an audio device such as headphones, earphones, or a speaker, the user can enjoy video and sound only by wearing the electronic device 800A.

The electronic devices 800A and 800B may each include an input terminal. To the input terminal, a cable for supplying a video signal from a video output device or the like, power for charging the battery provided in the electronic device, and the like can be connected.

The electronic device of one embodiment of the present invention may have a function of performing wireless communication with earphones 750. The earphones 750 include a communication portion (not illustrated) and has a wireless communication function. The earphones 750 can receive information (e.g., audio data) from the electronic device with the wireless communication function. For example, the electronic device 700A in FIG. 27A has a function of transmitting information to the earphones 750 with the wireless communication function. As another example, the electronic device 800A in FIG. 28A has a function of transmitting information to the earphones 750 with the wireless communication function.

The electronic device may include an earphone portion. The electronic device 700B in FIG. 27B includes earphone portions 727. For example, the earphone portion 727 can be connected to the control portion by wire. Part of a wiring that connects the earphone portion 727 and the control portion may be positioned inside the housing 721 or the mounting portion 723.

Similarly, the electronic device 800B in FIG. 28B includes earphone portions 827. For example, the earphone portion 827 can be connected to the control portion 824 by wire. Part of a wiring that connects the earphone portion 827 and the control portion 824 may be positioned inside the housing 821 or the mounting portion 823. Alternatively, the earphone portions 827 and the mounting portions 823 may include magnets. This is preferred because the earphone portions 827 can be fixed to the mounting portions 823 with magnetic force and thus can be easily housed.

The electronic device may include an audio output terminal to which earphones, headphones, or the like can be connected. The electronic device may include one or both of an audio input terminal and an audio input mechanism. As the audio input mechanism, a sound collecting device such as a microphone can be used, for example. The electronic device may have a function of a headset by including the audio input mechanism.

As described above, both the glasses-type device (e.g., the electronic devices 700A and 700B) and the goggles-type device (e.g., the electronic devices 800A and 800B) are preferable as the electronic device of one embodiment of the present invention.

The electronic device of one embodiment of the present invention can transmit information to earphones wired or wirelessly.

Figure 29A:
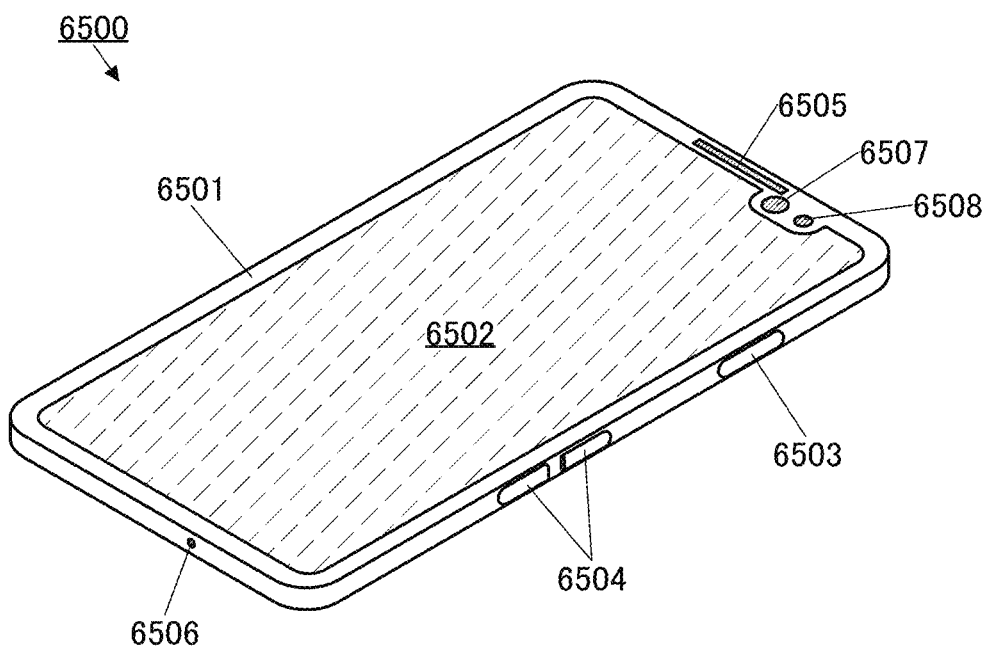
FIGS. 29A and 29B illustrate an example of an electronic device.

An electronic device 6500 illustrated in FIG. 29A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 29B:
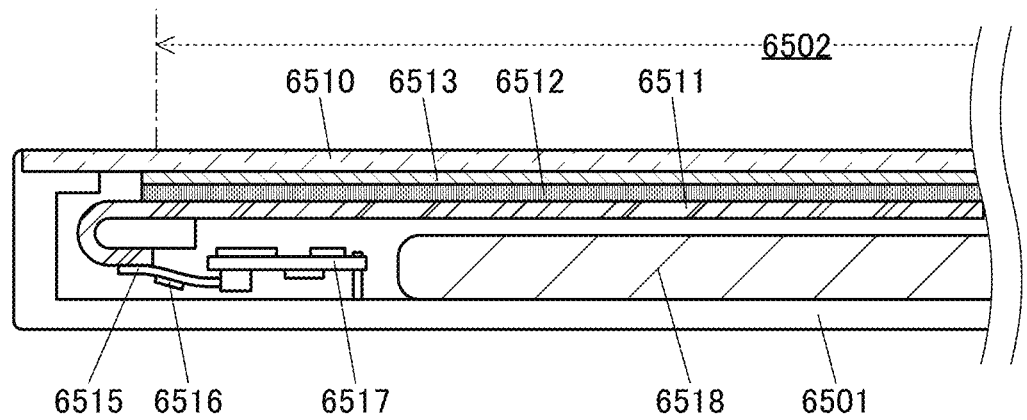

FIG. 29B is a schematic cross-sectional view including an end portion of the housing 6501 on the microphone 6506 side.

A protection member 6510 having a light-transmitting property is provided on the display surface side of the housing 6501. A display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

The display apparatus of one embodiment of the present invention can be used as the display panel 6511. Thus, an extremely lightweight electronic device can be achieved. Since the display panel 6511 is extremely thin, the battery 6518 with high capacity can be mounted without an increase in the thickness of the electronic device. Moreover, a part of the display panel 6511 is folded back so that a connection portion with the FPC 6515 is provided on the back side of the pixel portion, whereby an electronic device with a narrow bezel can be achieved.

Figure 30A:
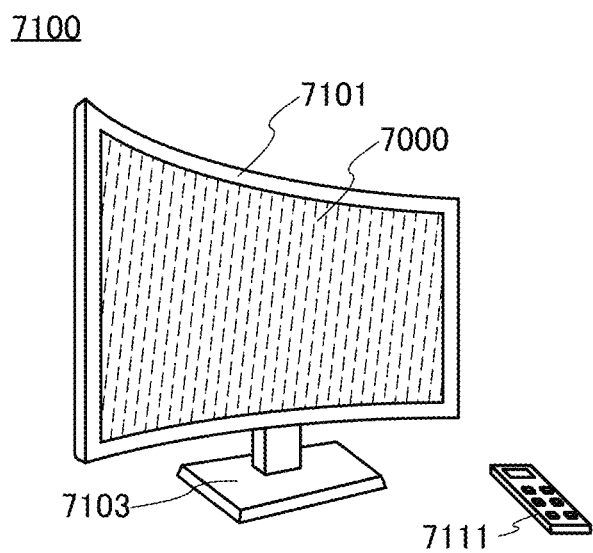
FIGS. 30A to 30D illustrate examples of electronic devices.

FIG. 30A illustrates an example of a television device. In a television device 7100, a display portion 7000 is incorporated in a housing 7101. Here, the housing 7101 is supported by a stand 7103.

The display apparatus of one embodiment of the present invention can be used in the display portion 7000.

Operation of the television device 7100 illustrated in FIG. 30A can be performed with an operation switch provided in the housing 7101 and a separate remote controller 7111. Alternatively, the display portion 7000 may include a touch sensor, and the television device 7100 may be operated by touch on the display portion 7000 with a finger or the like. The remote controller 7111 may be provided with a display portion for displaying information output from the remote controller 7111. With operation keys or a touch panel provided in the remote controller 7111, channels and volume can be controlled and videos displayed on the display portion 7000 can be controlled.

Note that the television device 7100 includes a receiver, a modem, and the like. A general television broadcast can be received with the receiver. When the television device is connected to a communication network with or without wires via the modem, one-way (from a transmitter to a receiver) or two-way (between a transmitter and a receiver or between receivers, for example) data communication can be performed.

Figure 30B:
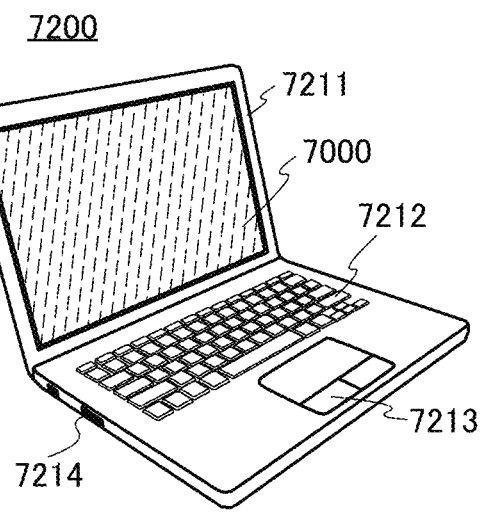

FIG. 30B illustrates an example of a laptop personal computer. The laptop personal computer 7200 includes a housing 7211, a keyboard 7212, a pointing device 7213, an external connection port 7214, and the like. The display portion 7000 is incorporated in the housing 7211.

The display apparatus of one embodiment of the present invention can be used in the display portion 7000.

Figure 30C:
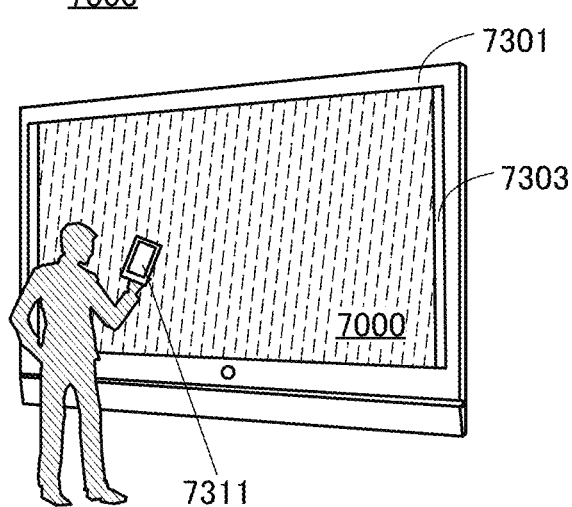
Figure 30D:
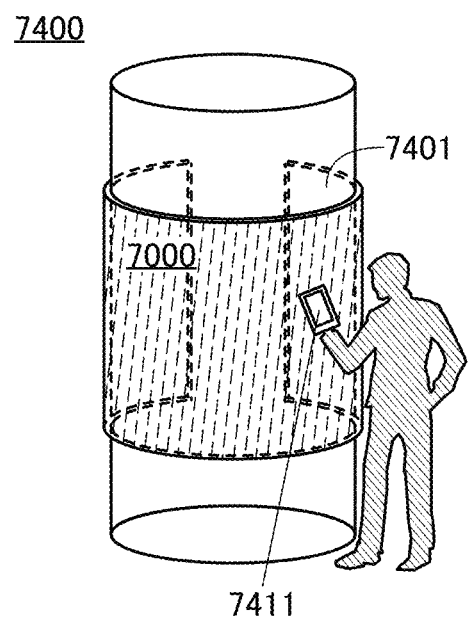

FIGS. 30C and 30D illustrate examples of digital signage.

Digital signage 7300 illustrated in FIG. 30C includes a housing 7301, the display portion 7000, a speaker 7303, and the like. The digital signage 7300 can also include an LED lamp, an operation key (including a power switch or an operation switch), a connection terminal, a variety of sensors, a microphone, and the like.

FIG. 30D shows digital signage 7400 attached to a cylindrical pillar 7401. The digital signage 7400 includes the display portion 7000 provided along a curved surface of the pillar 7401.

In FIGS. 30C and 30D, the display apparatus of one embodiment of the present invention can be used in the display portion 7000.

A larger area of the display portion 7000 can increase the amount of data that can be provided at a time. The larger display portion 7000 attracts more attention, so that the effectiveness of the advertisement can be increased, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIGS. 30C and 30D, it is preferable that the digital signage 7300 or the digital signage 7400 can work with an information terminal 7311 or an information terminal 7411, such as a smartphone that a user has, through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with the use of the screen of the information terminal 7311 or the information terminal 7411 as an operation means (controller). Thus, an unspecified number of users can join in and enjoy the game concurrently.

Electronic devices illustrated in FIGS. 31A to 31G each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

In FIGS. 31A to 31G, the display apparatus of one embodiment of the present invention can be used in the display portion 9001.

The electronic devices illustrated in FIGS. 31A to 31G have a variety of functions. For example, the electronic devices can have a function of displaying a variety of information (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. Note that the functions of the electronic devices are not limited thereto, and the electronic devices can have a variety of functions. The electronic devices may include a plurality of display portions. The electronic devices may be provided with a camera or the like and have a function of taking a still image or a moving image, a function of storing the taken image in a storage medium (an external storage medium or a storage medium incorporated in the camera), a function of displaying the taken image on the display portion, and the like.

The electronic devices illustrated in FIGS. 31A to 31G will be described in detail below.

Figure 31A:
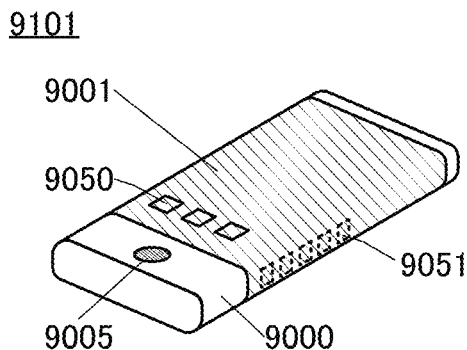
FIGS. 31A to 31G illustrate examples of electronic devices.

FIG. 31A is a perspective view of a portable information terminal 9101. The portable information terminal 9101 can be used as a smartphone, for example. The portable information terminal 9101 may include the speaker 9003, the connection terminal 9006, the sensor 9007, or the like. The portable information terminal 9101 can display text and image information on its plurality of surfaces. FIG. 31A illustrates an example in which three icons 9050 are displayed.

Furthermore, information 9051 indicated by dashed rectangles can be displayed on another surface of the display portion 9001. Examples of the information 9051 include notification of reception of an e-mail, an SNS message, or an incoming call, the title and sender of an e-mail, an SNS message, or the like, the date, the time, remaining battery, and the radio field intensity. Alternatively, the icon 9050 or the like may be displayed at the position where the information 9051 is displayed.

Figure 31D:
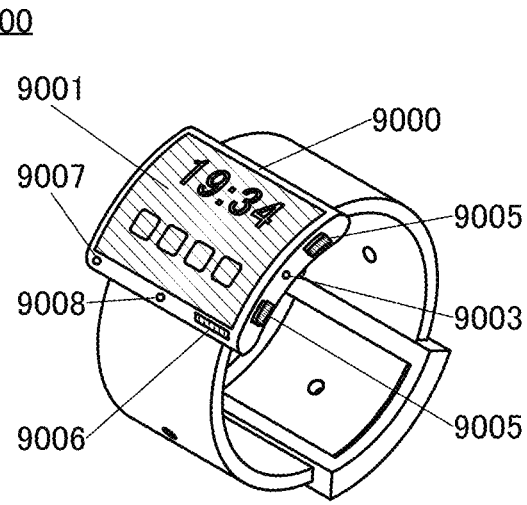
Figure 31B:
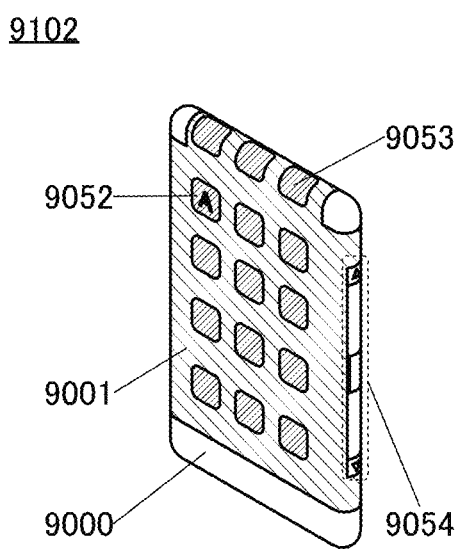

FIG. 31B is a perspective view of a portable information terminal 9102. The portable information terminal 9102 has a function of displaying information on three or more surfaces of the display portion 9001. Here, information 9052, information 9053, and information 9054 are displayed on different surfaces. For example, the user of the portable information terminal 9102 can check the information 9053 displayed such that it can be seen from above the portable information terminal 9102, with the portable information terminal 9102 put in a breast pocket of his/her clothes. Thus, the user can see the display without taking out the portable information terminal 9102 from the pocket and decide whether to answer the call, for example.

Figure 31E:
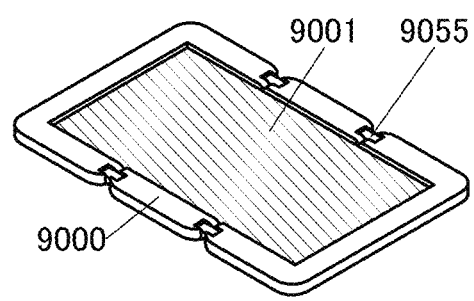
Figure 31C:
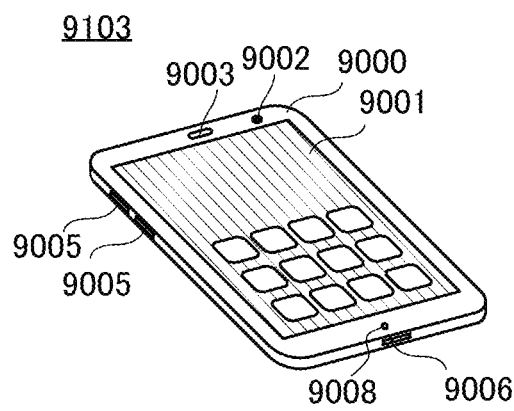

FIG. 31C is a perspective view of a tablet terminal 9103. The tablet terminal 9103 is capable of executing a variety of applications such as mobile phone calls, e-mailing, viewing and editing texts, music reproduction, Internet communication, and a computer game, for example. The tablet terminal 9103 includes the display portion 9001, the camera 9002, the microphone 9008, and the speaker 9003 on the front surface of the housing 9000; the operation keys 9005 as buttons for operation on the left side surface of the housing 9000; and the connection terminal 9006 on the bottom surface of the housing 9000.

FIG. 31D is a perspective view of a watch-type portable information terminal 9200. The portable information terminal 9200 can be used as a Smartwatch (registered trademark), for example. The display surface of the display portion 9001 is curved, and an image can be displayed on the curved display surface. Furthermore, for example, mutual communication between the portable information terminal 9200 and a headset capable of wireless communication can be performed, and thus hands-free calling is possible. With the connection terminal 9006, the portable information terminal 9200 can perform mutual data transmission with another information terminal and charging. Note that the charging operation may be performed by wireless power feeding.

Figure 31F:
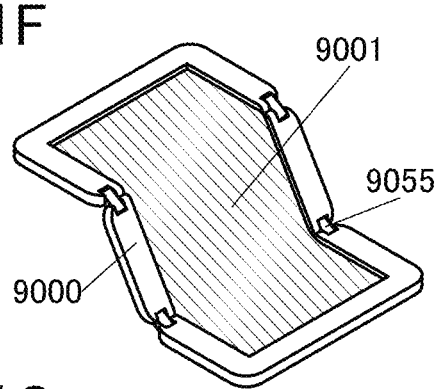
Figure 31G:
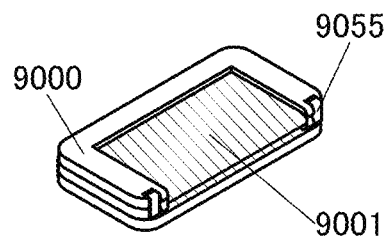

FIGS. 31E to 31G are perspective views of a foldable portable information terminal 9201. FIG. 31E is a perspective view showing the portable information terminal 9201 that is opened. FIG. 31G is a perspective view showing the portable information terminal 9201 that is folded. FIG. 31F is a perspective view showing the portable information terminal 9201 that is shifted from one of the states in FIGS. 31E and 31G to the other. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. The display portion 9001 can be folded with a radius of curvature greater than or equal to 0.1 mm and less than or equal to 150 mm, for example.

This embodiment can be combined with any of the other embodiments as appropriate.

This application is based on Japanese Patent Application Serial No. 2021-059371 filed with Japan Patent Office on Mar. 31, 2021, the entire contents of which are hereby incorporated by reference.

What is claimed is:

1. A display apparatus comprising:
    a first light-emitting device comprising a first pixel electrode, a first light-emitting layer over the first pixel electrode, and a common electrode over the first light-emitting layer;
    a second light-emitting device comprising a second pixel electrode, a second light-emitting layer over the second pixel electrode, and the common electrode over the second light-emitting layer;
    a first insulating layer over the first pixel electrode and the second pixel electrode;
    a second insulating layer over the first insulating layer;
    a first color conversion layer overlapping with the first light-emitting device; and
    a second color conversion layer overlapping with the second light-emitting device,
    wherein the first insulating layer covers an end portion of the first pixel electrode and an end portion of the second pixel electrode,
    wherein the second insulating layer is in direct contact with side surfaces of the first light-emitting layer and the second light-emitting layer,
    wherein the first light-emitting device and the second light-emitting device are each configured to emit blue light,
    wherein the first color conversion layer is configured to convert light emitted from the first light-emitting device into light having a different wavelength, and
    wherein the second color conversion layer is configured to convert light emitted from the second light-emitting device into light having a different wavelength.

2. The display apparatus according to claim 1, further comprising a third insulating layer,
    wherein the second insulating layer comprises an inorganic material,
    wherein the third insulating layer comprises an organic material, and
    wherein the third insulating layer overlaps the first insulating layer with the second insulating layer therebetween.

3. The display apparatus according to claim 1,
    wherein the first light-emitting device comprises a common layer between the first light-emitting layer and the common electrode,
    wherein the second light-emitting device comprises the common layer between the second light-emitting layer and the common electrode, and
    wherein the common layer comprises at least one of a hole-injection layer, a hole-blocking layer, a hole-transport layer, an electron-transport layer, an electron-blocking layer, and an electron-injection layer.

4. The display apparatus according to claim 1,
    wherein the first light-emitting layer and the second light-emitting layer comprise the same material.

5. The display apparatus according to claim 1,
    wherein the first color conversion layer and the second color conversion layer each comprise quantum dots.

6. The display apparatus according to claim 1,
    wherein the first color conversion layer and the second color conversion layer each comprise a fluorescent material.

7. The display apparatus according to claim 1, further comprising a third light-emitting device emitting blue light.

8. A display module comprising:
    the display apparatus according to claim 1; and
    at least one of a connector and an integrated circuit.

9. An electronic device comprising:
    the display module according to claim 8; and
    at least one of a housing, a battery, a camera, a speaker, and a microphone.

10. A method for manufacturing a display apparatus, comprising:
    forming a first pixel electrode and a second pixel electrode over an insulating surface;
    forming a first insulating layer covering an end portion of the first pixel electrode and an end portion of the second pixel electrode;
    forming a first layer over the first pixel electrode and the second pixel electrode;
    forming a first sacrificial layer over the first layer;
    processing the first layer and the first sacrificial layer, thereby forming a second layer over the first pixel electrode, a second sacrificial layer over the second layer, a third layer over the second pixel electrode, and a third sacrificial layer over the third layer;
    forming a first insulating film covering at least a top surface of the first insulating layer, a side surface of the second layer, a side surface of the third layer, a side surface and a top surface of the second sacrificial layer, and a side surface and a top surface of the third sacrificial layer;
    processing the first insulating film, thereby forming a second insulating layer covering at least the top surface of the first insulating layer, the side surface of the second layer, and the side surface of the third layer;
    removing the second sacrificial layer and the third sacrificial layer;
    forming a common electrode over the second layer and the third layer; and
    forming, over the common electrode, a first color conversion layer overlapping the second layer and a second color conversion layer overlapping the third layer.

11. The method for manufacturing a display apparatus, according to claim 10, further comprising:
    forming, as the first sacrificial layer, a first sacrificial film and a second sacrificial film over the first sacrificial film;

forming a first resist mask over the second sacrificial film, and then processing the second sacrificial film by using the first resist mask;

removing the first resist mask;

processing the first sacrificial film by using the processed second sacrificial film as a mask; and processing the first layer by using the processed first sacrificial film as a mask.

12. The method for manufacturing a display apparatus, according to claim 10, further comprising:

removing the second sacrificial layer and the third sacrificial layer, and then forming a fourth layer over the second layer and the third layer; and forming the common electrode over the fourth layer.

* * * * *